US008785998B2

(12) United States Patent
Chung et al.

(10) Patent No.: US 8,785,998 B2
(45) Date of Patent: Jul. 22, 2014

(54) SEMICONDUCTOR DEVICE HAVING VERTICAL CHANNEL TRANSISTOR AND METHODS OF FABRICATING THE SAME

(71) Applicant: Samsung Electronics Co., Ltd., Suwon-si (KR)

(72) Inventors: Hyung-woo Chung, Seoul (KR); Yong-chul Oh, Suwon-si (KR); Yoo-sang Hwang, Suwon-si (KR); Gyo-young Jin, Seoul (KR); Hyeong-sun Hong, Seongnam-si (KR); Dae-ik Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 7 days.

(21) Appl. No.: 13/724,799

(22) Filed: Dec. 21, 2012

(65) Prior Publication Data

US 2013/0113029 A1 May 9, 2013

Related U.S. Application Data

(62) Division of application No. 12/904,344, filed on Oct. 14, 2010, now Pat. No. 8,362,536.

(30) Foreign Application Priority Data

May 20, 2010 (KR) ........................ 10-2010-0047646

(51) Int. Cl.
*H01L 27/108* (2006.01)

(52) U.S. Cl.
USPC ........... 257/296; 257/297; 257/312; 257/313; 257/E21.409; 257/E27.06

(58) Field of Classification Search
USPC .................. 257/296–313, 324, 329, E21.409, 257/E27.06, 678
See application file for complete search history.

(56) References Cited

U.S. PATENT DOCUMENTS

| | | | | |
|---|---|---|---|---|
| 5,874,760 | A | 2/1999 | Burns, Jr. et al. | |
| 7,564,084 | B2 | 7/2009 | Song et al. | |
| 2001/0030338 | A1 | 10/2001 | Noble | |
| 2002/0110039 | A1* | 8/2002 | Forbes et al. | 365/230.06 |
| 2008/0128757 | A1 | 6/2008 | Chae et al. | |
| 2011/0284939 | A1* | 11/2011 | Chung et al. | 257/296 |
| 2012/0306004 | A1* | 12/2012 | Yoon et al. | 257/329 |

FOREIGN PATENT DOCUMENTS

| | | | |
|---|---|---|---|
| KR | 100771871 | A | 10/2007 |
| KR | 1020090132298 | A | 12/2009 |
| KR | 1020090132999 | A | 12/2009 |

* cited by examiner

*Primary Examiner* — Cathy N Lam
(74) *Attorney, Agent, or Firm* — Volentine & Whitt, PLLC

(57) ABSTRACT

A semiconductor memory device includes a first pair of pillars extending from a substrate to form vertical channel regions, the first pair of pillars having a first pillar and a second pillar adjacent to each other, the first pillar and the second pillar arranged in a first direction, a first bit line disposed on a bottom surface of a first trench formed between the first pair of pillars, the first bit line extending in a second direction that is substantially perpendicular to the first direction, a first contact gate disposed on a first surface of the first pillar with a first gate insulating layer therebetween, a second contact gate disposed on a first surface of the second pillar with a second gate insulating layer therebetween, the first surface of the first pillar and the first surface of the second pillar face opposite directions, and a first word line disposed on the first contact gate and a second word line disposed on the second contact gate, the word lines extending in the first direction.

22 Claims, 95 Drawing Sheets

SEMICONDUCTOR DEVICE HAVING VERTICAL CHANNEL TRANSISTOR AND METHODS OF FABRICATING THE SAME

CROSS-REFERENCE TO RELATED APPLICATION

This application is a Divisional Application of application Ser. No. 12/904,344, filed Oct. 14, 2010, which claims priority to Korean Patent Application No. 10-2010-0047646, filed on May 20, 2010, the disclosure of which is incorporated herein in its entirety by reference.

BACKGROUND

The inventive concept relates to a semiconductor device and a method of fabricating the same, and more particularly, to a semiconductor device including a vertical channel transistor, and a method of fabricating the semiconductor device.

As the integration of semiconductor devices increases, the design rules for components in the semiconductor devices decrease. In particular, in a semiconductor device having a plurality of transistors, a gate length has been reduced. The gate length is a reference of the design rules. Accordingly, a length of the channel in each transistor has also been reduced. A vertical channel transistor may increase a distance between a source region and a drain region, and may increase a length of an effective channel in a transistor.

SUMMARY

The inventive concept provides a semiconductor device having a vertical channel transistor. According to an embodiment, a vertical channel region in the vertical channel transistor may not be disturbed by a bias even when a high bias voltage is applied to bit lines. The vertical channel can be formed in an active area facing a sidewall of a contact gate.

The inventive concept also provides a method of fabricating a semiconductor device having a vertical channel transistor, and arranging contact gates and bit lines so that the vertical channel region is not disturbed by a bias even when a high bias voltage is applied to the bit lines.

According to an embodiment, a semiconductor memory device comprises a first pair of pillars extending from a substrate to form vertical channel regions, the first pair of pillars having a first pillar and a second pillar adjacent to each other, the first pillar and the second pillar arranged in a first direction, a first bit line disposed on a bottom surface of a first trench formed between the first pair of pillars, the first bit line extending in a second direction that is substantially perpendicular to the first direction, a first contact gate disposed on a first surface of the first pillar with a first gate insulating layer therebetween, a second contact gate disposed on a first surface of the second pillar with a second gate insulating layer therebetween, the first surface of the first pillar and the first surface of the second pillar face opposite directions, and a first word line disposed on the first contact gate and a second word line disposed on the second contact gate, the word lines extending in the first direction.

A distance from an upper surface of the substrate to a bottom surface of the first contact gate can be less than a distance from the upper surface of the substrate to an upper surface of the first bit line.

The first pair of pillars and the substrate may comprise a semiconductor material.

The device may further comprise a nitride liner, a sidewall oxide layer, and a gap fill oxide layer respectively stacked on a sidewall of the first trench.

A first source/drain region can be formed around the bottom surface of the first trench.

Each end portion of the pair of pillars may comprise a second source/drain region.

The device may further comprise a first contact plug and a second contact plug respectively disposed on each end portion of the first pillar and the second pillar.

A lower electrode of a capacitor can be disposed on the first contact plug.

The device may further comprise a spacer disposed between the first contact plug and the first contact gate.

The spacer can have a ring shape.

A channel region can be formed between the first source/drain region and the second source/drain region.

The device may further comprise a second bit line disposed in a second trench formed between the first pair of pillars and a second pair of pillars formed immediately next to the first pair of pillars in the first direction.

The first and second bit lines may comprise at least one of W, Al, Cu, Mo, Ti, Ta, Ru, TiN, TiN/W, Ti/TiN, WN, W/WN, TaN, Ta/TaN, TiSiN, TaSiN, WSiN, $CoSi_2$, $TiSi_2$, or $WSi_2$.

The device may further comprise a third insulating layer disposed between the first word line and the second word line.

The first bit line may comprise a first portion disposed between the first pair of pillars and a second portion disposed between a third pair of pillars neighboring immediately next to the first pair of pillars in the second direction, the first portion in contact with the bottom surface of the first trench comprising a semiconductor material, the second portion in contact with the bottom surface of the second trench comprising an insulating material.

The first portion and the second portion may have a same width.

The first portion and the second portion may have a same thickness.

An upper surface of the first portion of the first bit line can be coplanar with an upper surface of the second portion of the first bit line.

The first portion can have a smaller thickness than the second portion.

A top width of the second portion of the first bit line can be wider than a bottom width of the second portion of the first bit line.

A lower portion of the second portion of the first bit line can be narrower than a lower portion of the first portion of the first bit line.

A curvature of a lower end of the second portion can be greater than a curvature of a lower end of the first portion.

A width of the first portion can be smaller than a width of the second portion.

Each of the pillars can have a same width.

According to an embodiment, a semiconductor memory device comprise a plurality of pillars extending from a substrate to form vertical channel regions, a word line disposed between two adjacent rows of the pillars, a bit line disposed between two adjacent columns of the pillars, the bit line in contact with a bottom surface of a first trench formed between a first pair of pillars positioned in a row direction, the first pair of pillars having a first pillar and a second pillar, and a contact gate disposed between a second pair of pillars positioned in a column direction, the second pair of pillars having the second pillar and a third pillar, the contact gate comprising a first surface and a second surface, the first surface in contact with the word line, the second surface in contact with a gate insulating layer disposed on the second pillar.

A distance from an upper surface of the substrate to a bottom surface of the contact gate can be less than a distance from the upper surface of the substrate to an upper surface of the bit line.

The first pair of pillars and the substrate may comprise a semiconductor material.

The device may further comprise a nitride liner, a sidewall oxide layer, and a gap fill oxide layer respectively stacked on a sidewall of the first trench.

The device may further comprise a first source/drain region formed around the bottom surface of the first trench.

Each end portion of the first pair of pillars may comprise a second source/drain region.

The device may further comprise a first contact plug and a second contact plug respectively disposed on each end portion of the first pillar and the second pillar.

A lower electrode of a capacitor can be disposed on the first contact plug.

The device may further comprise a spacer disposed between the first contact plug and the first contact gate.

The spacer can have a ring shape.

A channel region can be formed between the first source/drain region and the second source/drain region.

The bit line may comprise a first portion disposed between the first pair of pillars and a second portion disposed between a third pair of pillars neighboring immediately next to the first pair of pillars in the column direction, the first portion in contact with the bottom surface of the first trench comprising a semiconductor material, the second portion in contact with the bottom surface of a second trench comprising an insulating material.

The first portion and the second portion can have a same width.

The first portion and the second portion can have a same thickness.

An upper surface of the first portion can be coplanar with an upper surface of the second portion.

The first portion can have a smaller thickness than the second portion.

A top width of the second portion can be wider than a bottom width of the second portion.

A lower portion of the second portion can be narrower than a lower portion of the first portion.

A curvature of a lower end of the second portion can be greater than a curvature of a lower end of the first portion.

A width of the first portion can be smaller than a width of the second portion.

Each of the pillars can have a same width.

The bit line may comprise at least one of W, Al, Cu, Mo, Ti, Ta, Ru, TiN, TiN/W, Ti/TiN, WN, W/WN, TaN, Ta/TaN, TiSiN, TaSiN, WSiN, $CoSi_2$, $TiSi_2$, or $WSi_2$.

According to an embodiment, a semiconductor memory device comprise a first semiconductor pillar and a second semiconductor pillar both extending from a semiconductor substrate, a first source/drain region disposed at near a diverged portion of the two pillars, a second source/drain region disposed at near respective top end portions of the two pillars, a first gate insulating layer disposed on a first surface of the first semiconductor pillar and a second gate insulating layer disposed on a second surface of the second semiconductor pillar, the first surface and the second surface face opposite directions, a buried bit line disposed on and in contact with the diverged portion of the two pillars, a first gate contact disposed on the first gate insulating layer and a second gate contact disposed on the second gate insulating layer, and a first word line disposed on and in contact with the first gate contact and a second word line disposed on and in contact with the second gate contact, wherein channels are formed between the first source/drain region and second source drain regions when the first and second contact gates are turned on.

A distance from an upper surface of the substrate to a bottom surface of the first contact gate can be less than a distance from the upper surface of the substrate to an upper surface of the buried bit line.

The first source/drain region may comprise a low concentration dopant region and a high concentration dopant region.

A portion of the buried bit line corresponding to the diverged portion may have a different shape as compared to another portion of the buried bit line corresponding to a portion other than the diverged portion.

The first word line and the first gate contact can be formed of a unitary structure.

The buried bit line comprises at least one of W, Al, Cu, Mo, Ti, Ta, Ru, TiN, TiN/W, Ti/TiN, WN, W/WN, TaN, Ta/TaN, TiSiN, TaSiN, WSiN, $CoSi_2$, $TiSi_2$, or $WSi_2$.

According to an embodiment, a method of forming a semiconductor memory device comprises forming a device isolation layer in a semiconductor substrate, the device isolation layer isolating a first active region from a second active region, the first active region and the second active region disposed in a first direction, forming a first trench crossing the first active region thereby forming a first pillar and a second pillar, forming a second trench crossing the device isolation layer, the second trench disposed immediately next to the first trench in the first direction, forming a first source/drain region near a bottom surface of the first trench at the first active region, forming a second source/drain region near respective top ends of the first and second pillars, forming a first bit line on a bottom surface of the first trench and forming a second bit line on a bottom surface of the second trench, forming a contact gate disposed between the first bit line and the second bit line, a first surface of the contact gate contacting a gate insulating layer disposed on the first pillar, and forming a word line in contact with a second surface of the contact gate, the word line extending in the first direction.

Forming the device isolation layer may comprise forming a side wall oxide layer covering an inner wall of a trench in the semiconductor substrate, forming a nitride liner on the side wall oxide layer, and forming a gap fill oxide layer on the nitride liner to fill the inside of the trench.

Forming the first trench and the second trench may comprise anisotropically etching the semiconductor substrate and the device isolation layer using mask pattern.

Forming a first/source drain region may comprise performing ion implantation of a low concentration dopant into the semiconductor substrate, and performing ion implantation of a high concentration dopant into the semiconductor substrate.

Forming the first bit line may comprise forming a conductive layer in the first and second trenches, and performing an etch back process so that the conductive layer to be remained only on the bottom surfaces of the first and second trenches.

The method may further comprise depositing a buried insulating material on the first and second bit lines to fill inner surfaces of the first and second trenches.

The buried insulating material may comprise a silicon nitride layer.

The method may further comprise forming a contact recess between the first bit line and the second bit line to receive the contact gate, and forming a gate insulating layer in an inner wall of the contact recess.

A process of forming the gate insulating layer may comprise at least one of a radical oxidation process, a thermal oxidation process, a CVD process, or an atomic layer deposition process.

According to an embodiment, a semiconductor device comprises an active area defined in a substrate to have a longer axis length in a first direction and a shorter axis length in a second direction that is perpendicular to the first direction, and including two active pillars that are separated from each other on an upper surface of the substrate, a buried bit line crossing the active area through a space between the two active pillars and extending in the second direction at a level lower than the upper surface of the substrate, a first source/drain region formed around a bottom surface of the buried bit line in the active area, second source/drain regions formed on upper surfaces of the two active pillars, a gate insulating layer covering vertical side surfaces of the active pillars, which provide channel surfaces on which vertical channels are formed between the first source/drain region and the second source/drain region, contact gates facing the vertical side surfaces of the active pillars with the gate insulating layer disposed between the contact gates and the active pillars, and a word line connected to the contact gates and formed on the upper surface of the substrate.

BRIEF DESCRIPTION OF THE DRAWINGS

Exemplary embodiments of the present invention can be understood in more detail from the following descriptions taken in conjunction with the accompanying drawings, in which.

DETAILED DESCRIPTION OF EXEMPLARY EMBODIMENTS

Exemplary embodiments of the inventive concept will now be described more fully with reference to the accompanying drawings. The inventive concept may, however, embodied in many different forms and should not be construed as limited to only the exemplary embodiments set forth herein.

Figure 1:
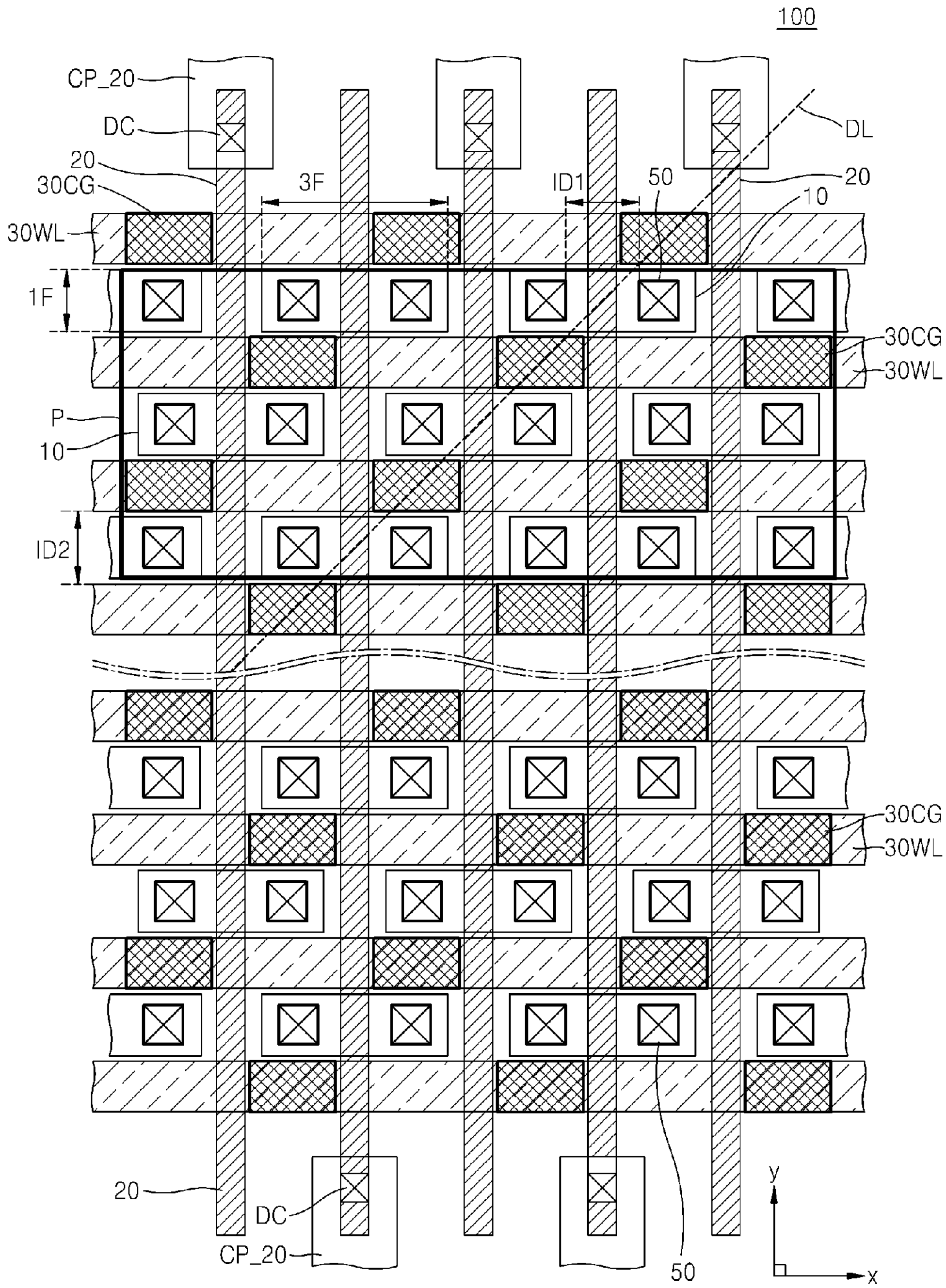
FIG. 1 is a schematic layout of components constituting a semiconductor device, according to an embodiment of the inventive concept.

FIG. 1 is a schematic layout of components constituting a semiconductor device 100 according to an embodiment of the inventive concept. The layout of FIG. 1 may be applied to a dynamic random access memory (DRAM), in particular, a DRAM memory cell having a unit cell size of $4F^2$. Here, 1F denotes a minimum feature size.

Figure 2A:
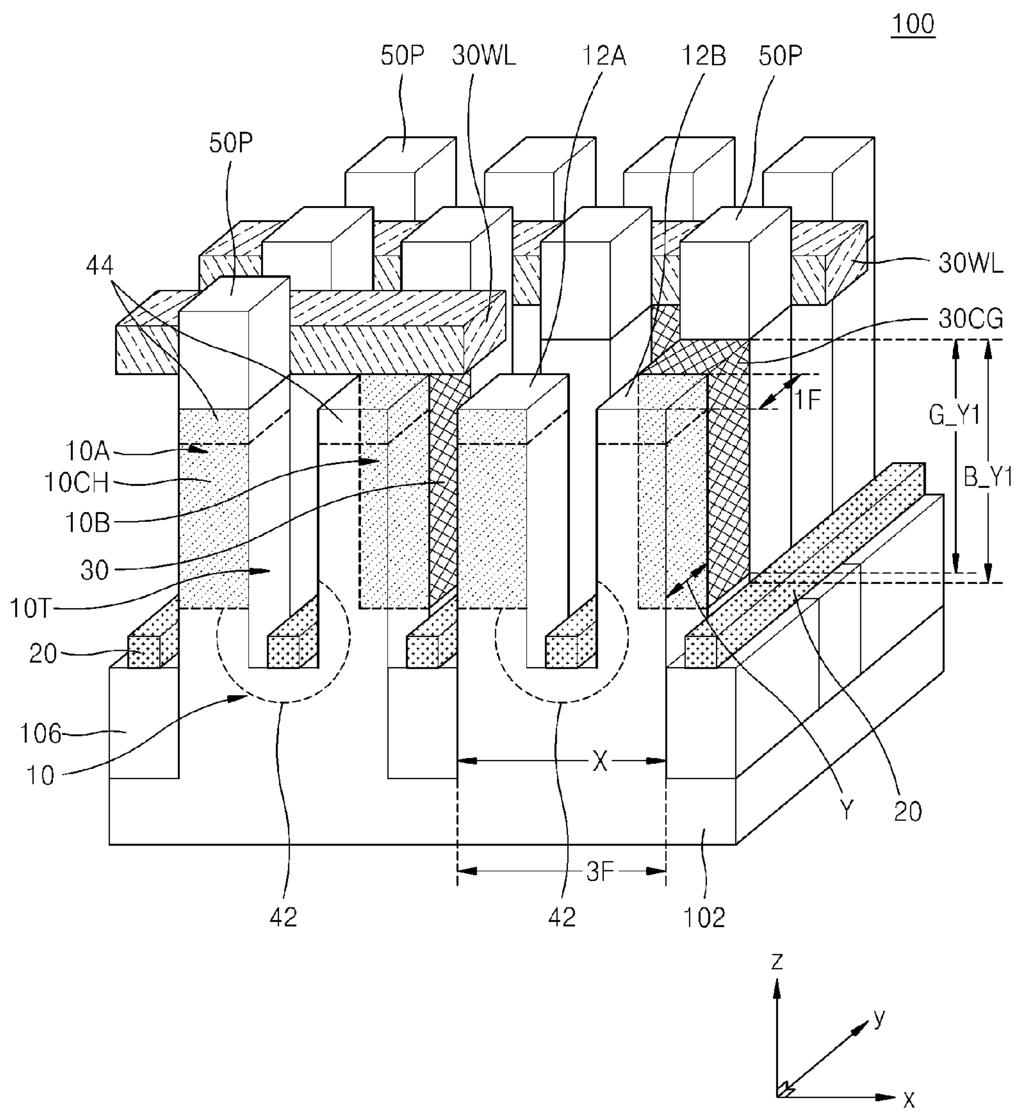
FIGS. 2A and 2B are partially cutout perspective views respectively showing a three-dimensional arrangement of components constituting a cell array region in a semiconductor device according to embodiments of the inventive concept.
Figure 2B:
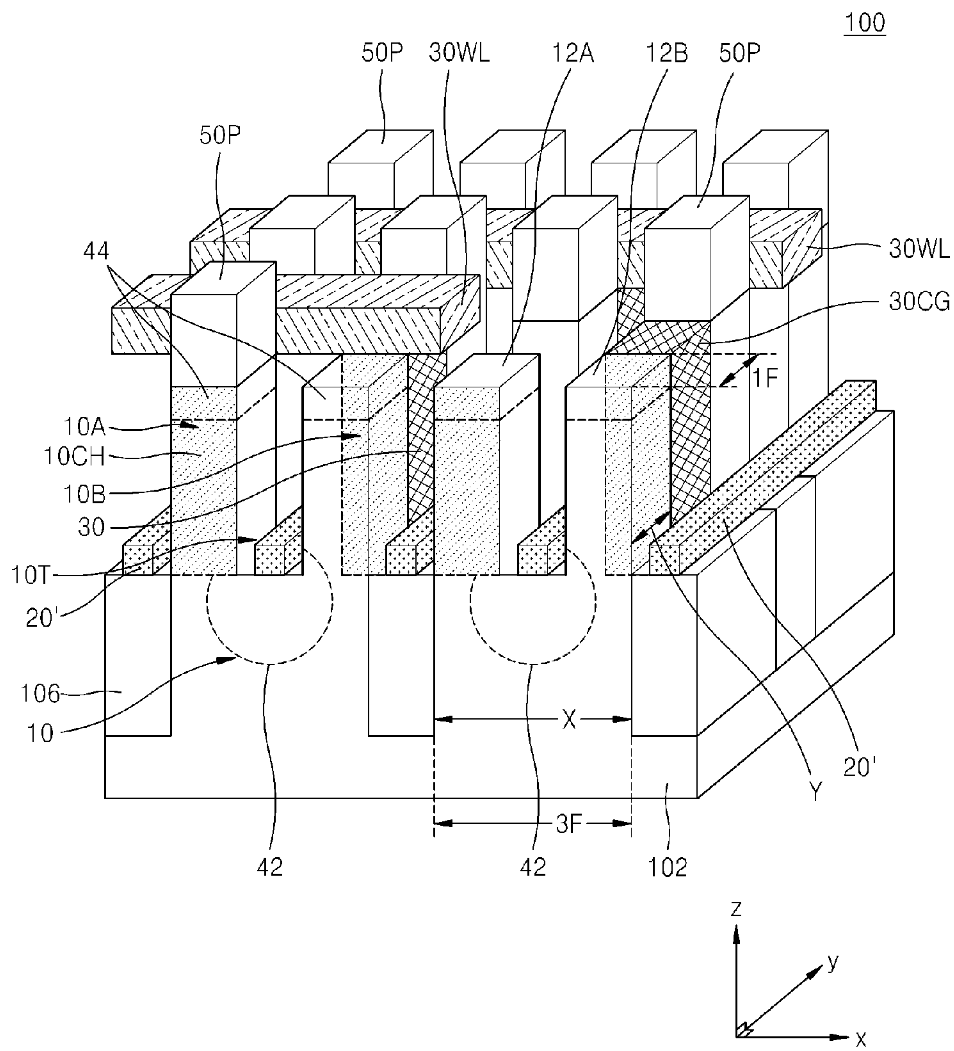

FIGS. 2A and 2B are partially cutout perspective views respectively showing a three-dimensional arrangement of components constituting a cell array region in a semiconductor device according to embodiments of the inventive concept.

Referring to FIGS. 1, 2A, and 2B, a semiconductor device 100 includes a plurality of active areas 10 that can be defined as islands by an isolation layer 106 on a substrate 102. Each of the plurality of active areas 10 is divided into two active pillars 10A and 10B by a trench 10T. The trench 10T is recessed to a predetermined depth from an upper center portion of the active area 10 of the substrate 102. In each of the plurality of active areas 10, a first source/drain region 42 is formed on a portion where the two active pillars 10A and 10B are branched. The two active pillars 10A and 10B respectively include upper surfaces 12A and 12B that are separated from each other. The upper surfaces 12A and 12B of the active pillars 10A and 10B correspond to the upper surface of the substrate 102. Second source/drain regions 44 can be formed on the upper surfaces 12A and 12B of the two active pillars 10A and 10B.

The plurality of active areas 10 may respectively have a length of 3F in a first direction that is a longer axis (X) direction (i.e., the x direction in FIGS. 1 and 2A) and a length of 1F in a second direction that is a shorter axis (Y) direction (i.e., the y direction in FIGS. 1 and 2A).

In the substrate 102, a plurality of buried bit lines 20 extend in parallel with each other in the shorter axis (Y) direction of the active areas 10. A buried bit line 20 is located on a bottom of the trench 10T that divides one active area 10 into the two active pillars 10A and 10B. The plurality of buried bit lines 20 extend in the shorter axis (Y) direction of the plurality of active areas 10 in the substrate 102 to cross over the active areas 10 and the isolation layer 106. The buried bit lines 20 can be disposed on the active area 10 or on the isolation layers 106.

Each of the two active pillars 10A and 10B in the active area 10 includes a vertical surface 10CH that provides a channel surface in which a vertical channel is formed. The vertical surface 10CH faces a contact gate 30CG. The vertical surfaces 10CH of the two active pillars 10A and 10B included in one active area 10 face in opposite directions with each other. The vertical channel is formed on the channel surface 10CH between the first source/drain region 42 and the second source/drain region 44. The first source/drain region 42 can be formed around the buried bit line 20. The second source/drain region 44 can be formed near the upper edge of the active pillar 10A or 10B.

The two active pillars 10A and 10B constituting one active area 10 respectively form a unit memory cell. Each unit memory cell in the active area 10 may function independently. The two unit memory cells including the two active pillars 10A and 10B in one active area 10 share the first source/drain region 42 formed around the buried bit line 20.

Referring to FIG. 2A, a bottom surface of the contact gate 30CG may be formed on a higher level than the upper surface of the buried bit line 20 in the substrate 102. In an embodiment, a distance (G_Y1) from the upper surfaces 12A and 12B of the active pillars 10A and 10B to the bottom surface of the contact gate 30CG is smaller than a distance (B_Y1) from the upper surfaces 12A and 12B of the active pillars 10A and 10B to the upper surface of the buried bit line 20. In an embodiment, the bottom surface of the contact gate 30CG may be located at a lower level than the upper surface of the buried bit line 20 in the substrate 102.

Referring to FIG. 2B, the bottom surface of the contact gate 30CG is located lower than the upper surface of a buried bit line 20' in the substrate 102. In an embodiment, the contact gate 30CG and the buried bit line 20' are located at the same level in the substrate 102.

A plurality of word lines 30WL extend in parallel with each other in the x direction crossing the extension direction of the plurality of buried bit lines 20 on the substrate 102 according to an embodiment. The plurality of word lines 30WL are electrically connected to a plurality of contact gates 30CG that are arranged in a row along the extension direction of the word lines 30WL (i.e., x direction of FIG. 1). The plurality of word lines 30WL may be integrally formed with the plurality of contact gates 30CG that are arranged in the extension direction of the word lines 30WL according to an embodiment. The plurality of word lines 30WL and the plurality of contact gates 30CG are formed in different layers by separate deposition processes according to another embodiment. The different layers may directly contact with each other.

As shown in FIG. 1, one contact gate 30CG is located between two neighboring active areas 10 disposed along a direction between the x and y directions, for example, along a diagonal line (DL) direction as shown in FIG. 1. In an embodiment, the unit memory cell formed by the active pillar 10A included in one of the two neighboring active areas 10 and the unit memory cell formed by the active pillar 10B included in the other active area 10 share one contact gate 30CG disposed between them.

A buried contact 50 is formed on the second source/drain region 44 that is formed near the upper edge of the active pillar 10A or 10B. The buried contact 50 may be formed as a buried contact plug 50P that directly contacts the second source/drain region 44 as shown in FIG. 2A. A lower electrode of a capacitor can be formed on a plurality of buried contact plugs 50P.

In forming the memory cell array having a unit memory cell size of $4F^2$ shown in FIGS. 1, 2A, and 2B, when the plurality of buried bit lines 20 are disposed in the substrate 102, the vertical channel region is not adversely affected by a bias even when a high bias voltage is applied to the buried bit lines 20 in the semiconductor device 100 including a vertical channel transistor structure. For example, channel disturbance in the vertical channel region may be prevented. An insulating distance (ID1) may be ensured between two neighboring buried contacts 50 or buried contact plugs 50P in the direction in which the word lines 30WL extend (i.e., the x direction in FIGS. 1, 2A, and 2B). An insulating distance (ID2) may be ensured between two neighboring word lines 30WL in the direction in which the buried bit lines 20 extend (i.e., the y direction of FIGS. 1, 2A, and 2B).

Referring to FIGS. 1, 2A, and 2B, the plurality of buried bit lines 20 formed in one cell array region may be electrically connected to core/peripheral bit lines CP_20 formed on a peripheral circuit region or a core region (hereinafter, referred to as "core/peri region"). In an embodiment, the core/peri bit lines CP_20 may be formed on an upper portion of the substrate 102. Thus, to electrically connect the buried bit lines 20 to the core/peri bit lines CP_20, a direct contact (DC) that extends in a vertical direction (i.e., the z direction in FIGS. 2A and 2B) between the core/peri bit line CP_20 and the buried bit line 20 may be formed on an edge portion of the cell array region.

Figure 2C:
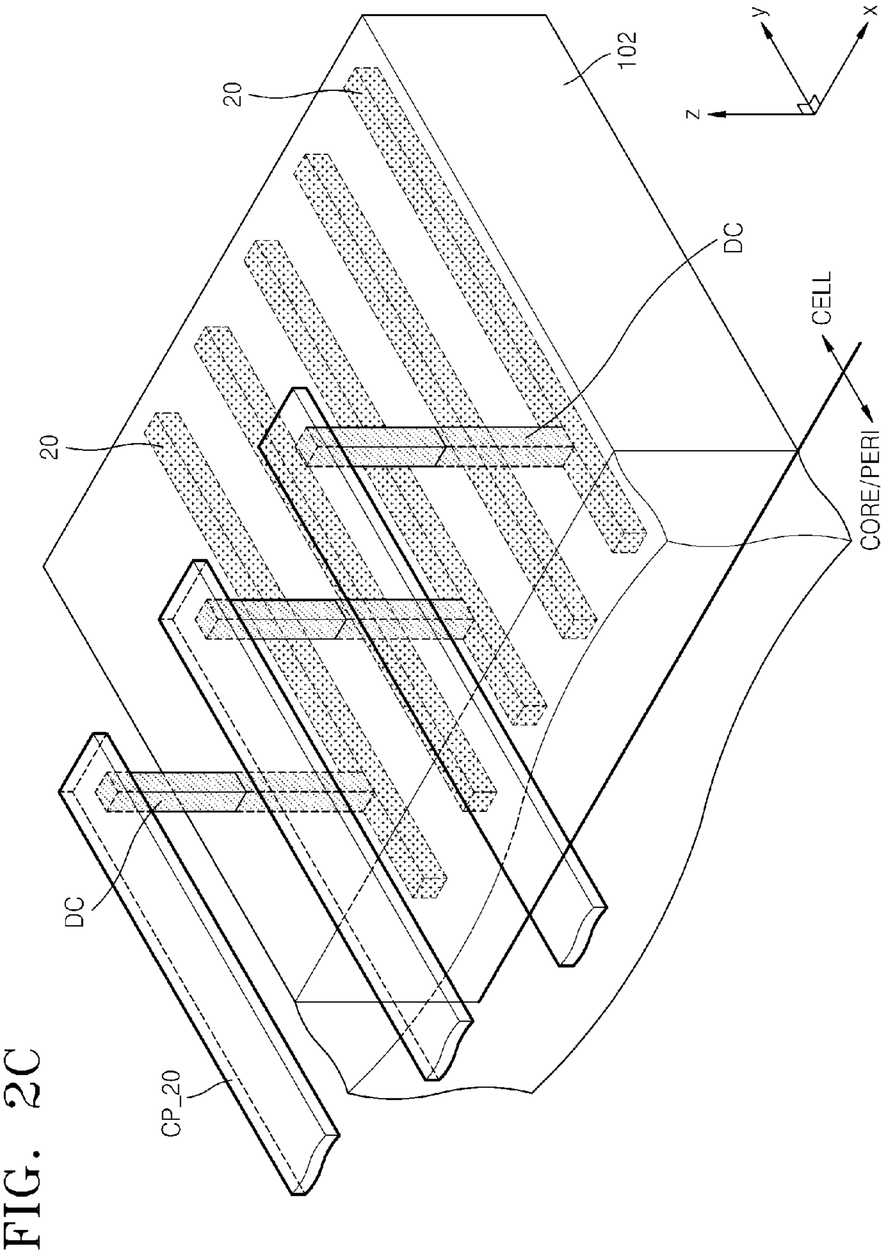
FIG. 2C is a partially cutout perspective view showing a three-dimensional arrangement of a structure, in which the plurality of buried bit lines formed on a cell array region are connected to core/peripheral bit lines that are formed on a core/peripheral region via direct contacts at the edge portion of a cell array region in the semiconductor device according to an embodiment of the inventive concept.

FIG. 2C is a partially cutout perspective view showing a three-dimensional arrangement of a structure, in which the plurality of buried bit lines 20 are connected to the core/peri bit lines CP_20 that are formed on the core/peri region (denoted as "CORE/PERI" in FIG. 2C) via the direct contacts DC at the edge portion of the cell array region in the semiconductor device 100, according to an embodiment.

In FIG. 2C, the plurality of buried bit lines 20 are formed at a level that is lower than the upper surface of the substrate 102 in the substrate 102, and the plurality of core/peri bit lines CP_20 are formed at a level that is higher than the upper surface of the substrate 102. Therefore, the direct contact (DC) may extend from the inside of the substrate 102 to the upper portion of the substrate 102 in the z direction. The word lines 30WL shown in FIGS. 1, 2A, and 2B are disposed on the substrate 102 and between a first level at which the plurality of buried bit lines 20 are located and a second level at which the plurality of core/peri bit lines CP_20 are located.

FIGS. 3A, 3B, and 3C through FIGS. 18A, 18B, and 18C are diagrams illustrating a method of fabricating a semiconductor device according to an embodiment of the inventive concept.

FIGS. 3A, 4A, 5A, 6A, 7A, 8A, 9A, 10A, 11A, 12A, 13A, 14A, 15A, 16A, 17A and 18A are plan views of a region corresponding to a rectangular portion denoted by "P" in the layout of FIG. 1. FIGS. 3B, 4B, 5B, 6B, 7B, 8B, 9B, 10B, 11B, 12B, 13B, 14B, 15B, 16B, 17B and 18B are cross-sectional views respectively taken along the lines BX1-BX1' and BX2-BX2' shown in FIGS. 3A, 4A, 5A, 6A, 7A, 8A, 9A, 10A, 11A, 12A, 13A, 14A, 15A, 16A, 17A and 18A. FIGS. 3C, 4C, 5C, 6C, 7C, 8C, 9C, 10C, 11C, 12C, 13C, 14C, 15C, 16C, 17C and 18C are cross-sectional views respectively taken along the lines CY1-CY1' and CY2-CY2' shown in FIGS. 3A, 4A, 5A, 6A, 7A, 8A, 9A, 10A, 11A, 12A, 13A, 14A, 15A, 16A, 17A and 18A.

Figure 3A:
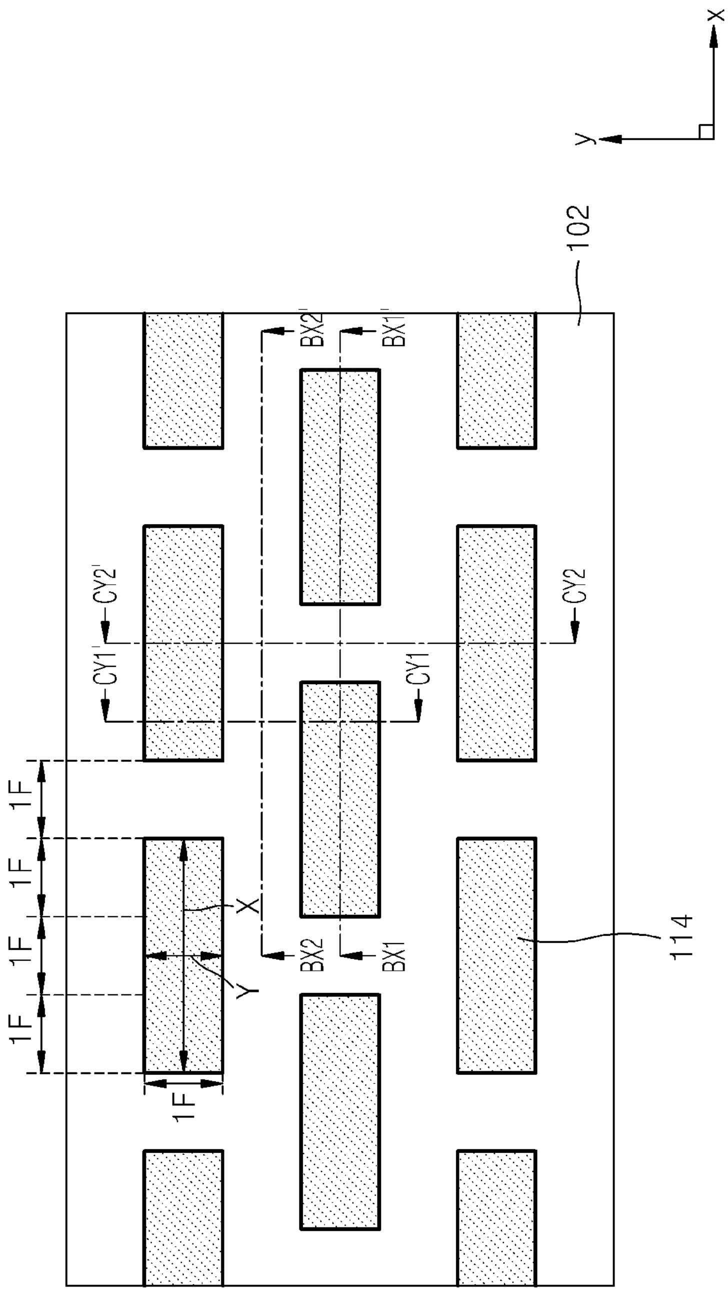
FIGS. 3A, 4A, 5A, 6A, 7A, 8A, 9A, 10A, 11A, 12A, 13A, 14A, 15A, 16A, 17A and 18A are plan views of a region corresponding to a rectangular portion denoted by "P" in the layout of FIG. 1 according to an embodiment of the inventive concept.
Figure 3B:
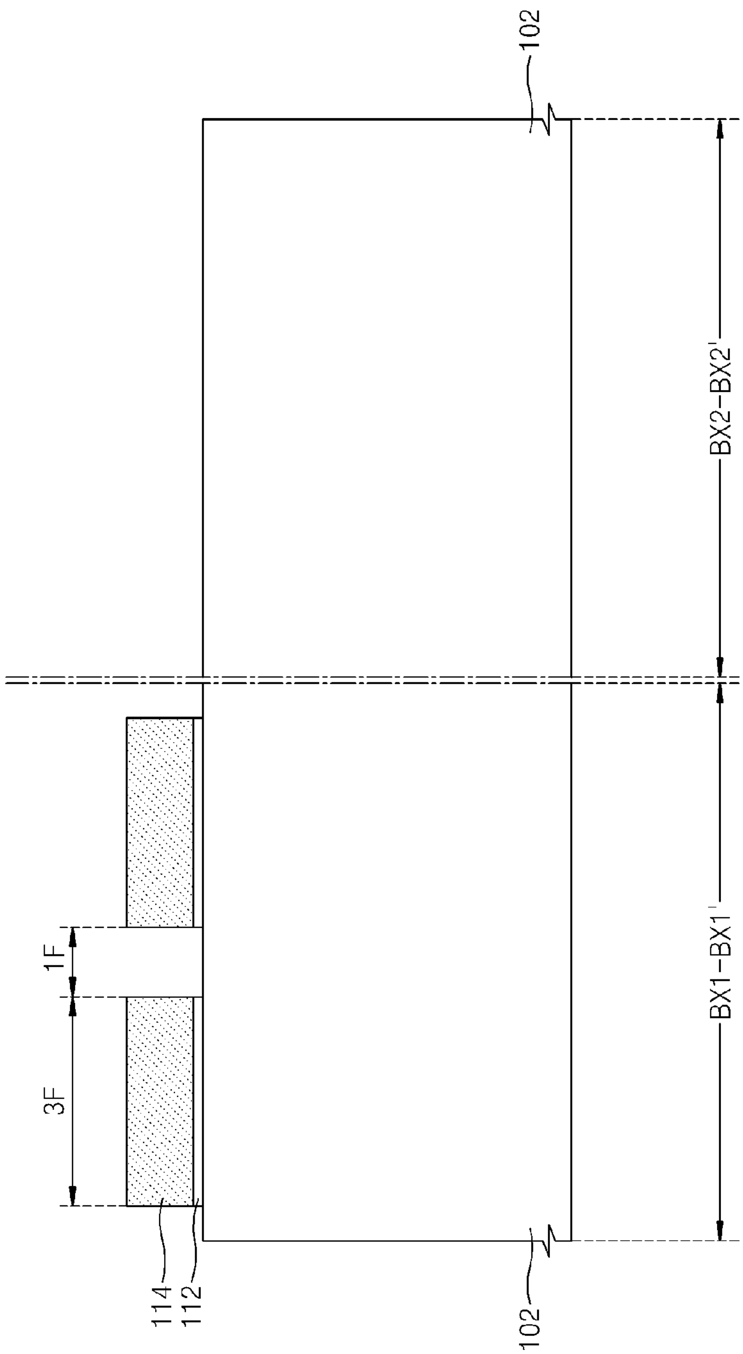
FIGS. 3B, 4B, 5B, 6B, 7B, 8B, 9B, 10B, 11B, 12B, 13B, 14B, 15B, 16B, 17B and 18B are cross-sectional views taken along lines BX1-BX1' and BX2-BX2' shown in FIGS. 3A, 4A, 5A, 6A, 7A, 8A, 9A, 10A, 11A, 12A, 13A, 14A, 15A, 16A, 17A and 18A according to an embodiment of the inventive concept.
Figure 3C:
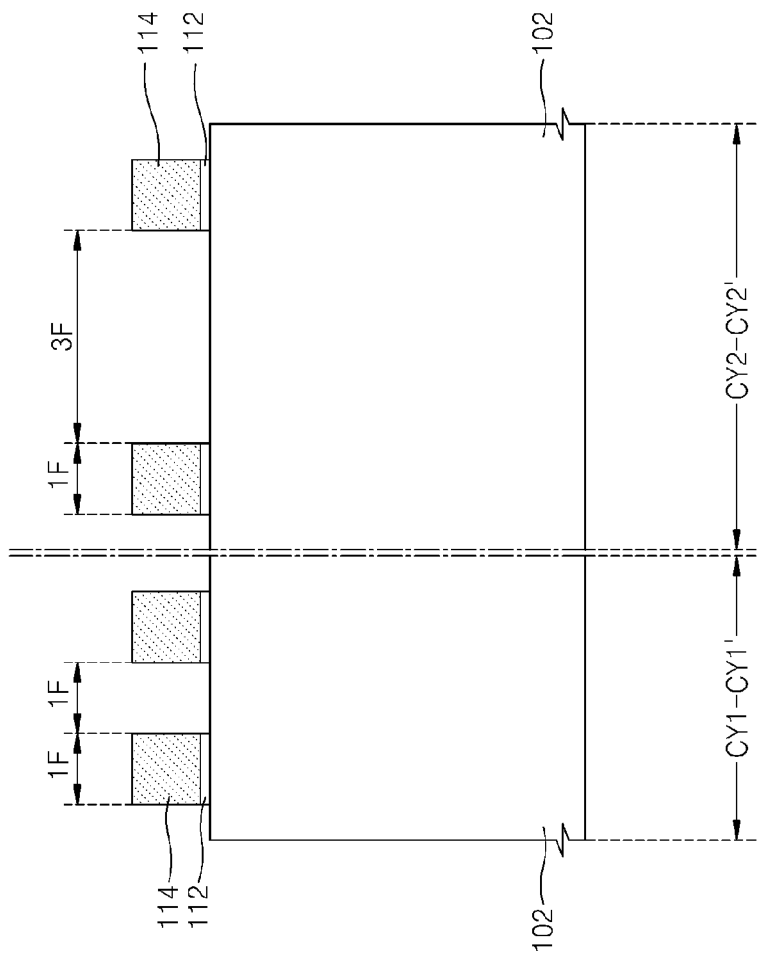
FIGS. 3C, 4C, 5C, 6C, 7C, 8C, 9C, 10C, 11C, 12C, 13C, 14C, 15C, 16C, 17C and 18C are cross-sectional views taken along lines CY1-CY1' and CY2-CY2' shown in FIGS. 3A, 4A, 5A, 6A, 7A, 8A, 9A, 10A, 11A, 12A, 13A, 14A, 15A, 16A, 17A and 18A according to an embodiment of the inventive concept.

Referring to FIGS. 3A, 3B, and 3C, a pad oxide layer and a first mask layer are sequentially formed on the substrate 102. The pad layer and the first mask layer are patterned to form a stacked structure including a plurality of pad oxide layer patterns 112 and a plurality of first mask patterns 114. An upper surface of the substrate 102 can be partially exposed by the plurality of first mask patterns 114. The substrate 102 may comprise a silicon substrate. The first mask patterns 114 may comprise a silicon nitride layer.

The plurality of first mask patterns 114 may be formed as islands. Each of the plurality of first mask patterns 114 has a length (X) of 3F in a first direction that is a longer axis direction (i.e., the x direction in FIG. 3A) and a length (Y) of 1F in a second direction that is a shorter axis direction (i.e., the y direction in FIG. 3A).

FIG. 3B is a cross-sectional view taken along the lines BX1-BX1' and BX2-BX2' shown in FIG. 3A according to an embodiment. FIG. 3C is a cross-sectional view taken along the lines CY1-CY1' and CY2-CY2' shown in FIG. 3A according to an embodiment.

Figure 4A:
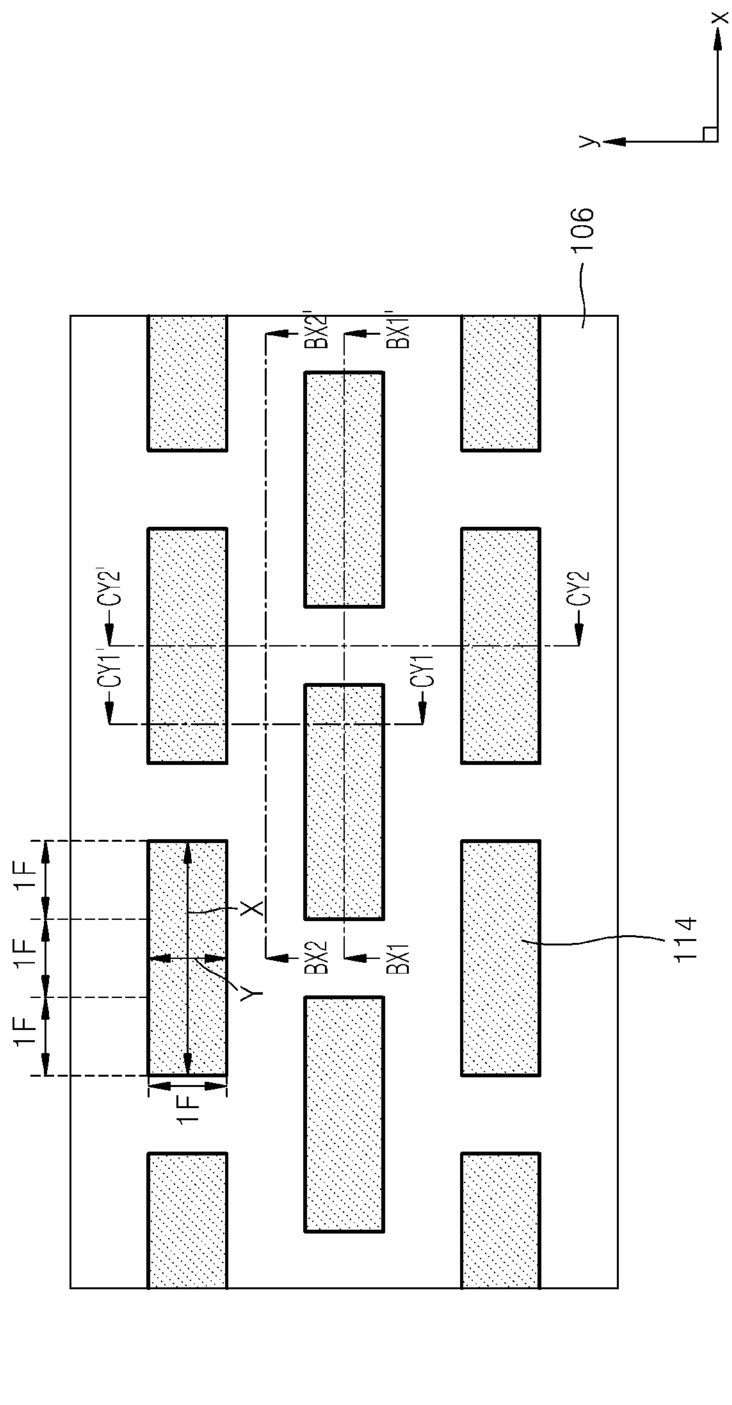
Figure 4B:
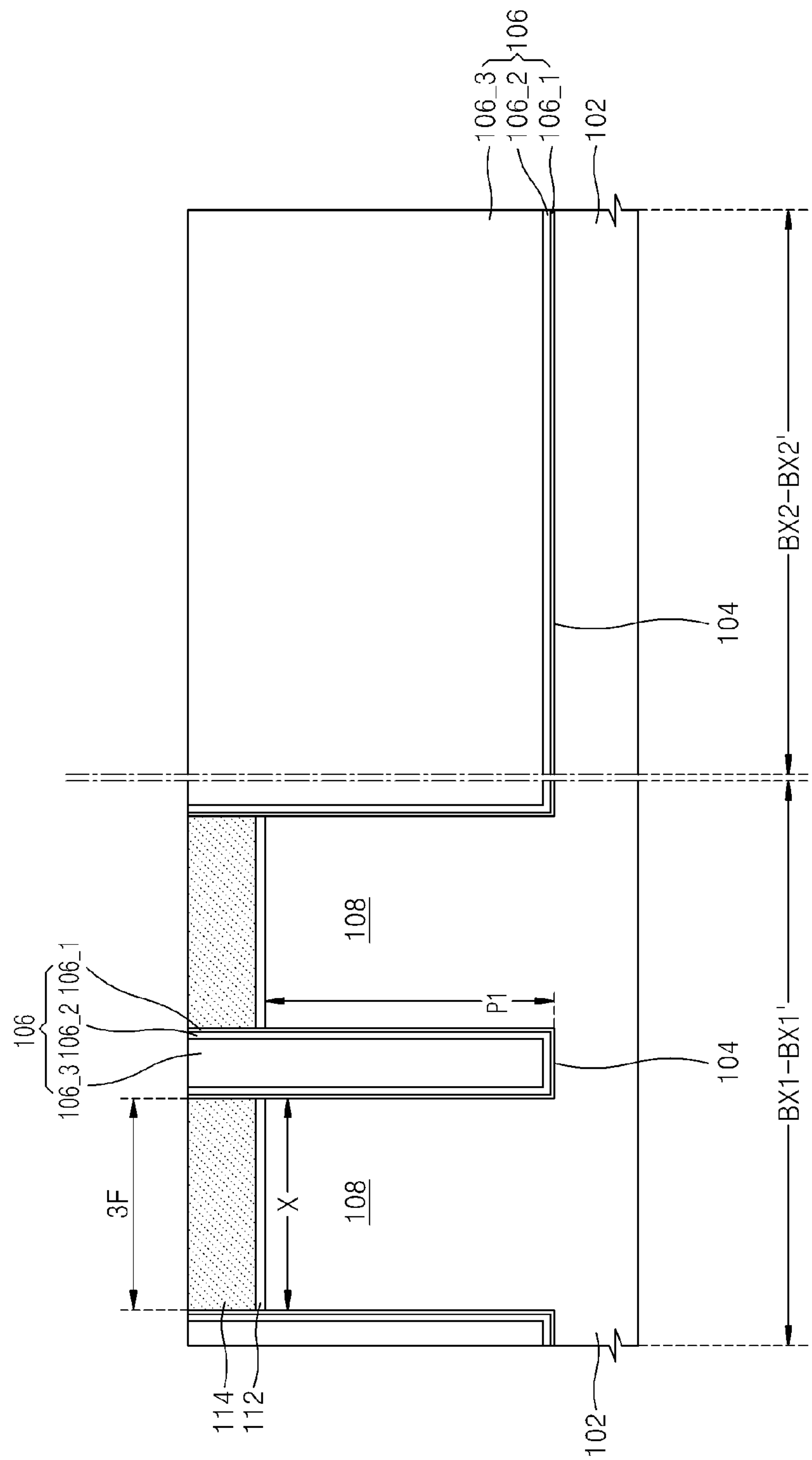
Figure 4C:
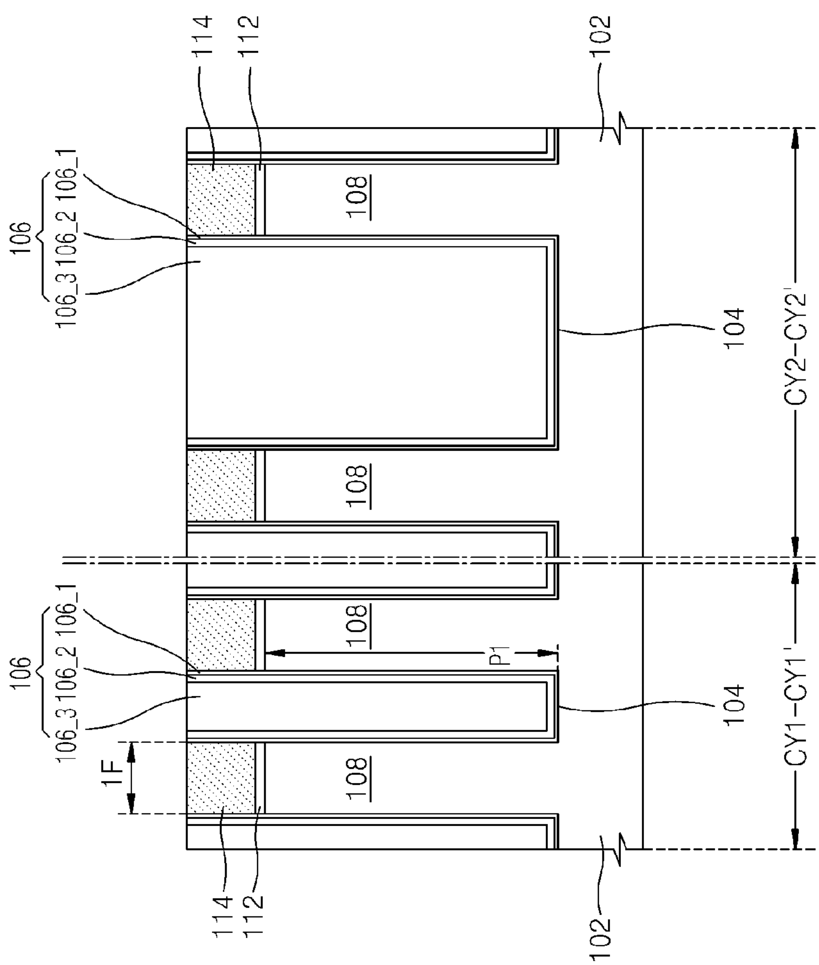

Referring to FIGS. 4A, 4B, and 4C, the substrate 102 is etched by using the plurality of first mask patterns 114 as an etching mask to form a first trench 104 having a first depth P1 from the upper surface of the substrate 102. Then, the isolation layer 106 fills the first trench 104. A plurality of active areas 108 are defined on the substrate 102 by the isolation layer 106. The plurality of active areas 108 may respectively have an island shape like the plurality of first mask patterns 114. Therefore, each of the active areas 108 may have a length of 3F in the x direction and a length of 1F in the y direction.

To form the isolation layer 106, an insulating material is deposited on the substrate 102 to completely fill the first trench 104, and then, the deposited insulating material is planarized until the upper surfaces of the first mask patterns 114 are exposed to form the isolation layer 106 filling the inside of the first trench 104. The insulating material may be planarized by a chemical mechanical polishing (CMP) process according to an embodiment. The isolation layer 106 may include a side wall oxide layer 106_1 covering an inner wall of the first trench 104, a nitride liner 106_2 covering the side wall oxide layer 106_1, and a gap fill oxide layer 106_3 filling the inside of the first trench 104 on the nitride liner 106_2. According to an embodiment, the isolation layer 106 may include a side wall oxide layer 106_1 covering the inner wall of the first trench 104, and a nitride layer filling the inside of the first trench 104 on the side wall oxide layer 106_1.

Figure 5A:
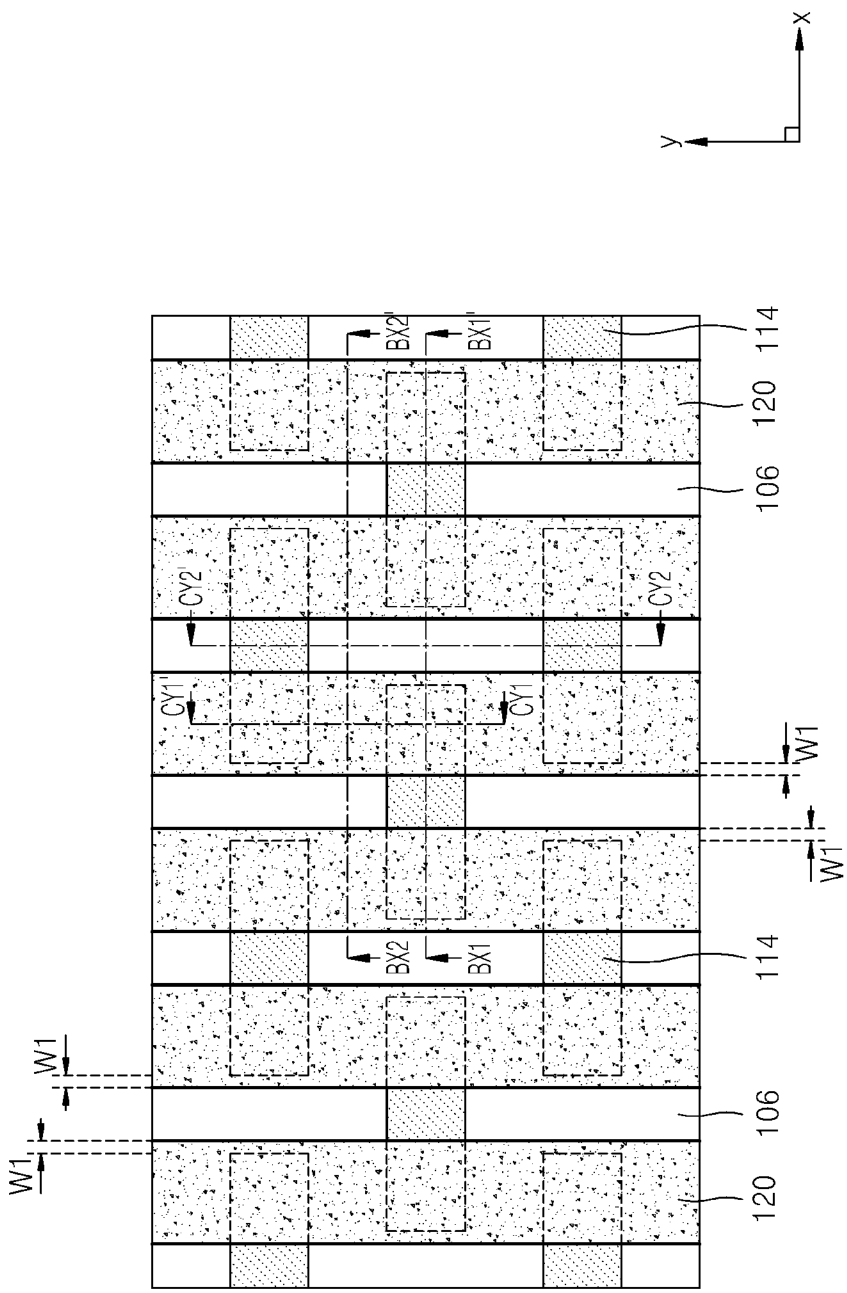
Figure 5B:
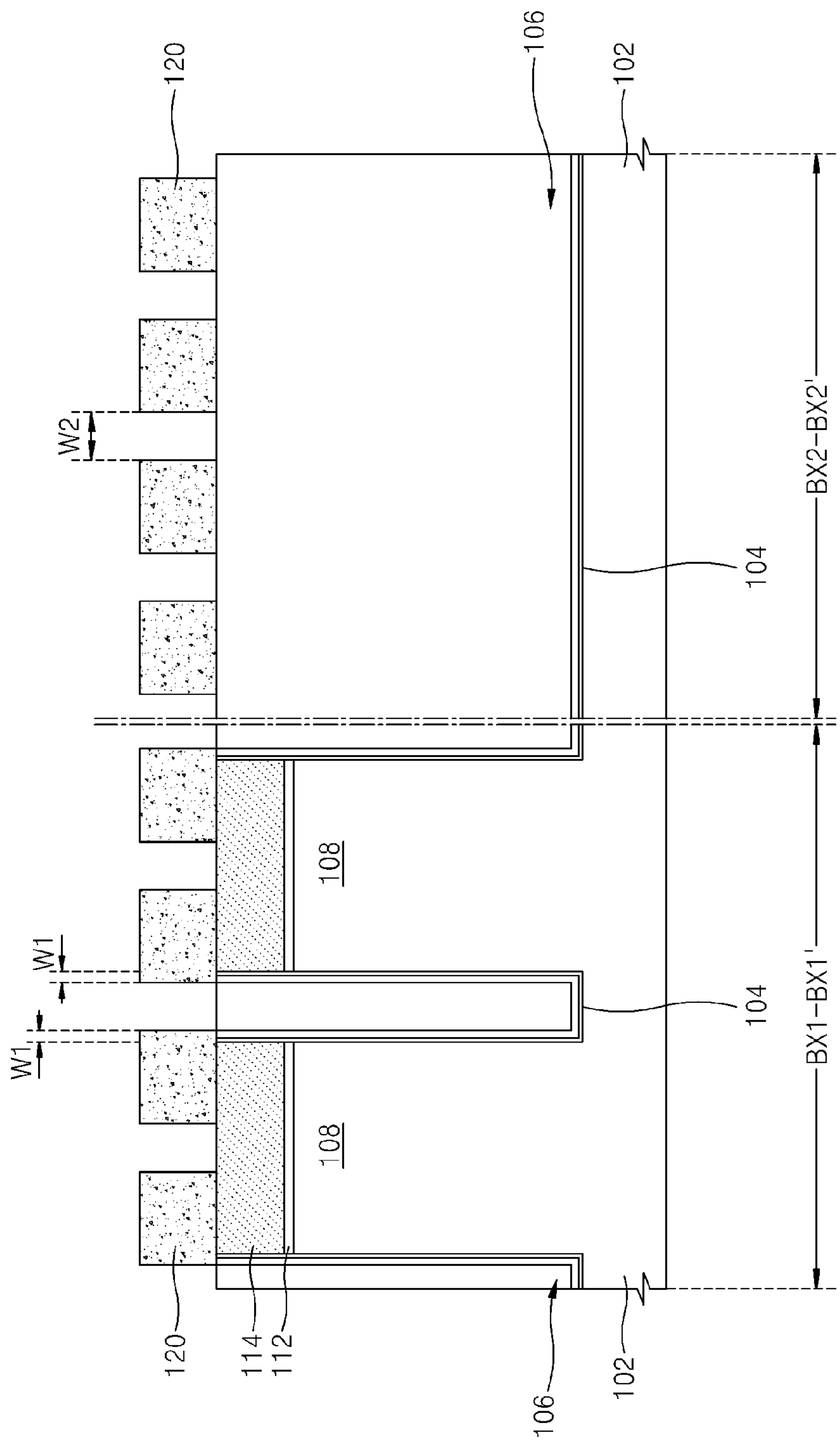
Figure 5C:
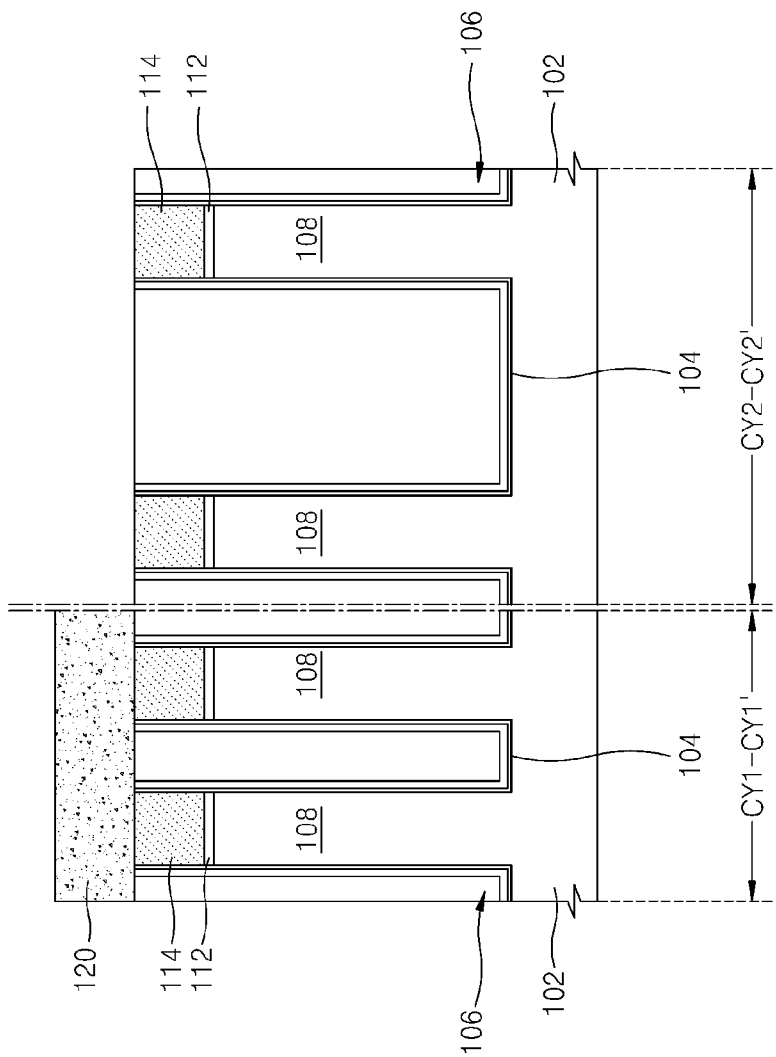

Referring to FIGS. 5A, 5B, and 5C, a plurality of second mask patterns 120 including a plurality of line patterns that extend in parallel with each other in the shorter axis direction (y) of the first mask patterns 114 are formed on the isolation layer 106 and the first mask patterns 114.

A series of first mask patterns 114 and the isolation layer 106 between the first mask patterns 114 are exposed by two neighboring second mask patterns 120. The portion of the first mask pattern 114 exposed through the space is the center portion of the first mask pattern 114. The isolation layer 106 is exposed between two neighboring active areas 108 in the x direction. To expose the isolation layer 106 between two neighboring active areas, the second mask pattern 120 may overlap the isolation layer 106 by as much as a predetermined width W1.

The plurality of second mask patterns 120 may comprise a material that may provide the isolation layer 106 and the plurality of first mask patterns 114 with an etch selectivity. For example, the second mask pattern 120 may comprise an amorphous carbon layer (ACL) or a film comprising a hydrocarbon compound having a relatively high carbon component, that is, about 85 weight % to about 99 weight % of the total weight, or derivatives thereof (hereinafter, "SOH layer"). The second mask patterns 120 may be formed by, for example, a photolithography process.

Figure 6A:
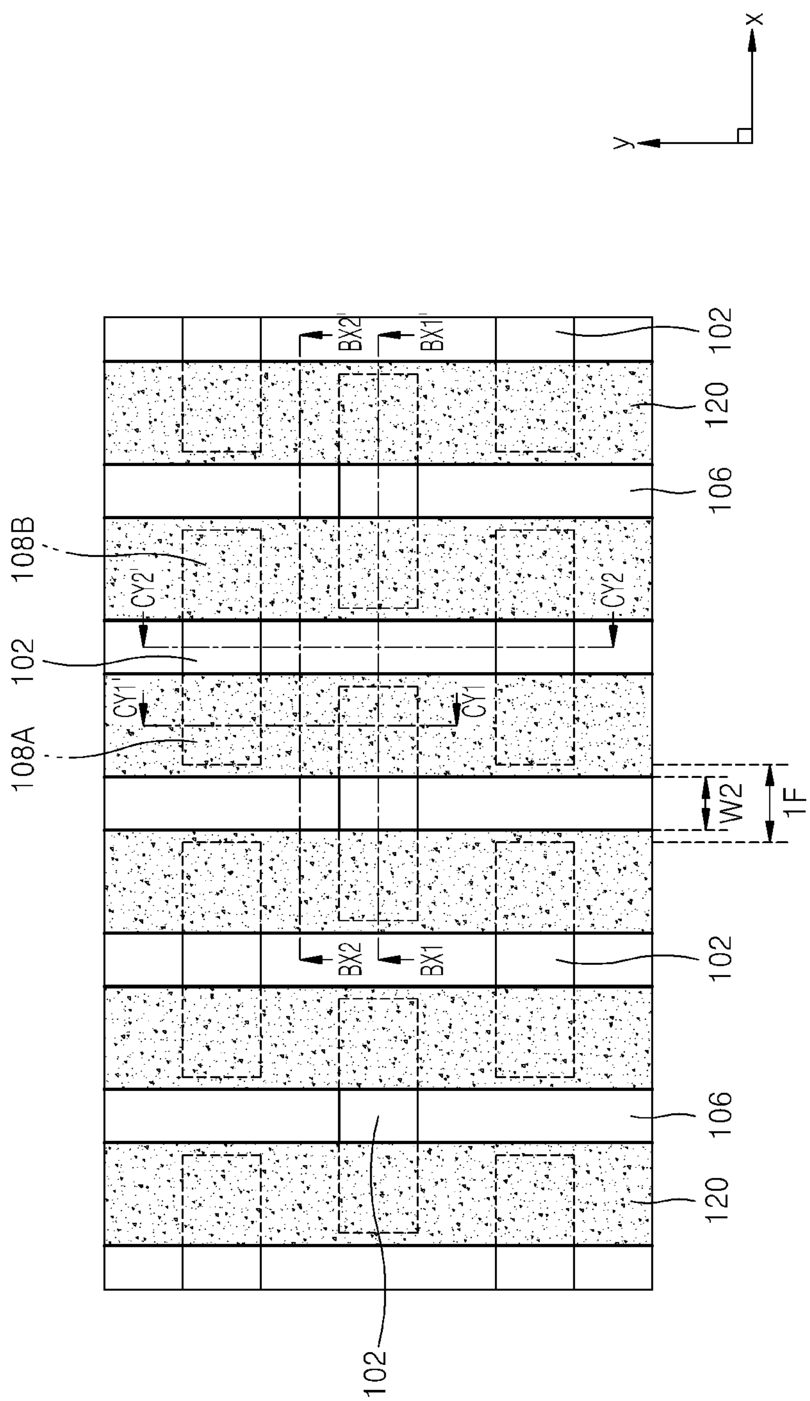
Figure 6B:
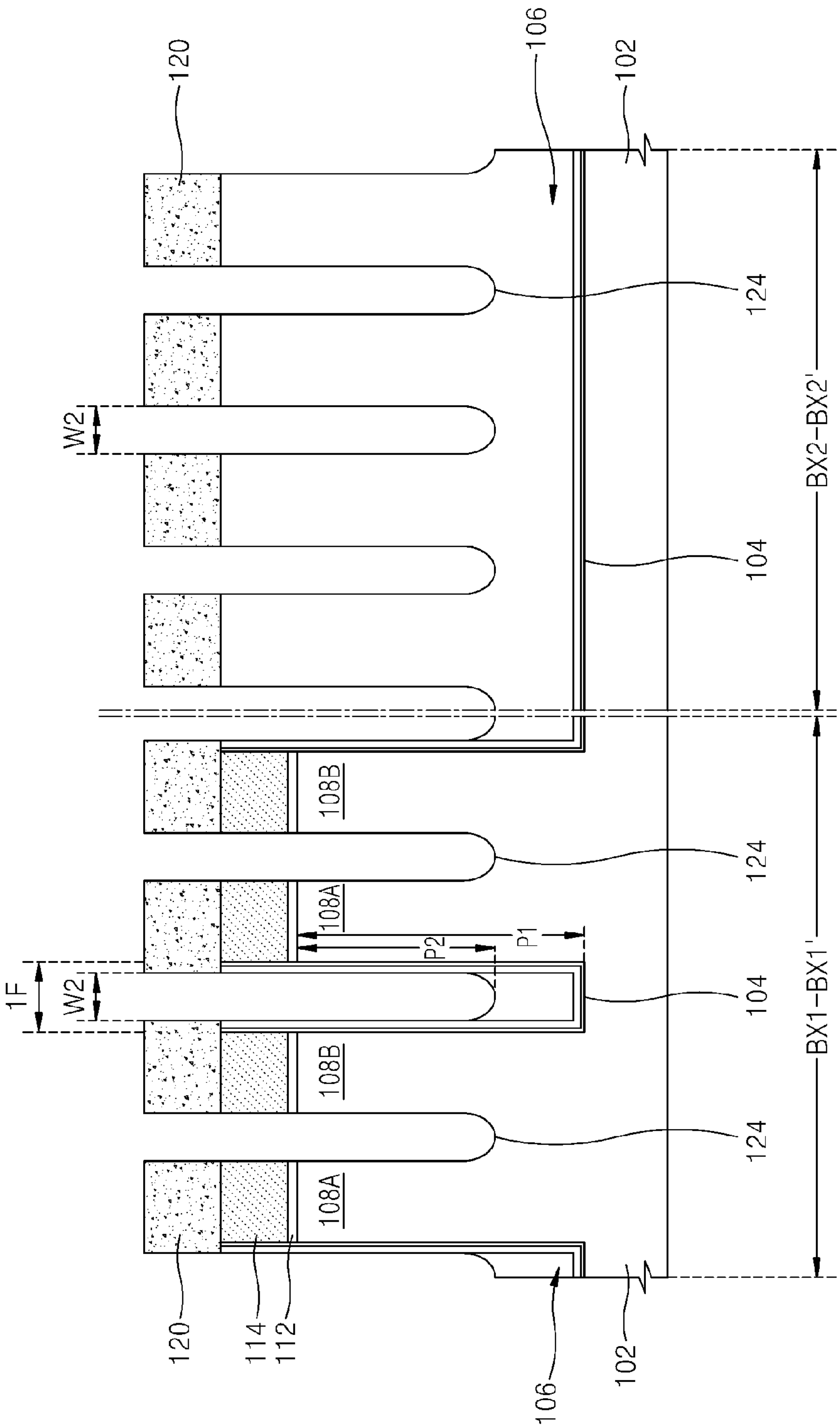
Figure 6C:
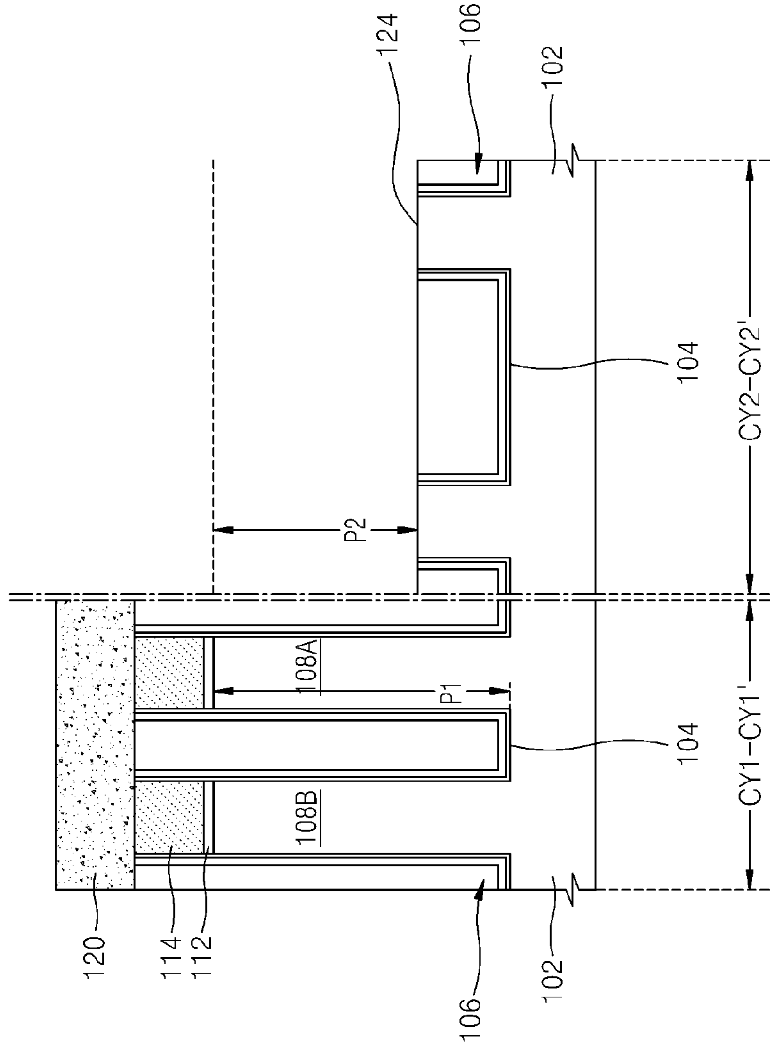

Referring to FIGS. 6A, 6B, and 6C, the exposed isolation layer 106, the plurality of first mask patterns 114, the pad oxide layer pattern 112, and the substrate 102 are anisotropic-etched by using the second mask patterns 120 as an etching mask to form a plurality of second trenches 124 that extend in parallel with each other in the shorter axis direction, i.e., the y direction of the active areas 108. The active areas 108 and the isolation layer 106 on the substrate 102 are exposed through the bottom surfaces of the second trenches 124. The plurality of second trenches 124 have bottom surfaces at a second depth P2 from the upper surface of the substrate 102. The second depth P2 is smaller than the first depth P1 that is the depth of the first trench 104.

When the second trenches 124 are formed, each of the active areas 108 is divided into two active pillars 108A and 108B. The two active pillars 108A and 108B may respectively include one unit memory cell. Each of the active pillars 108A and 108B provides a vertical channel region for forming the unit memory cell.

The second trench 124 may have a width W2 that is smaller than 1F. The second trench 124 that is formed in the isolation layer 106 having a width of 1F may not expose the active area 108 through the inner wall thereof. In an embodiment, during performance of the etching process for forming the plurality of second trenches 124, the side wall oxide layer 106_1 and the nitride liner 106_2 of the isolation layer 106 may be partially etched on a portion having a small width in the isolation layer 106 (for example, the first trench 104 portion shown in the cross-section taken along the line BX1-BX1' of FIG. 6A). Thus, the active area 108 may be partially exposed along the inner wall of the second trench 124.

Figure 7A:
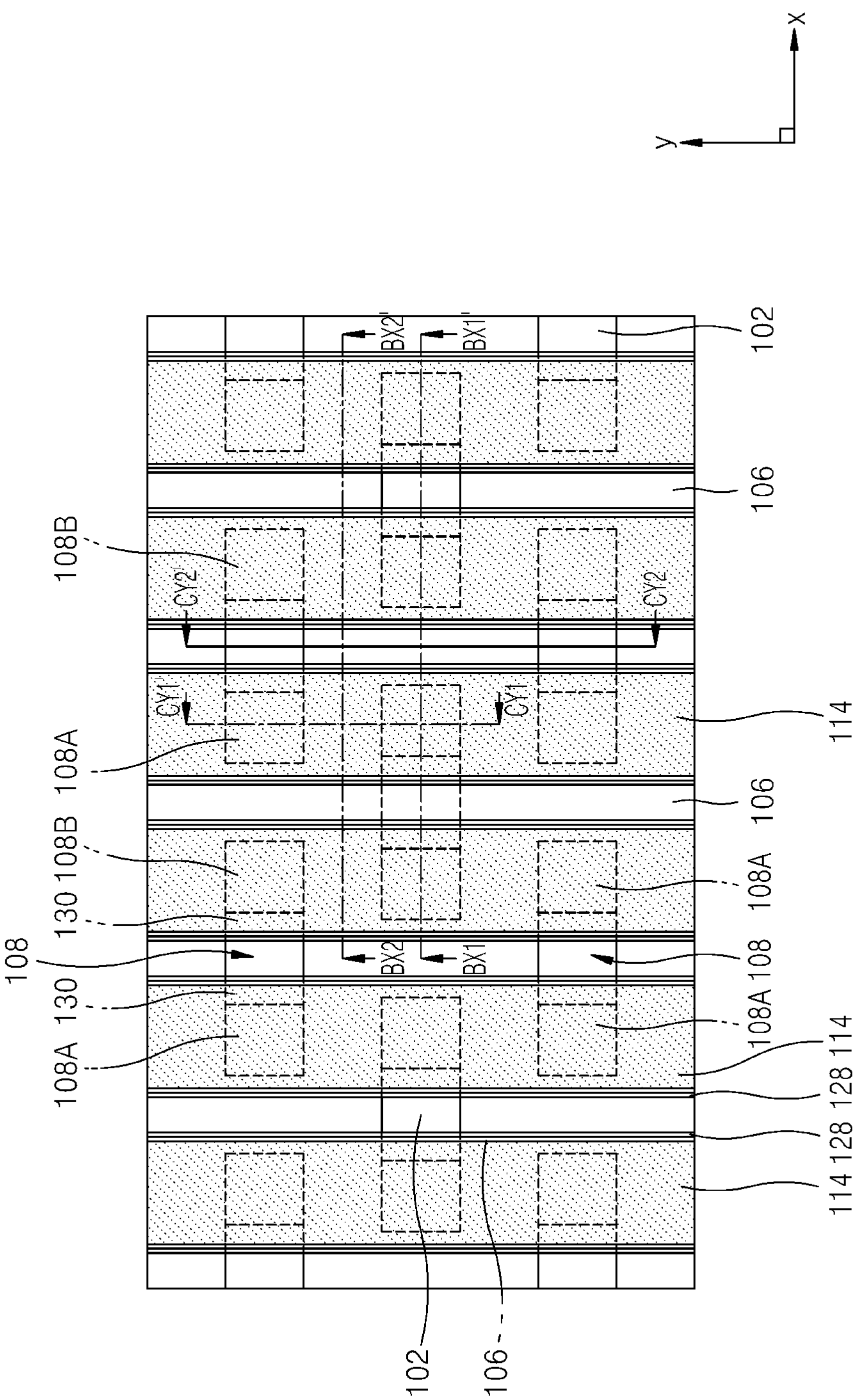
Figure 7B:
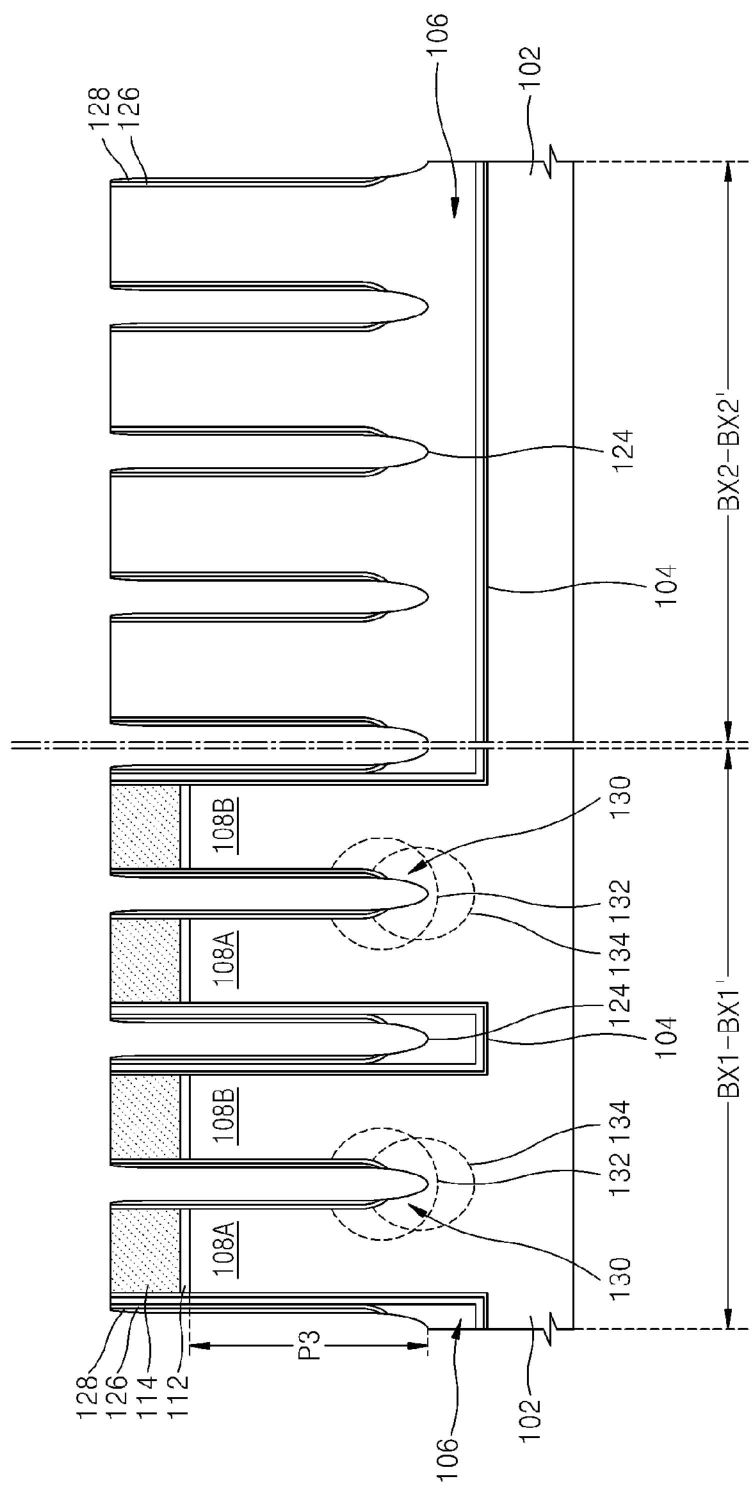
Figure 7C:
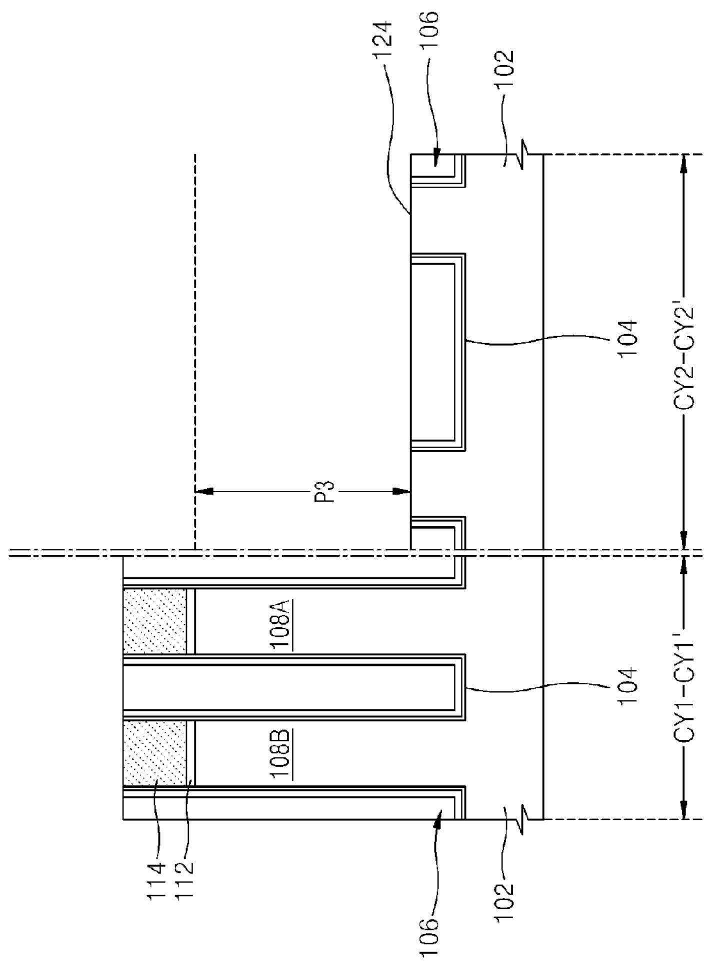

Referring to FIGS. 7A, 7B, and 7C, the second mask patterns 120 are removed. An oxide layer 126 is formed on the exposed surface of the substrate 102 by using, for example, a radial oxidation process. When the oxide layer 126 is formed, surface defects of the active area 108, which can be generated during the etching process for forming the plurality of second trenches 124, may be cured. Ion implantation of a low concentration dopant 132 into the substrate 102 around the bottom surfaces of the plural second trenches 124 is performed by using the first mask patterns 114 as an ion implantation mask. For example, the low concentration dopant 132 may be N-type impurity ions. However, the present inventive concept is not limited thereto. Then, a nitride spacer 128 is formed on the inner wall of each of the second trenches 124.

To form the nitride spacer 128, according to an embodiment, a nitride layer is formed on the structure on which the oxide layer 126 is formed, and the nitride layer may be etched-back to leave the nitride spacer 128 only on the inner walls of the second trenches 124. When there is an excessive etching during the etch-back process for forming the nitride spacer 128, the active areas 108 on the substrate 102 may be exposed through the bottom surfaces of the plurality of second trenches 124 and the isolation layer 106 may be exposed through the bottom surfaces of the plurality of second trenches 124 on the isolation region where the isolation layer 106 is formed. In an embodiment, the second trenches 124 may be further etched from the portion where the active area 108 or the isolation layer 106 is exposed. Thus, a third depth P3 of the second trench 124 may be greater than the depth P2 after forming the nitride spacer 128.

According to an embodiment, ion implantation of a high concentration dopant 134 into the substrate 102 that are exposed through the bottom surfaces of the second trenches 124 may be performed for forming first source/drain regions 130 by using the first mask patterns 114 as an ion implantation mask. The high concentration dopant 134 may be the same type impurity ions as the low concentration dopant 132, for example, N-type impurity ions. Thus, the first source/drain regions 130 are formed around the lower portions of the second trenches 124 in the substrate 102.

Figure 8A:
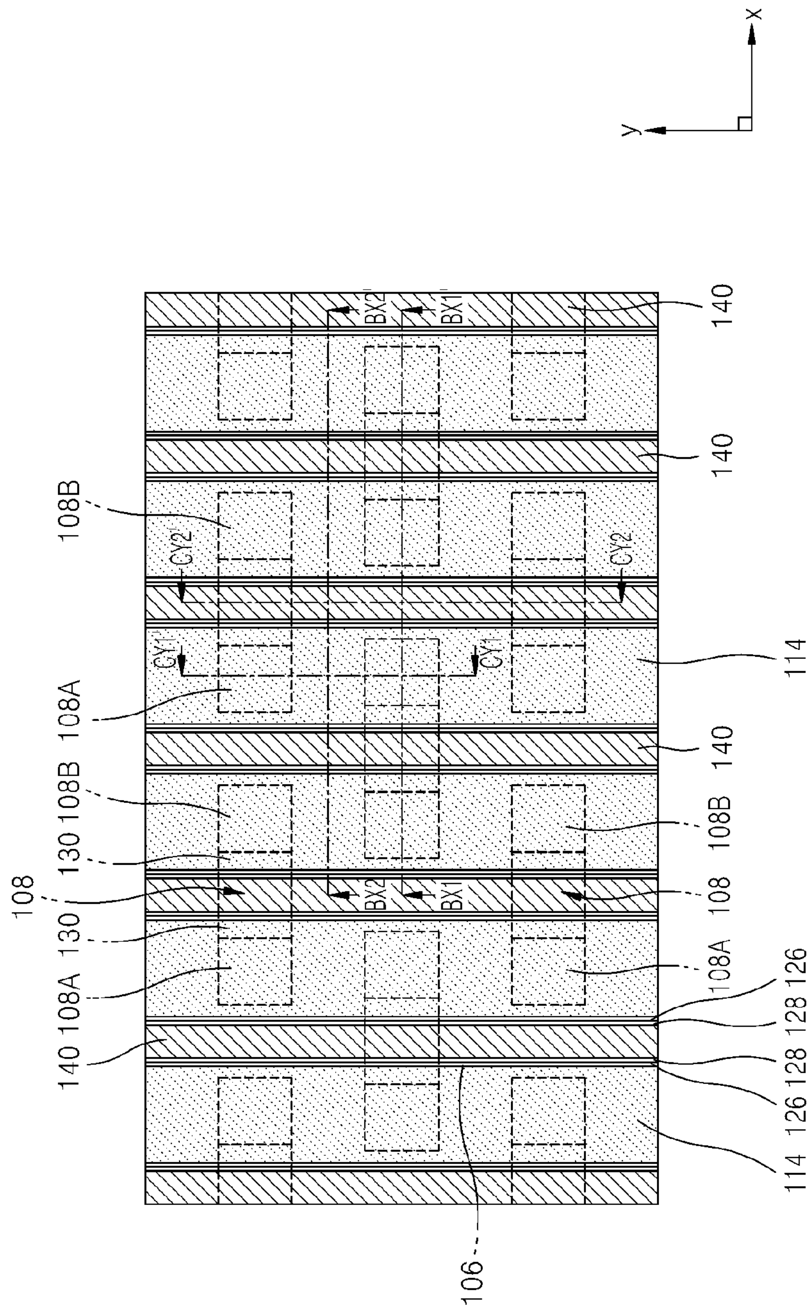
Figure 8B:
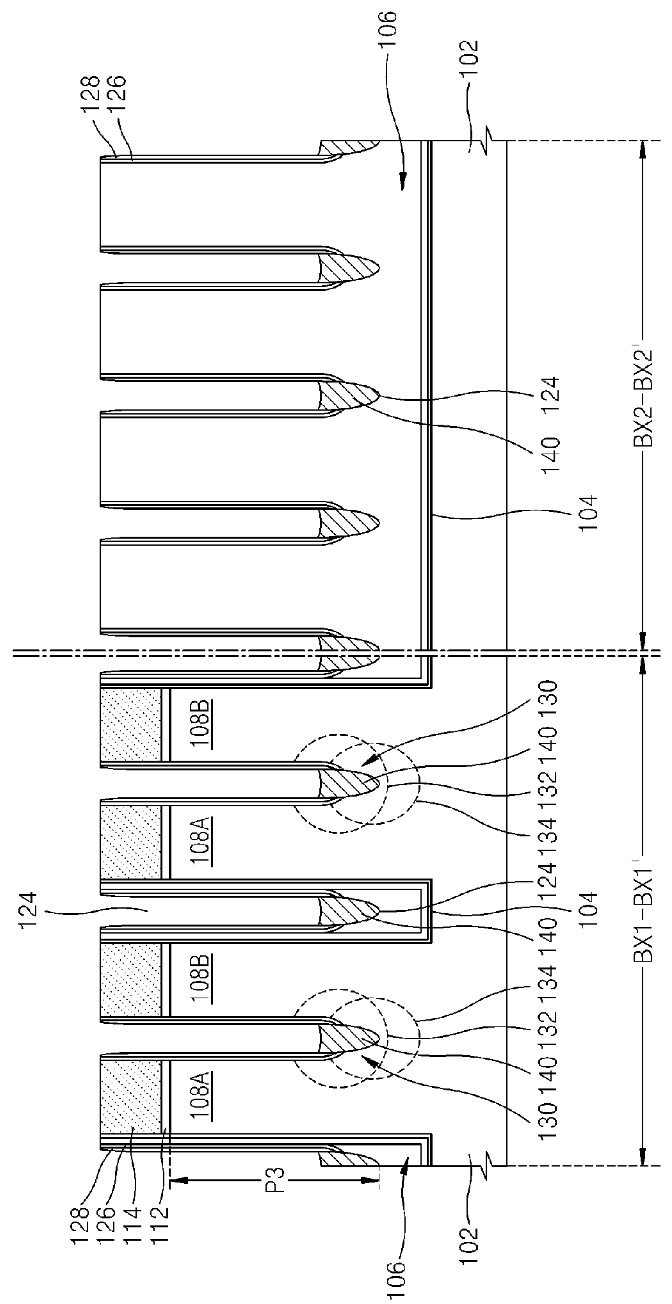
Figure 8C:
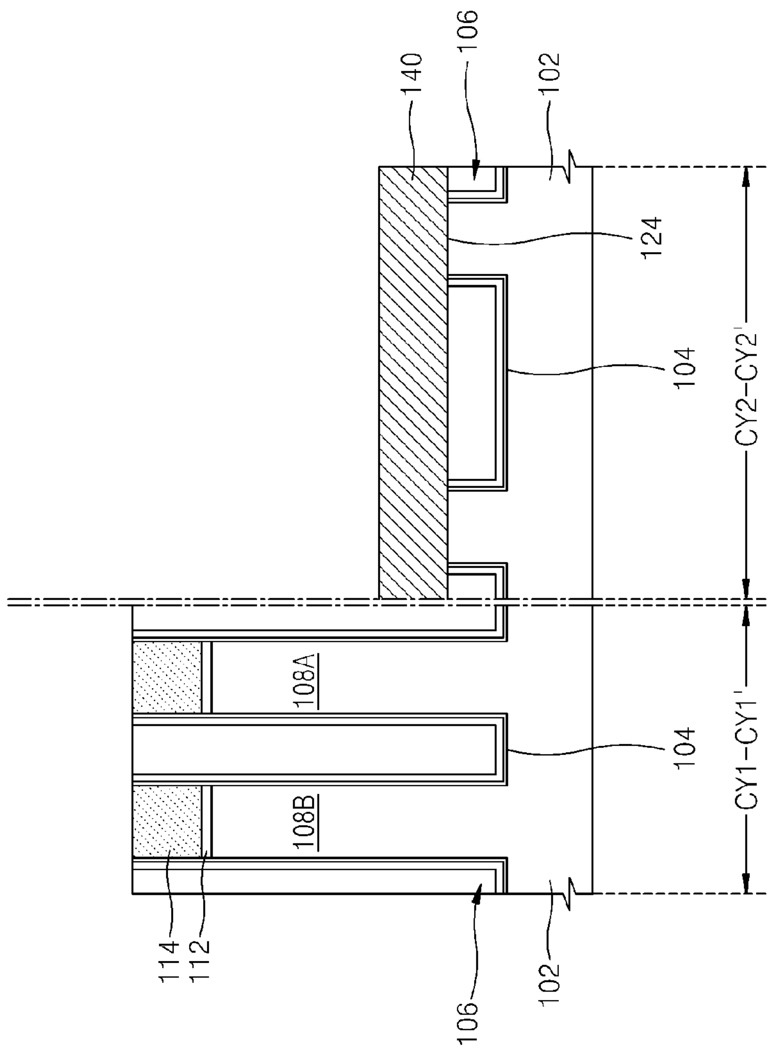

Referring to FIGS. 8A, 8B, and 8C, a conductive material is deposited to form a conductive layer filling the inner spaces of the second trenches 124. Portions of the conductive layer are removed by the etch-back process so that the conductive layer may remain only on the bottom surfaces of the second trenches 124. Thus, a plurality of buried bit lines 140 including the conductive layer remaining on the bottom surfaces of the plurality of second trenches 124 are formed.

Each of the buried bit lines 140 extends between the two active pillars 108A and 108B. The two unit memory cells formed on the two active pillars 108A and 108B share the buried bit line 140 and the first source/drain region 130 formed around the bottom surface of the buried bit line 140. That is, in one active pillar 108A of one active area 108, a vertical channel may be formed between a second source/drain region 150 that is formed on an upper surface of the active pillar 108A and the first source/drain region 130. For the other active pillar 108B of the active area 108, a vertical channel may be formed between the second source/drain region 150 that is formed on an upper surface of the active pillar 108B and the first source/drain region 130.

The plurality of buried bit lines 140 may comprise metal, metal nitride, metal silicide, or combinations thereof. For example, the buried bit lines 140 may comprise a metal material such as W, Al, Cu, Mo, Ti, Ta, or Ru. In an embodiment, the buried bit lines 140 may comprise metal nitride such as TiN, TiN/W, Ti/TiN, WN, W/WN, TaN, Ta/TaN, TiSiN, TaSiN, or WSiN. The buried bit lines 140 may comprise metal silicide such as $CoSi_2$, $TiSi_2$, or $WSi_2$.

Among the buried bit lines 140, the bottom surfaces of the buried bit lines 140 located on the active areas 108 and the bottom surfaces of the bit lines 140 located on the isolation layer 106 are located at the same level. Thus, distances from the upper surface of the substrate 102 to the buried bit lines 140 may be constant.

Figure 9A:
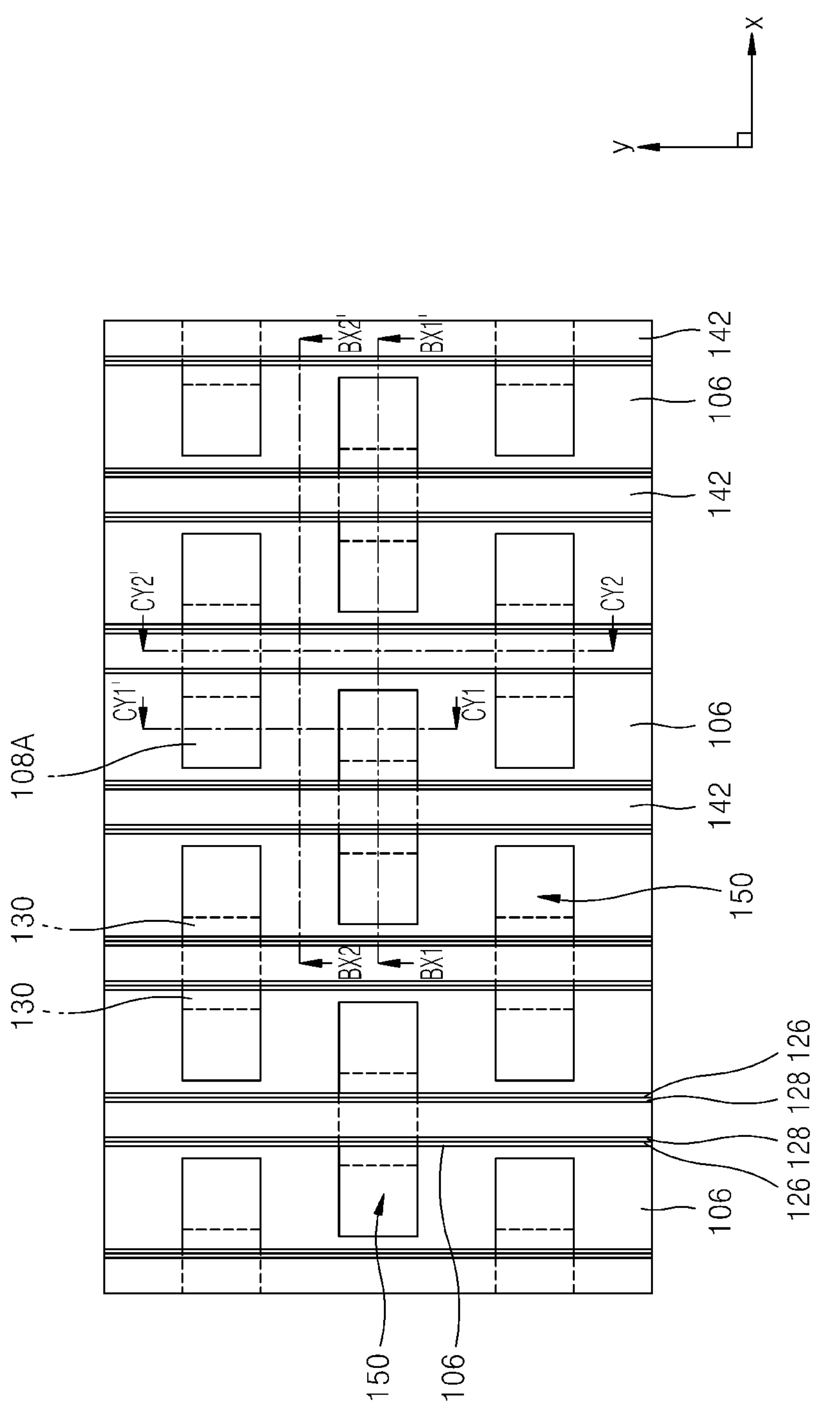
Figure 9B:
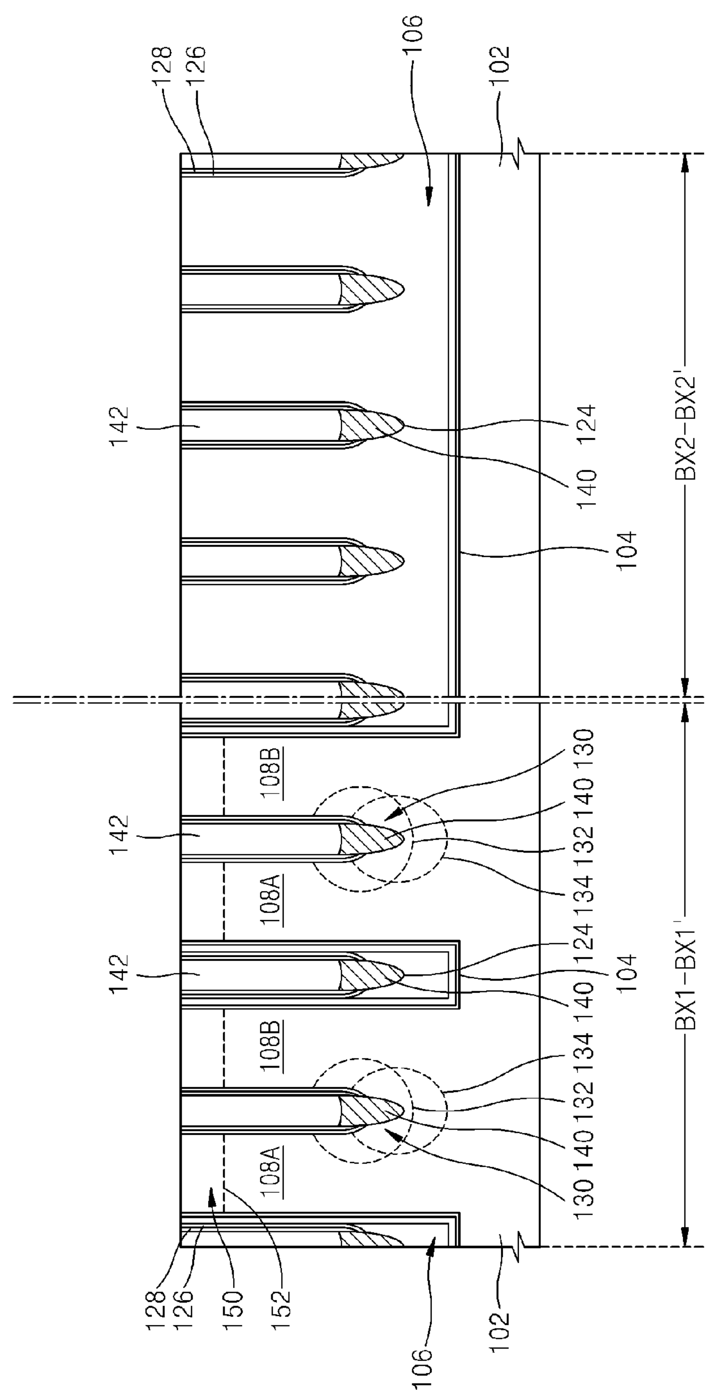
Figure 9C:
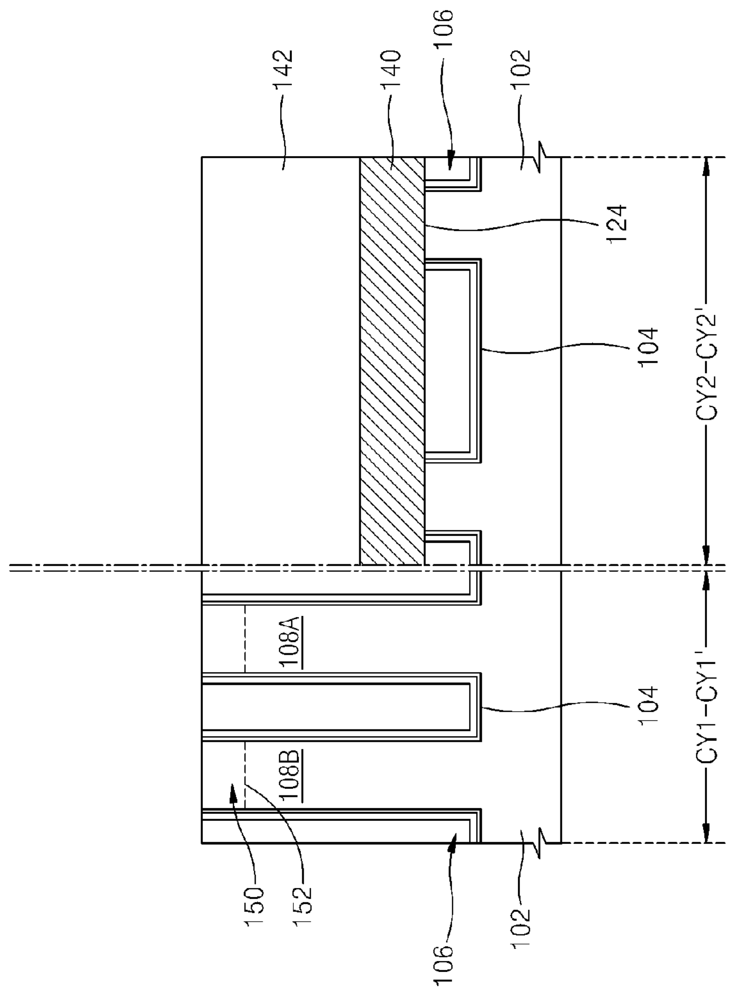

Referring to FIGS. 9A, 9B, and 9C, an insulating material is deposited on an entire surface of the structure in which the buried bit lines 140 are formed to completely fill the inner spaces of the second trenches 124. Then, a planarization process using CMP is performed until the upper surface of the substrate 102 is exposed. Thus, a buried insulating layer 142 that fills the upper spaces of the buried bit lines in the plurality of second trenches 124 is formed. The buried insulating layer 142 covers the buried bit line 140 in a space between the two active pillars 108A and 108B included in each of the active areas 108. The buried insulating layer 142 extends above the buried bit line 140 in parallel with the buried bit line 140, while crossing the plurality of active areas 108, in the second trench 124. The buried insulating layer 142 may comprise, for example, a silicon nitride layer.

Ion implantation of a low concentration dopant 152 on exposed upper surfaces of the active areas 108 of the substrate 102 is performed for forming the second source/drain regions 150. The low concentration dopant 152 includes the impurity ions of the same conductive type as that of the first source/drain region 130. For example, the low concentration dopant 152 may be N-type impurity ions. Ion implantation of high concentration dopant of the second source/drain region 150 may be performed after performing the ion implantation of the low concentration dopant 152 according to an embodiment. According to an embodiment, the ion implantation of the high concentration dopant may be performed in post-processes.

According to an exemplary embodiment, an ion implantation process for forming the channel region on the active areas 108 may be performed via the exposed upper surface of the substrate 102.

Figure 10A:
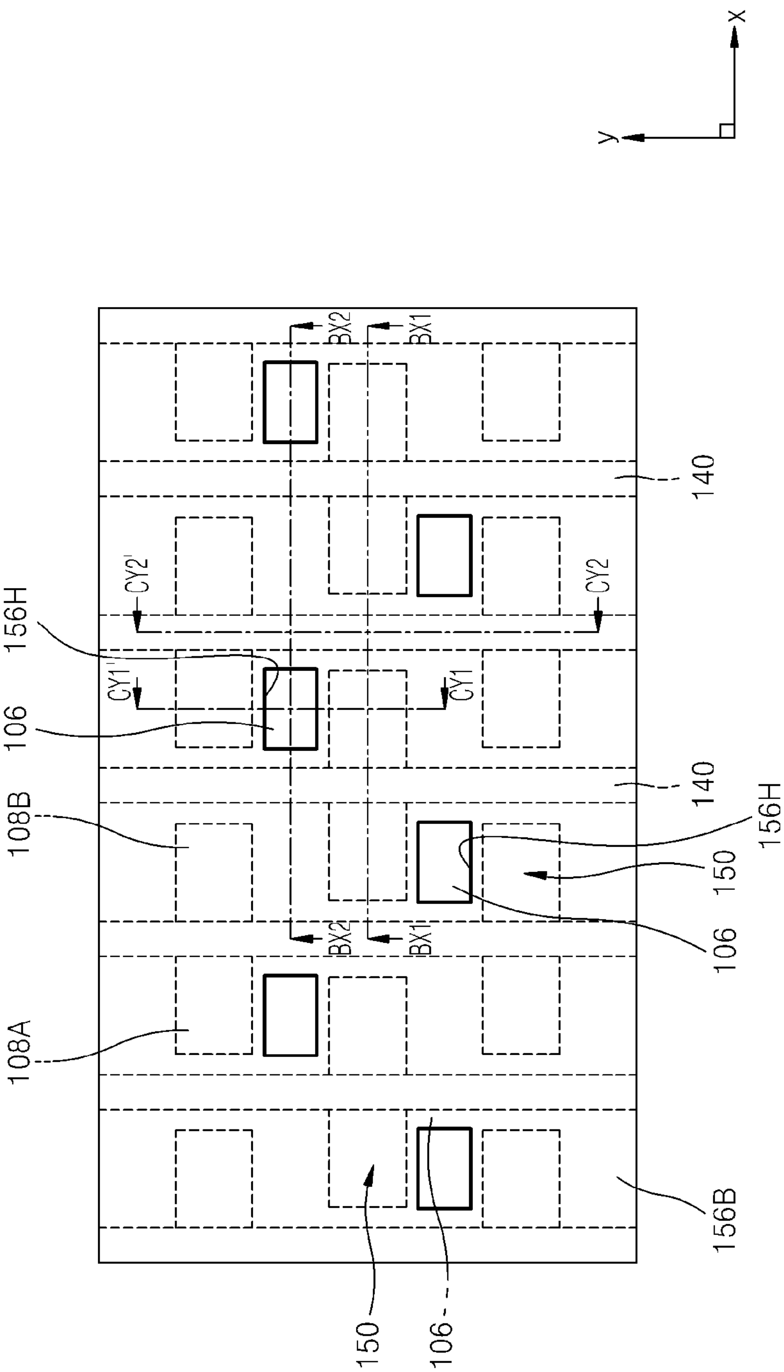
Figure 10B:
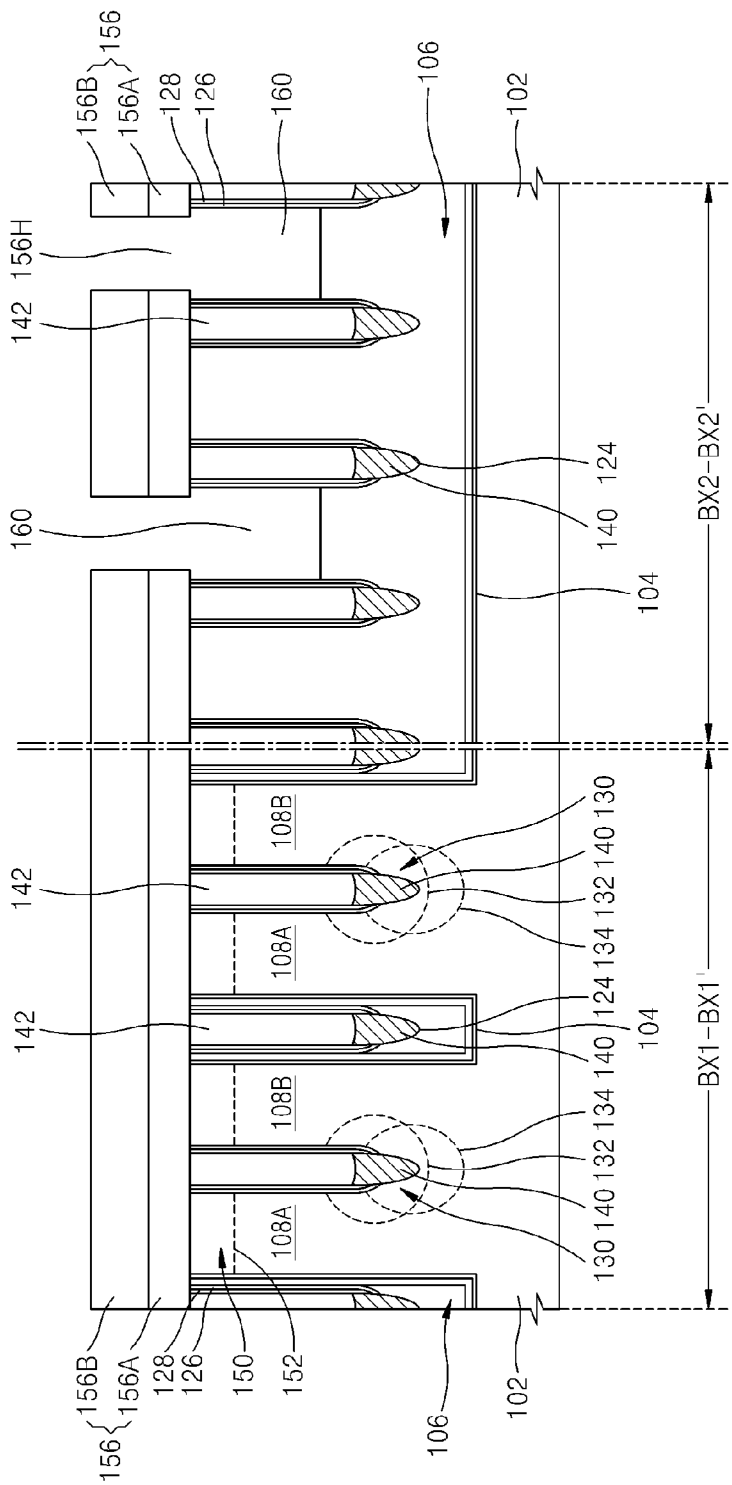
Figure 10C:
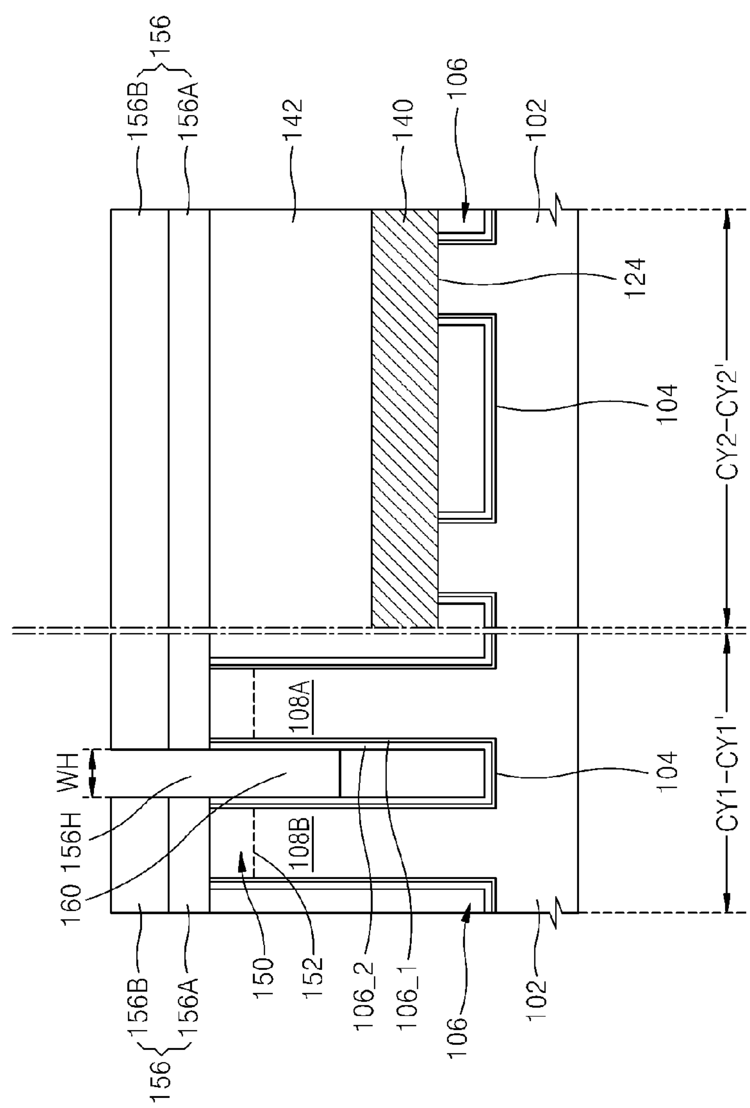

Referring to FIGS. 10A, 10B, and 10C, a third mask pattern 156 including a plurality of openings 156H that partially expose the isolation layer 106 is formed on the structure in which the second source/drain regions 150 are formed.

The third mask pattern 156 may comprise an oxide layer pattern 156A and a hard mask pattern 156B disposed on the oxide layer pattern 156A.

Portions of the isolation layer 106 are exposed via the plurality of openings 156H formed in the third mask pattern 156. Contact gates can be disposed on the isolation layer 106. In order not to expose the substrate 102 via the plurality of openings 156H, the third mask pattern 156 is formed so that the upper surface of the substrate 102 is completely covered by the third mask pattern 156. To do this, a width WH of the opening 156H may be adjusted according to an embodiment.

According to an exemplary embodiment, the hard mask pattern 156B may comprise an ACL layer or an SOH layer. The oxide layer is anisotropic-etched by using the hard mask pattern 156B as an etching mask. Then, the isolation layer 106 that is exposed via the plurality of openings 156H is etched to form a contact gate recess 160.

The gap fill oxide layer 106_3 remaining on an inner side wall of the contact gate recess 160 may be removed by, for example, a wet-etching process until the nitride line 106_2 is exposed on the inner side wall of the contact gate recess 160. According to an exemplary embodiment, the oxide layer 126 exposed on another side wall in the contact gate recess 160 may be partially etched.

Figure 11A:
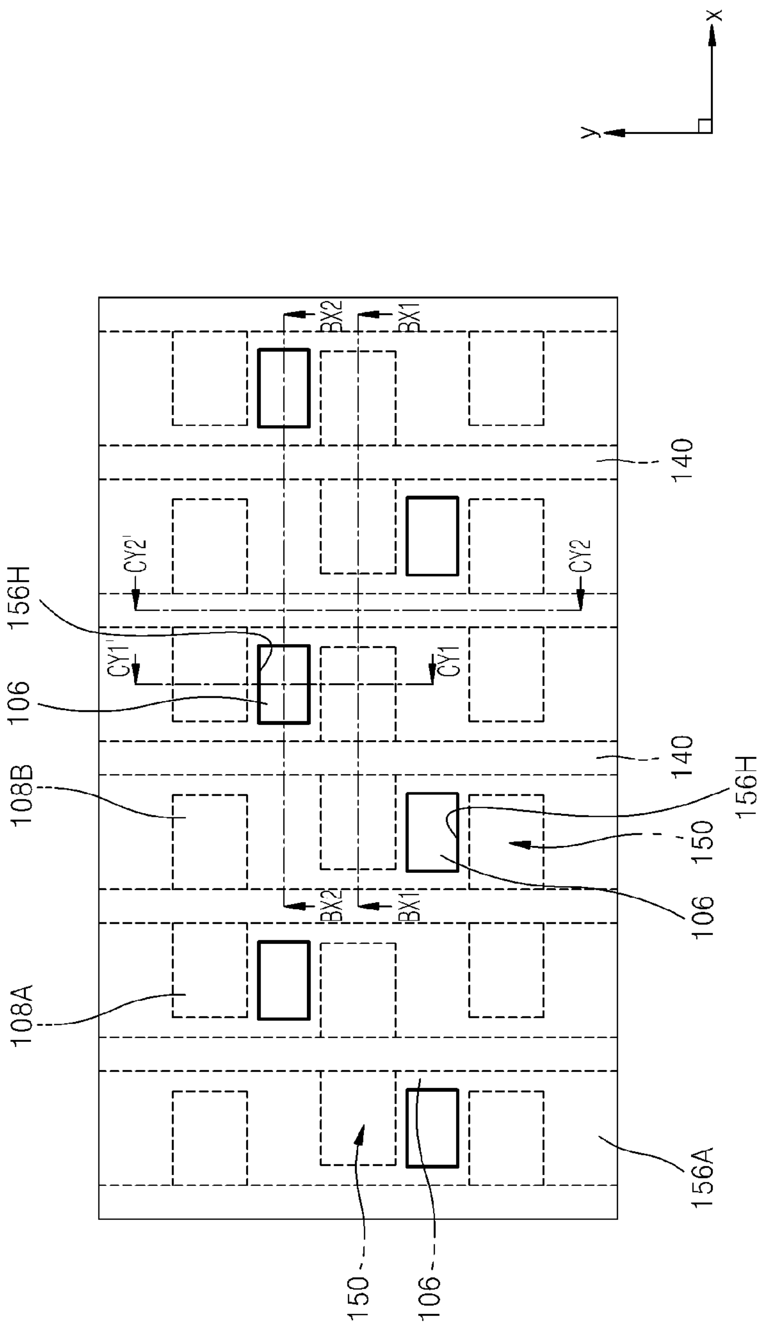
Figure 11B:
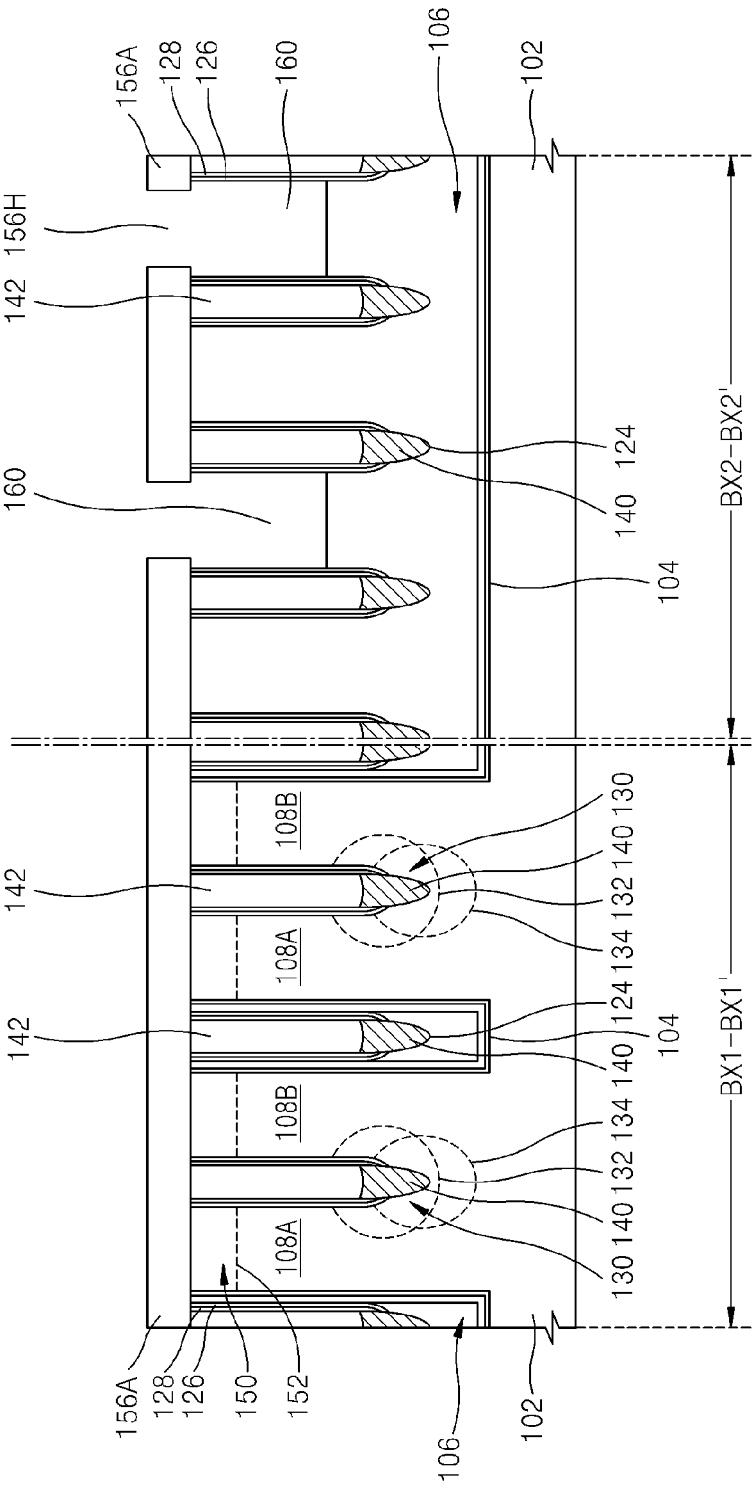
Figure 11C:
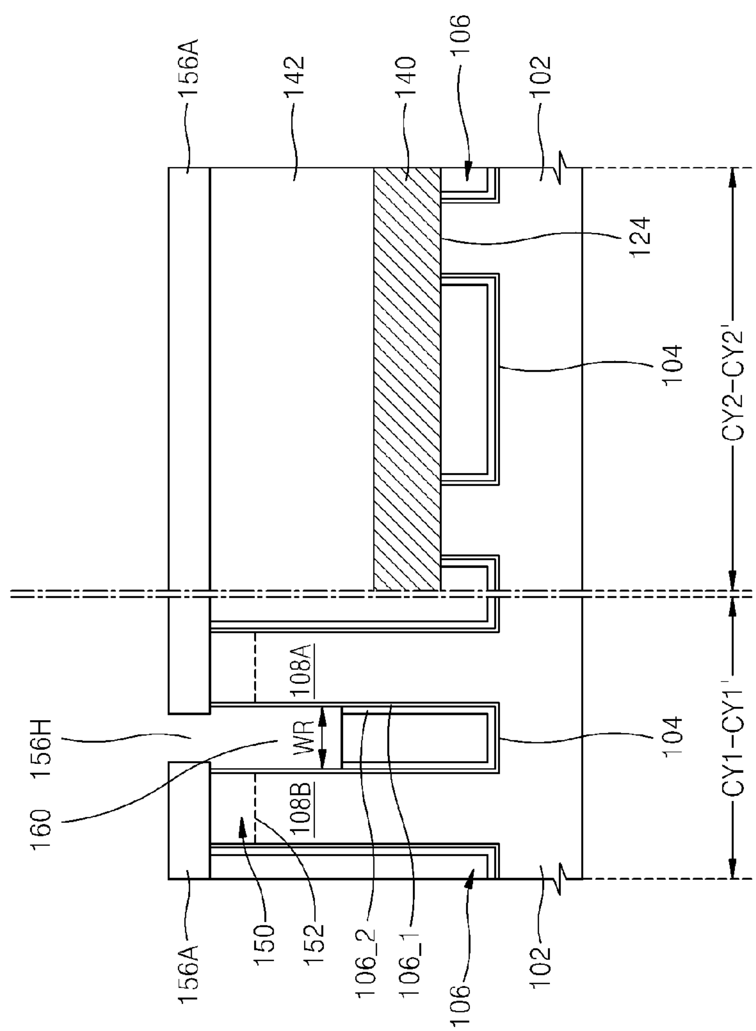

Referring to FIGS. 11A, 11B, and 11C, the hard mask pattern 156B of the third mask pattern 156 is removed, and the nitride liner 106_2 exposed on the inner side wall of the contact gate recess 160 is removed by the wet-etching process to increase an inner width WR of the contact gate recess 160. During the wet-etching process of the nitride liner 106_2 that is exposed on the inner side wall of the contact gate recess

160, the side wall oxide layer 106_1 of the isolation layer 106 that covers the side wall of the active area 108 may function as an etch-stop layer.

Figure 12A:
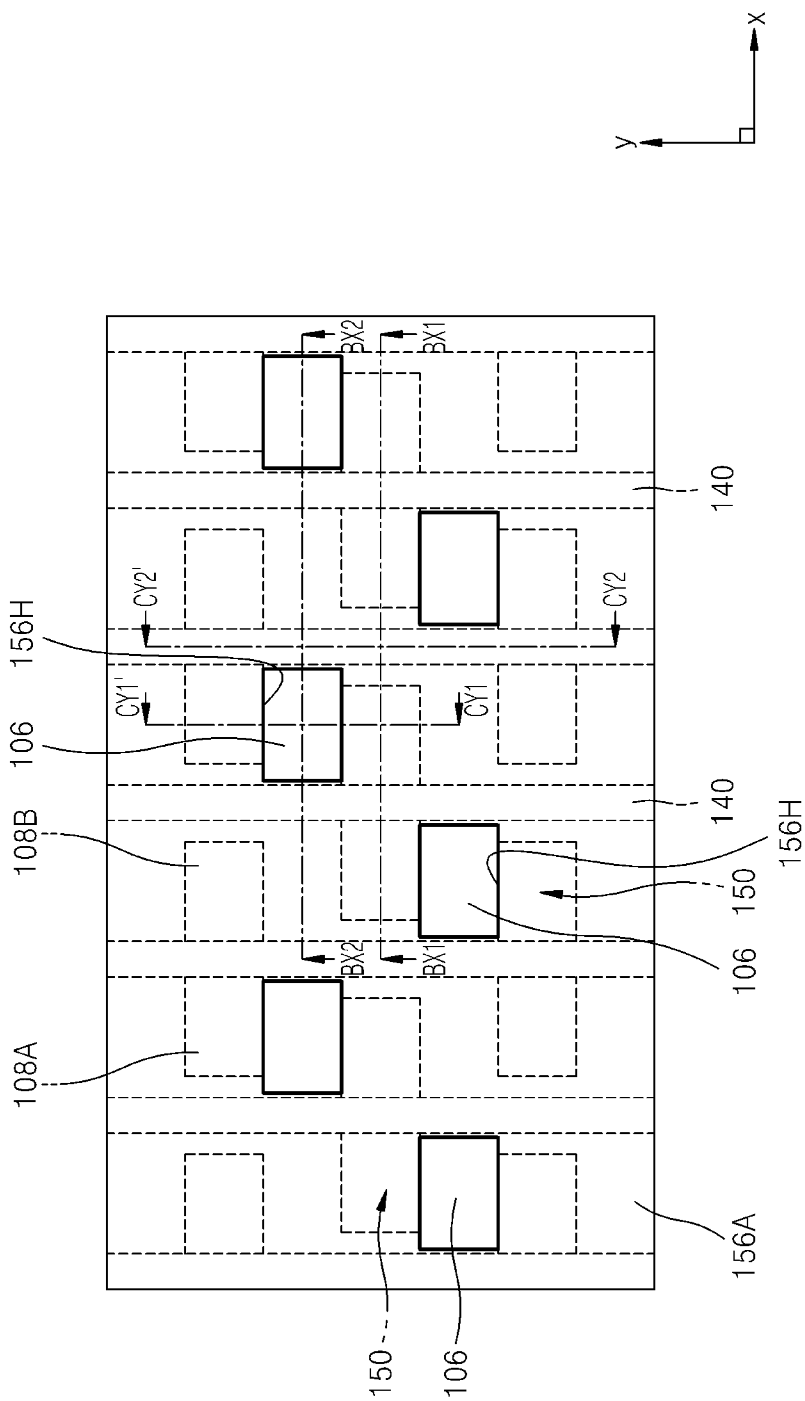
Figure 12B:
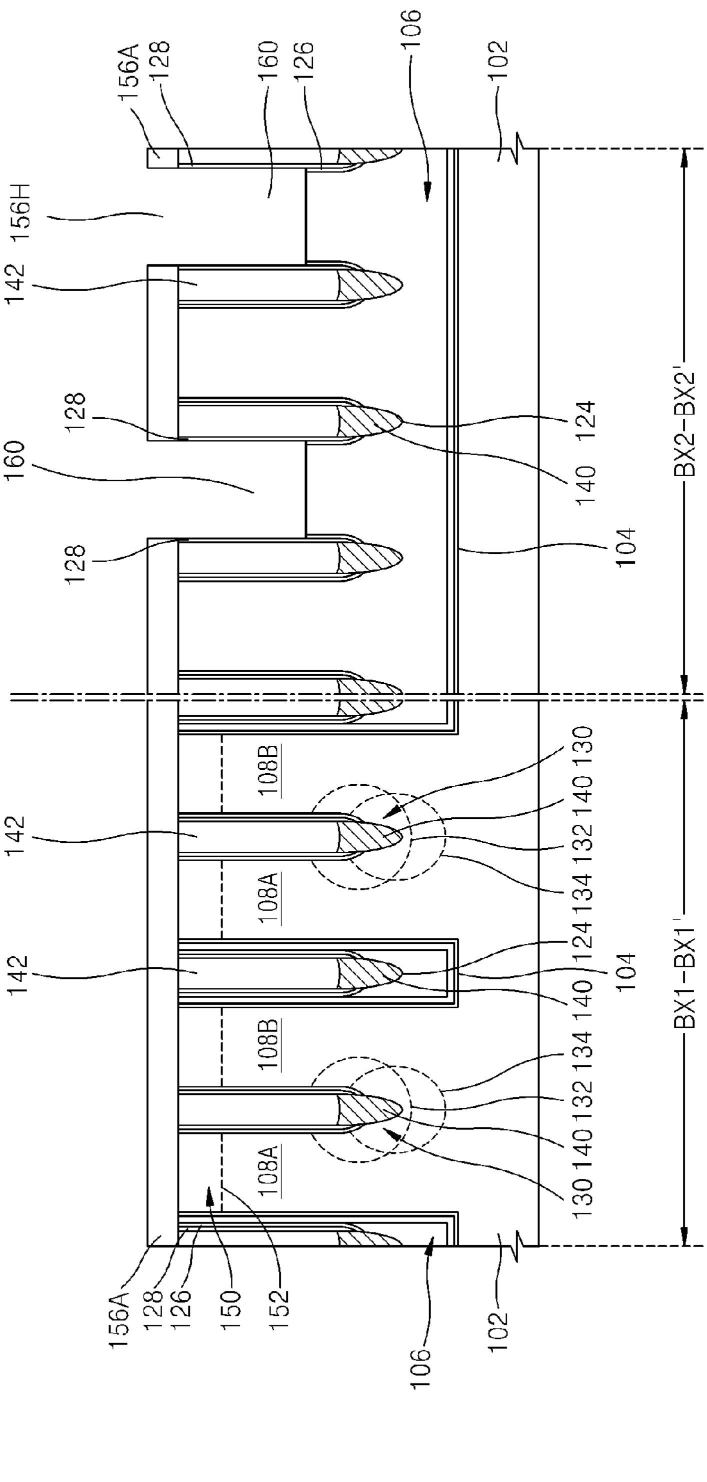
Figure 12C:
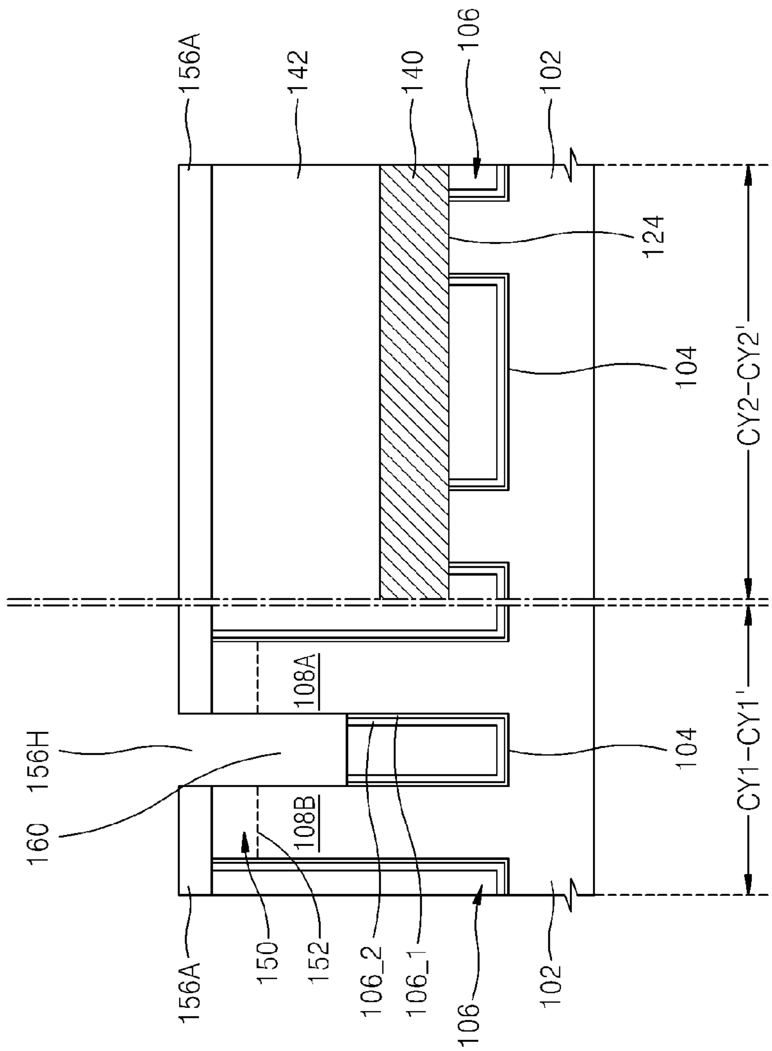

Referring to FIGS. 12A, 12B, and 12C, the side wall oxide layer 106_1 exposed on the inner side wall of the contact gate recess 160 is removed by the wet-etching process to expose the side wall of the active area 108 in the contact gate recess 160.

When the oxide layer 126 formed on the inner wall of the second trench 124 is exposed along another side wall of the contact gate recess 160, the exposed part of the oxide layer 126 may be etched while the side wall oxide layer 106_1 is removed by the wet-etching process. In an exemplary embodiment, during removal of the side wall oxide layer 106_1 by the wet-etching process, a part of the oxide layer pattern 156A may be removed, and a part of the gap fill oxide layer 106_3 exposed on a bottom surface of the contact gate recess 160 may be removed.

A depth of the contact gate recess 160 is determined so that a distance from the upper surface of the substrate 102 to the bottom surface of the contact gate recess 160 is less than a distance from the upper surface of the substrate 102 to the upper surface of the plurality of buried bit lines 140. That is, a predetermined distance or a gap exists between the level of the upper surfaces of the plurality of buried bit lines 140 and the level of the bottom surface of the contact gate recess 160.

Figure 13A:
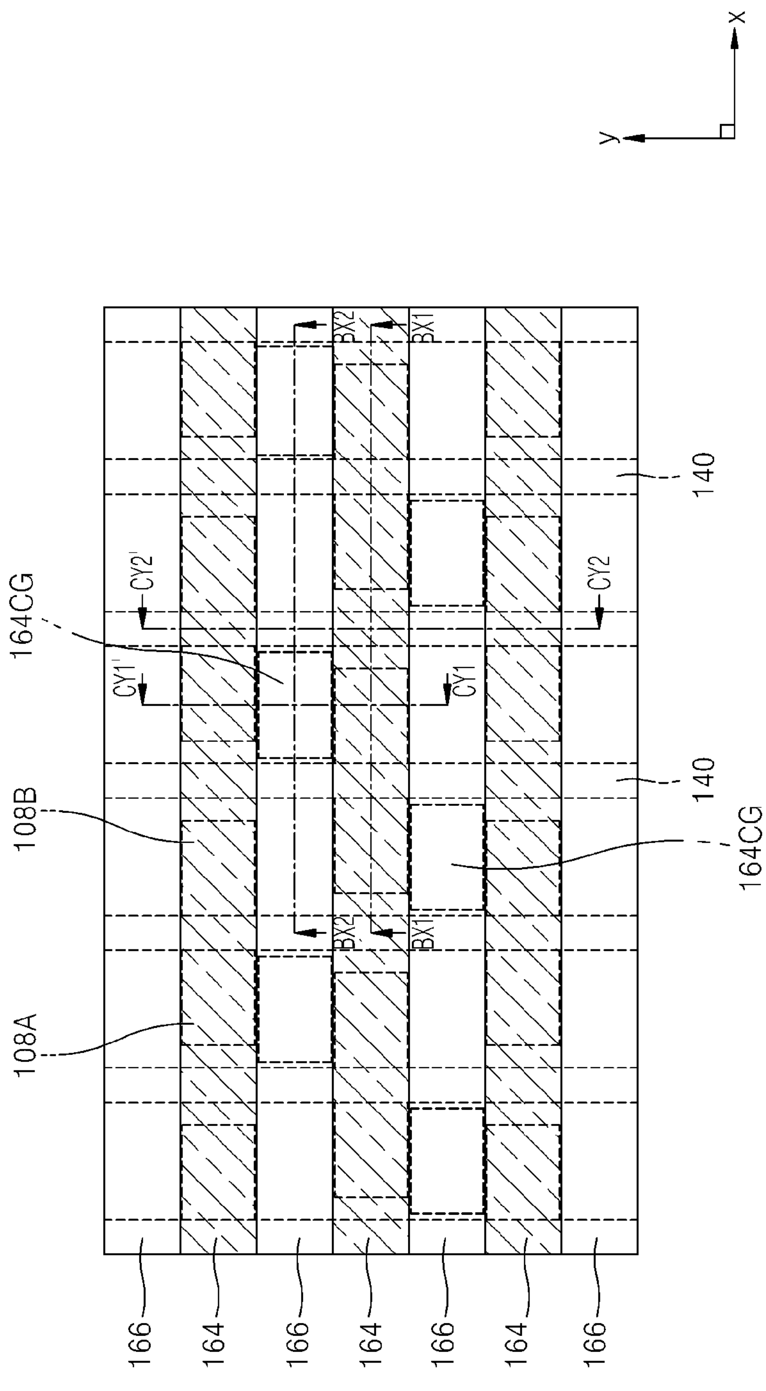
Figure 13B:
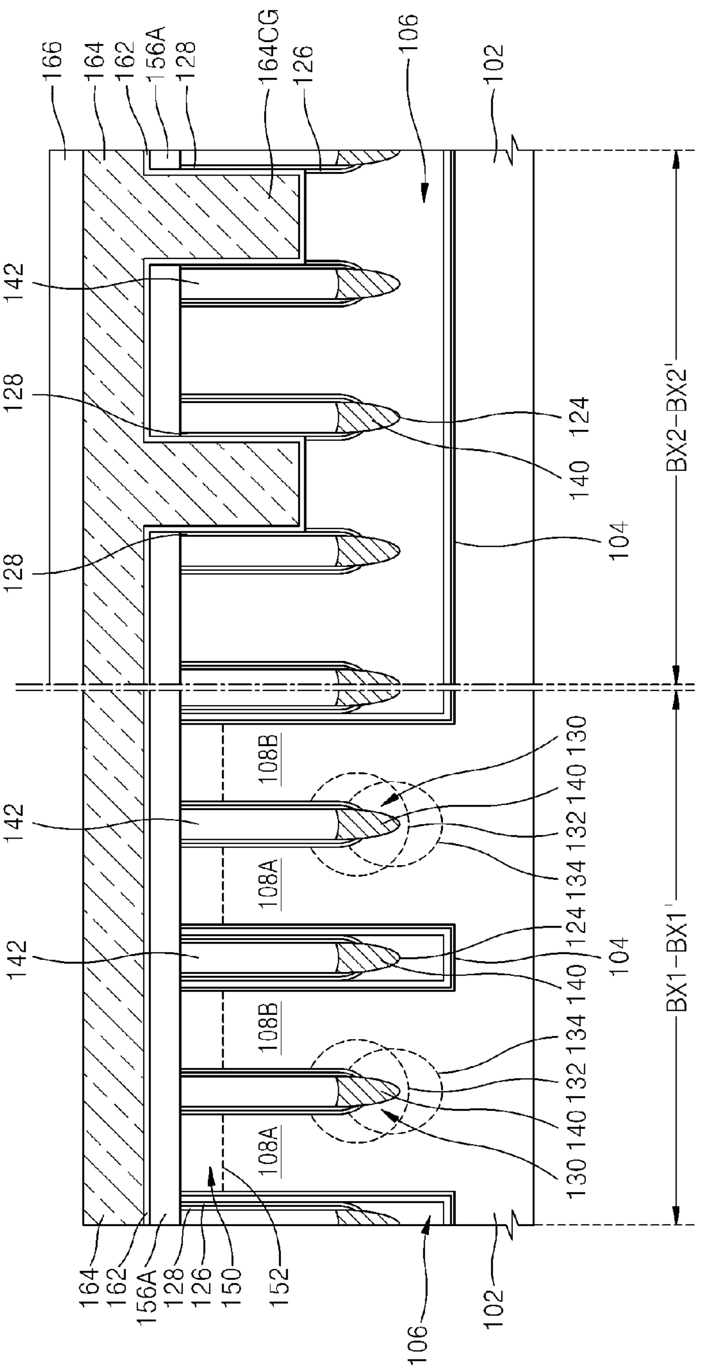
Figure 13C:
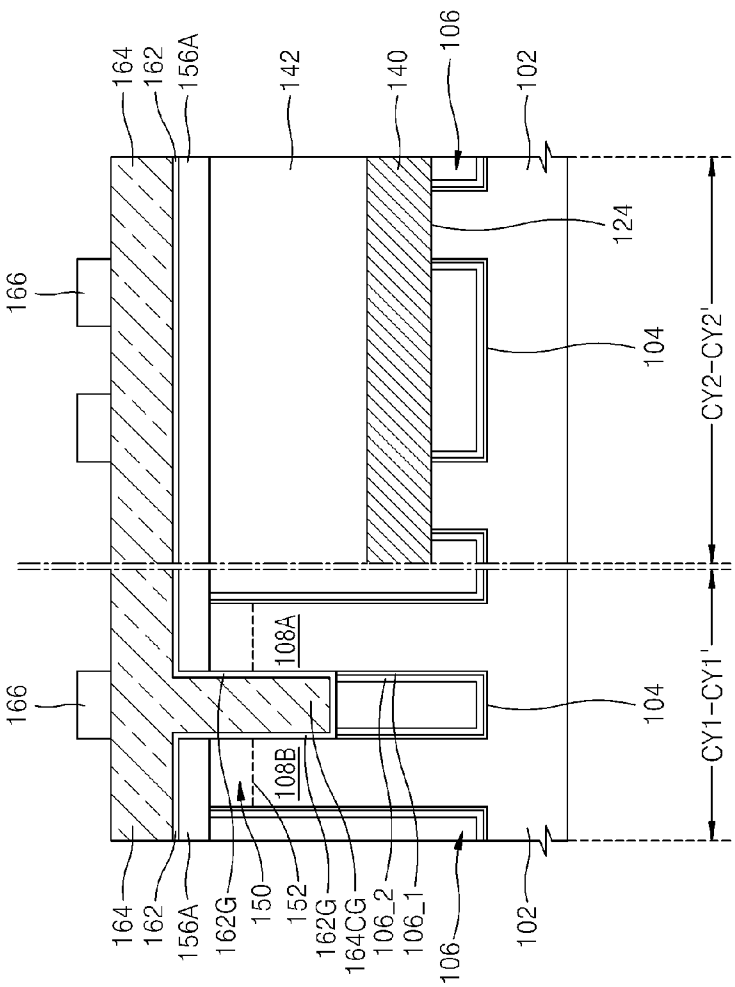

Referring to FIGS. 13A, 13B, and 13C, a resultant in which the contact gate recess 160 is formed is washed. Then, an insulating layer 162 is disposed to form a gate insulating layer 162G on the inner wall of the contact gate recess 160. Then, a conductive layer 164 that entirely covers the upper surface of the substrate 102 while filling the inner space of the contact gate recess 160 is formed on the insulating layer 162.

A portion of the conductive layer 164, which fills the inner space of the contact gate recess 160, is a contact gate 164CG constituting the vertical channel transistor with the first source/drain region 130 and the second source/drain region 150 in the active area 108. The insulating layer 162 for forming the gate insulating layer 162G may be formed by, for example, a radical oxidation process, a thermal oxidation process, a CVD process, or an atomic layer deposition (ALD) process.

The conductive layer 164 may comprise metal, metal nitride, doped polysilicon, or a combination thereof. For example, the conductive layer 164 may comprise a single material including a metal nitride material such as TiN. In an exemplary embodiment, the conductive layer 164 may comprise a doped polysilicon layer, a tungsten silicide layer, and a tungsten layer stacked on top of one another. The conductive layer 164 may comprise, for example, metal such as W or Ta, nitrides thereof, metal silicide, TaCN, TaSiN, or TiSiN.

A fourth mask pattern 166 for defining word line regions is formed on the conductive layer 164. The fourth mask pattern 166 may comprise a material that has an etch selectivity with respect to the conductive layer 164. For example, the fourth mask pattern 166 may be a silicon nitride layer.

Figure 14A:
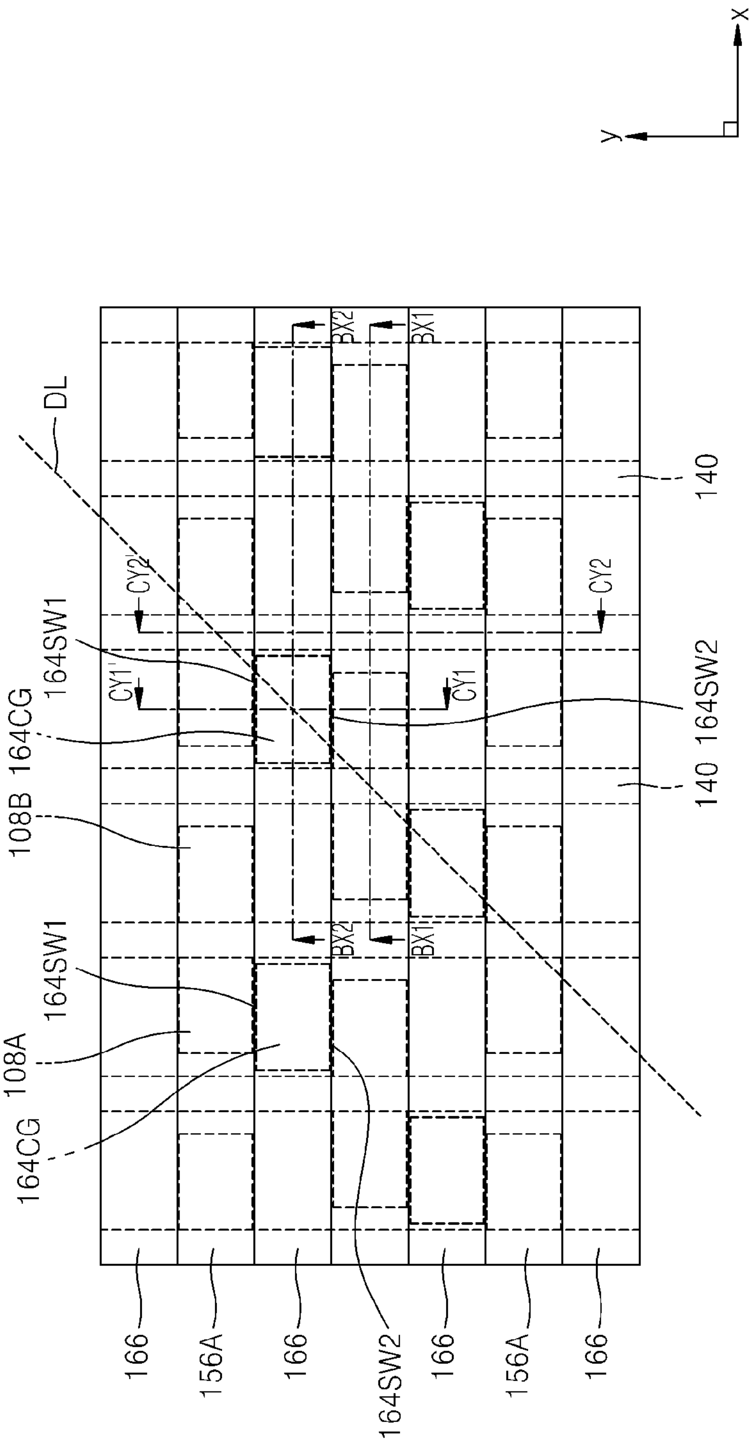
Figure 14B:
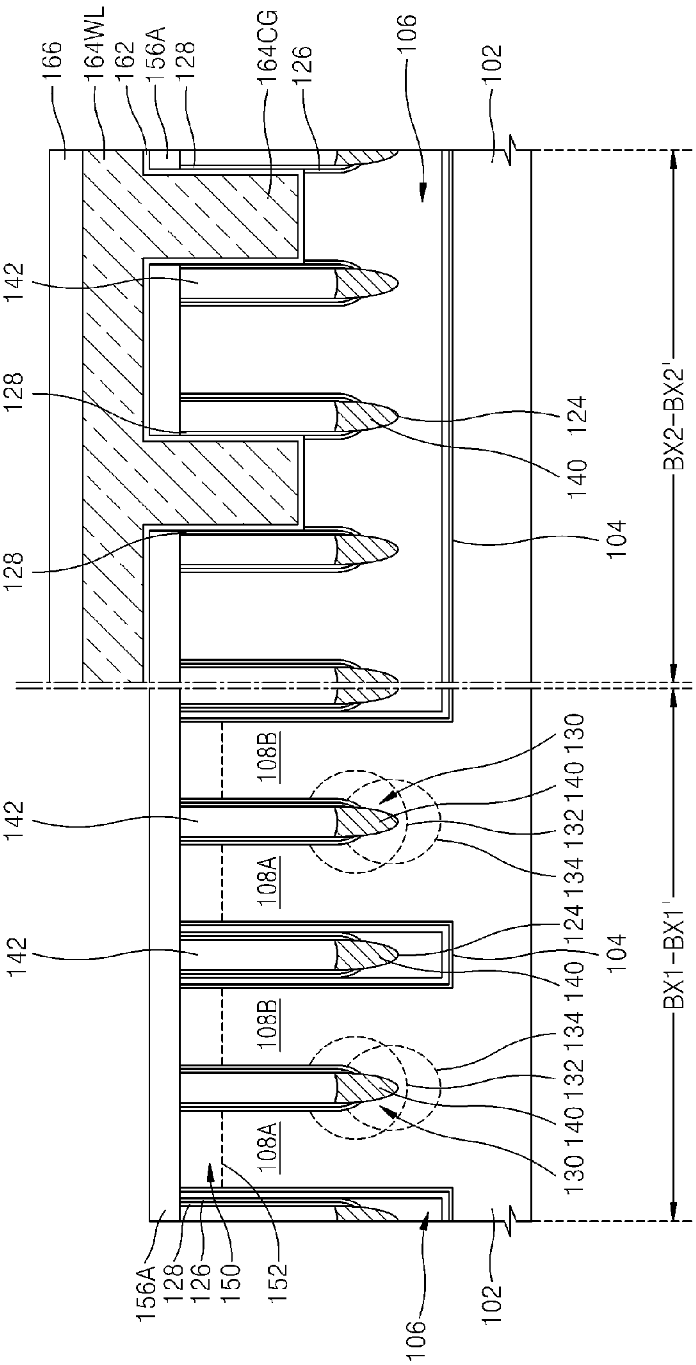
Figure 14C:
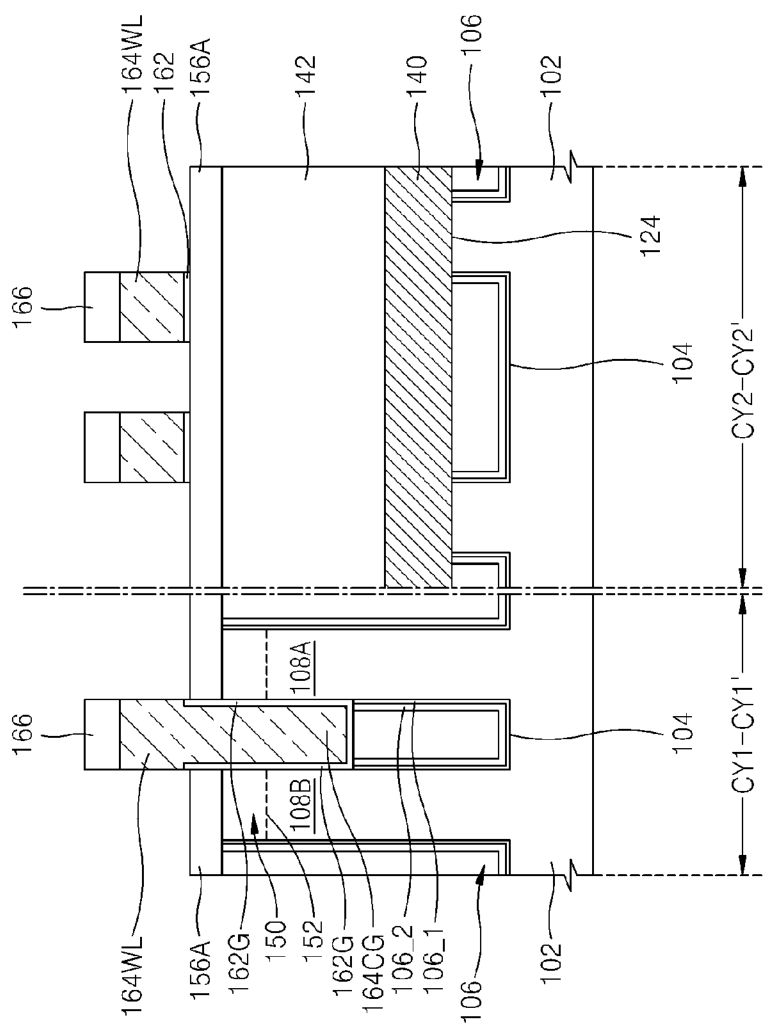

Referring to FIGS. 14A, 14B, and 14C, an anisotropic etching of the conductive layer 164 is performed by using the fourth mask pattern 166 as an etching mask to form a plurality of word lines 164WL that are arranged in parallel with each other.

The plurality of word lines 164WL extend in a direction that is perpendicular to the extension direction of the buried bit lines 140 (x direction in FIG. 13A). The plurality of word lines 164WL are respectively connected to a plurality of contact gates 164CG that are arranged in series along the extension direction of the word lines 164WL (i.e., the x direction in FIG. 13A). The plurality of contact gates 164CG extend from the insulating layer 162 formed in the contact gate recess 160 to the upper surface of the substrate 102 along vertical side surfaces of the active pillars 108A and 108B.

A distance from the upper surface of the substrate 102 to the bottom surface of the contact gate 164CG is less than a distance from the upper surface of the substrate 102 to the upper surface of the plurality of buried bit lines 140. That is, a predetermined distance is maintained between the level of the upper surface of the buried bit lines 140 and the level of the bottom surface of the contact gate 164CG.

The contact gate 164CG is located between two neighboring active areas 108 along a direction between the x and y directions of FIG. 14A, for example, along a diagonal line DL direction as shown in FIG. 14A. In an exemplary embodiment, the unit memory cell formed by one active pillar 108A included in one of the two neighboring active areas 108 and the unit memory cell formed by one active pillar 108B included in the other of the two neighboring active areas 108 share one contact gate 164CG with each other.

As shown in FIG. 14A, the contact gate 164CG includes a first side surface 164SW1 facing a side surface of the active pillar 108A included in one of the two neighboring active areas 108 along the diagonal line DL direction, and a second side surface 164SW2 facing a side surface of the active pillar 108B included in the other of the two neighboring active areas 108. The gate insulating layer 162G is disposed between the first side surface 164SW1 of the contact gate 164CG and the active pillar 108A of the active area 108 adjacent to the first side surface 164SW1. In an exemplary embodiment, the gate insulating layer 162G is disposed between the second side surface 164SW2 of the contact gate 164CG and the active pillar 108B of the active area 108 adjacent to the second side surface 164SW2.

Figure 15A:
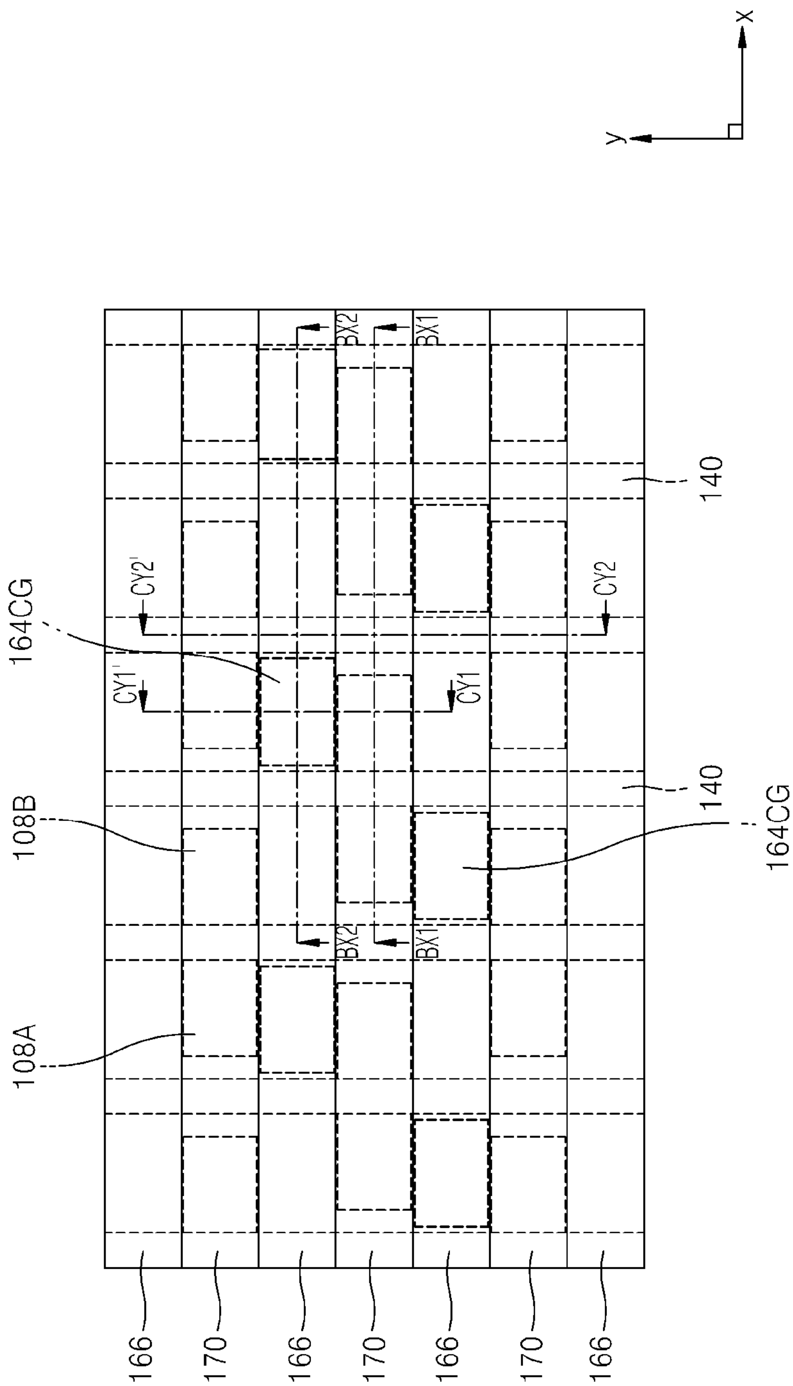
Figure 15B:
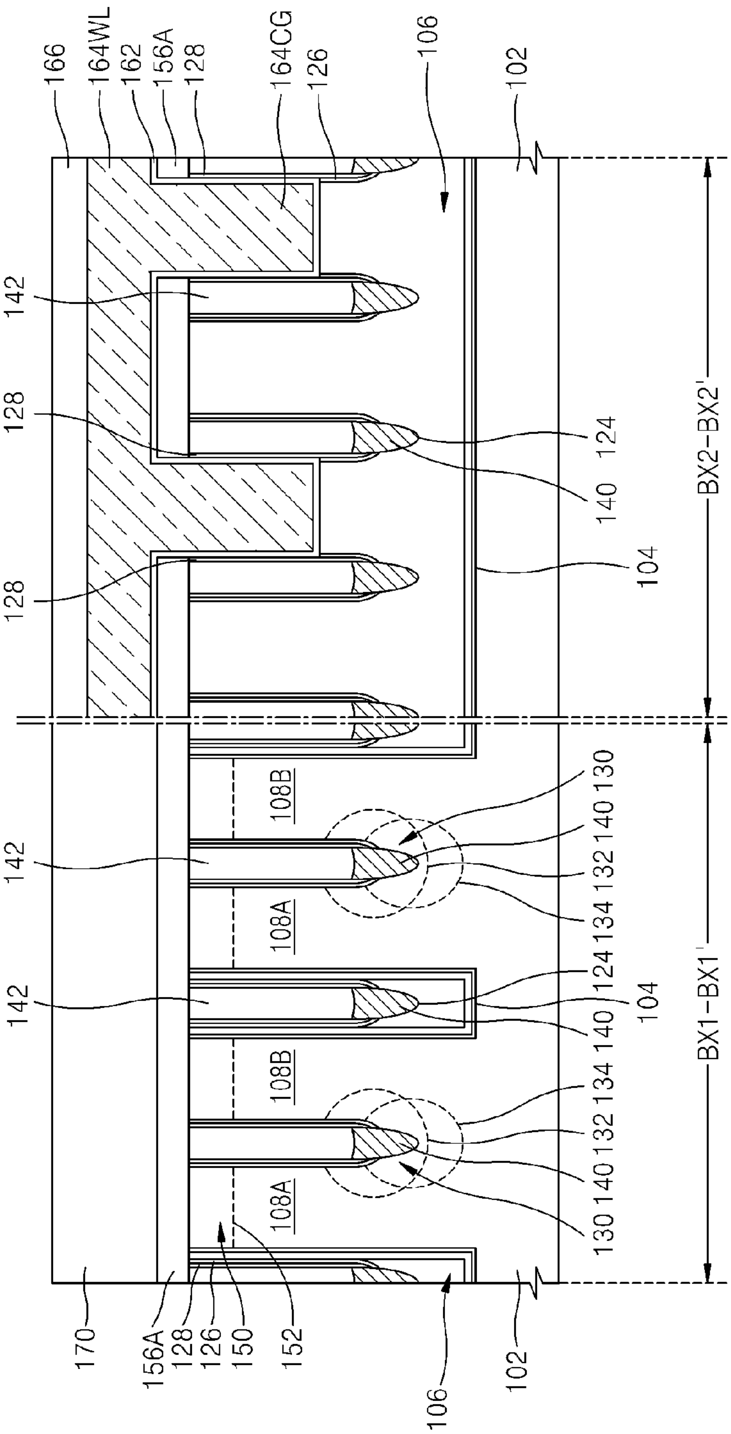
Figure 15C:
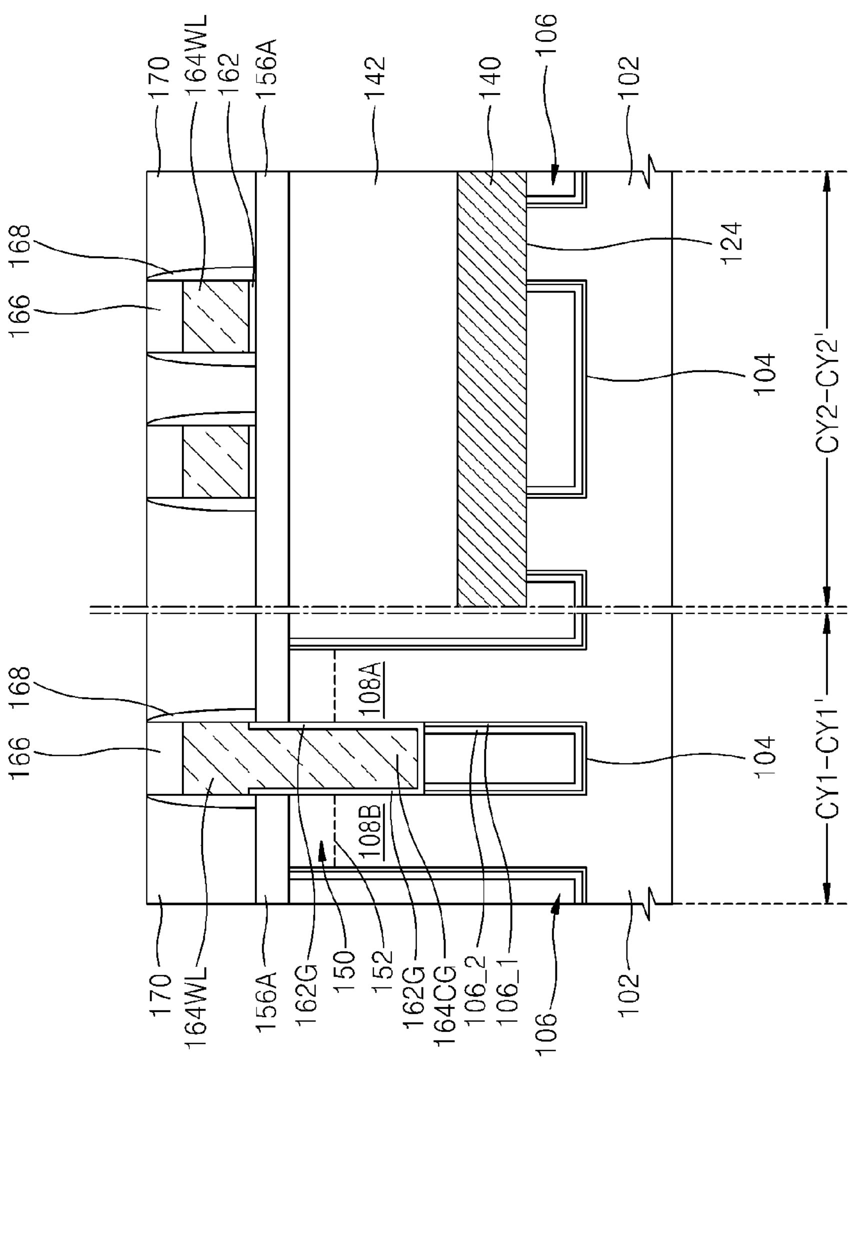

Referring to FIGS. 15A, 15B, and 15C, insulating spacers 168 are formed on both side walls of the plurality of word lines 164WL and the fourth mask pattern 166.

To form the insulating spacer 168, an insulating layer that covers the entire surface of the resultant in which the plurality of word lines 164WL and the plurality of fourth mask patterns 166 are stacked is formed. Then, the insulating layer is etched-back to leave the insulating spacers 168 on both side walls of the stacked structure. The insulating spacer 168 may comprise, for example, a silicon nitride layer.

A planarized insulating layer 170 is formed on the entire surface of the substrate 102 on which the insulating spacers 168 are formed. To form the planarized insulating layer 170, an insulating layer is formed on the substrate 102 so that spaces between the plurality of word lines 164WL may be filled completely. Then, the insulating layer may be planarized by the CMP process until the upper surface of the fourth mask pattern 166 is exposed. The planarized insulating layer 170 may comprise a silicon oxide layer.

Figure 16A:
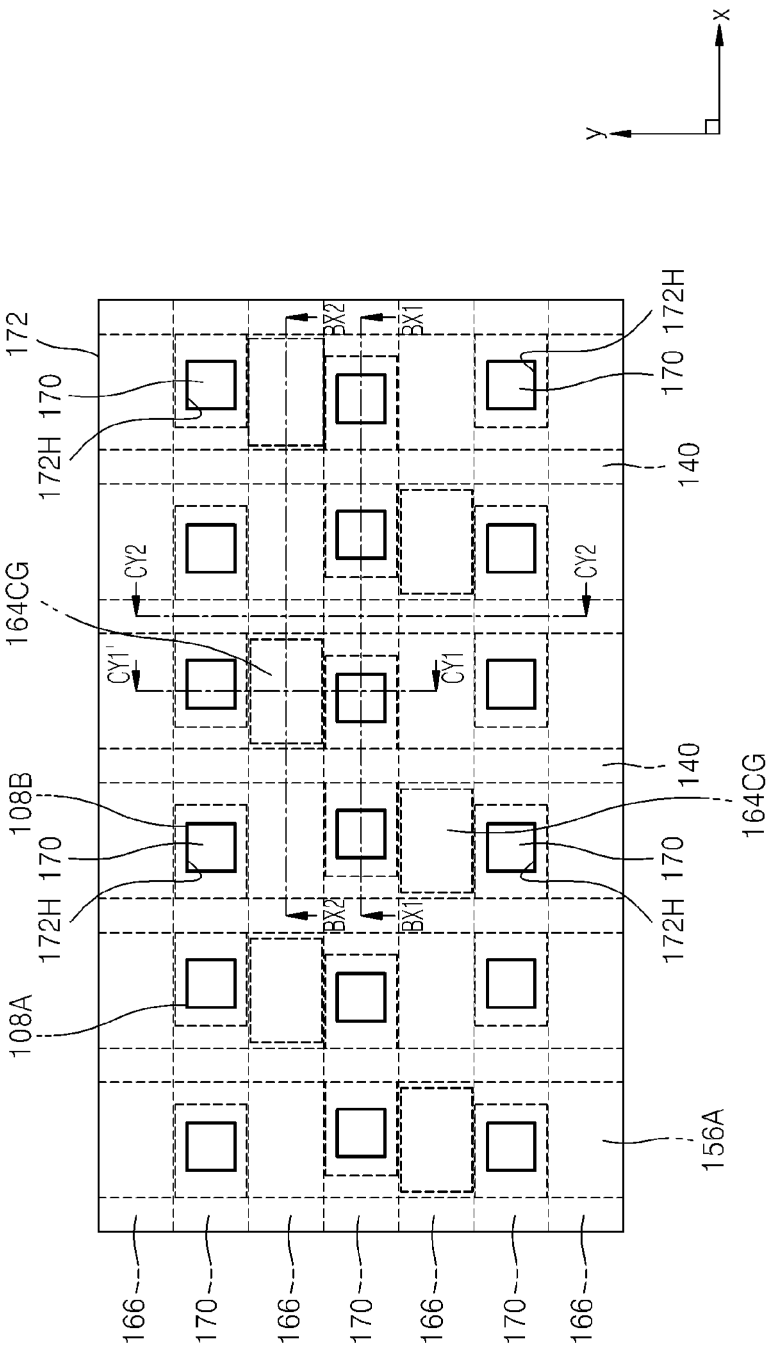
Figure 16B:
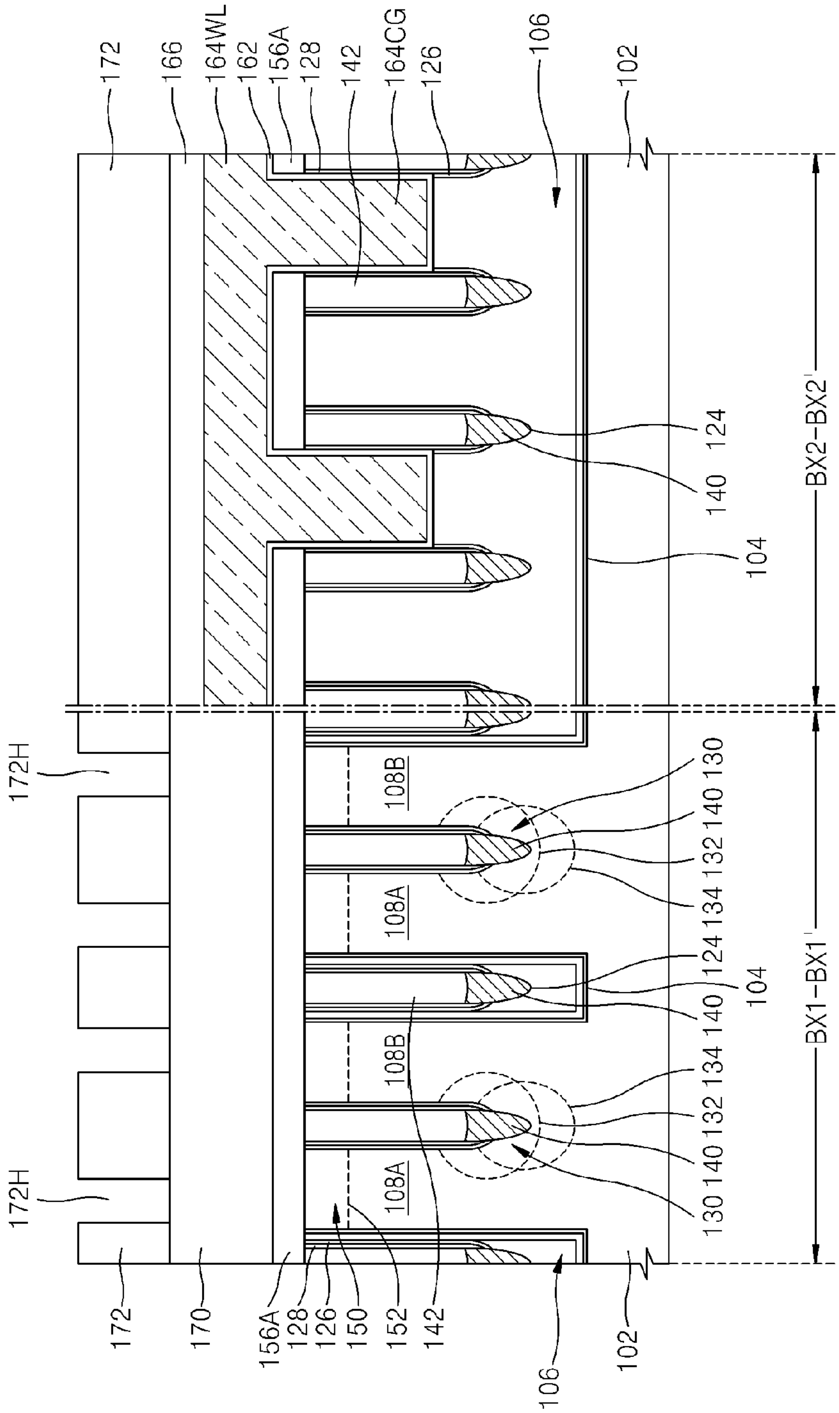
Figure 16C:
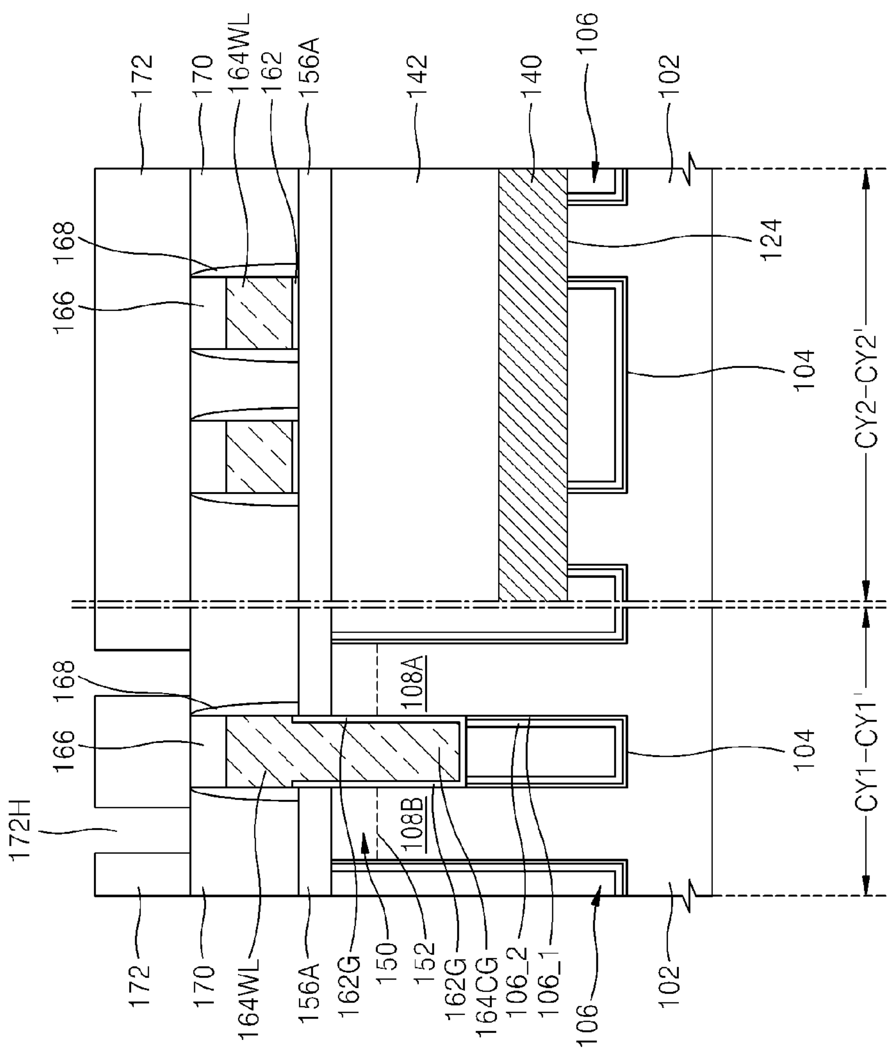

Referring to FIGS. 16A, 16B, and 16C, a fifth mask pattern 172 including a plurality of openings 172H is formed on the planarized insulating layer 170 and the fourth mask pattern 166. The openings 172H expose portions where storage node contacts are to be formed.

The fifth mask pattern 172 may comprise a material that may provide an etch selectivity with respect to the planarized insulating layer 170 and the fourth mask pattern 166. For example, the fifth mask pattern 172 may comprise a carbon-containing layer such as an ACL layer or an SOH layer.

Figure 17A:
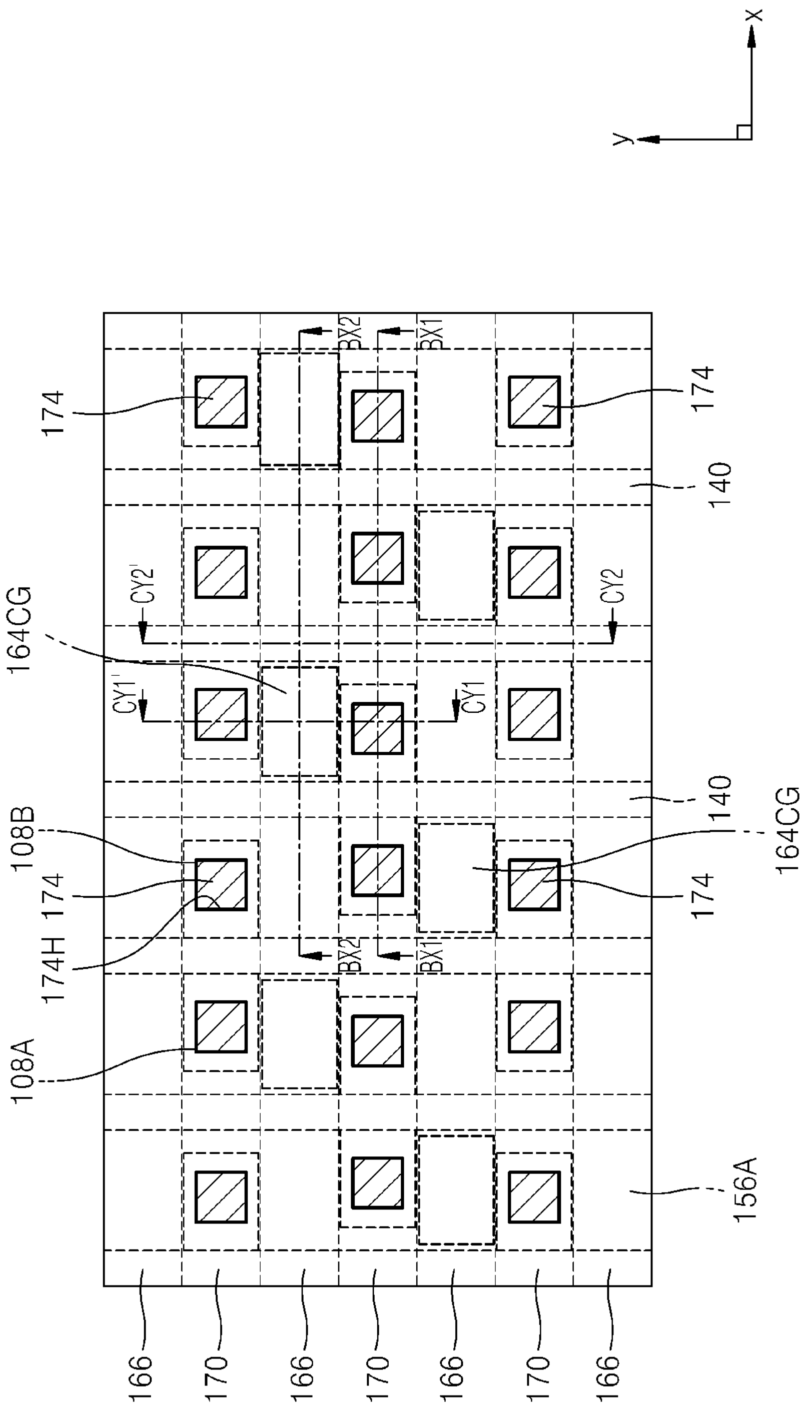
Figure 17B:
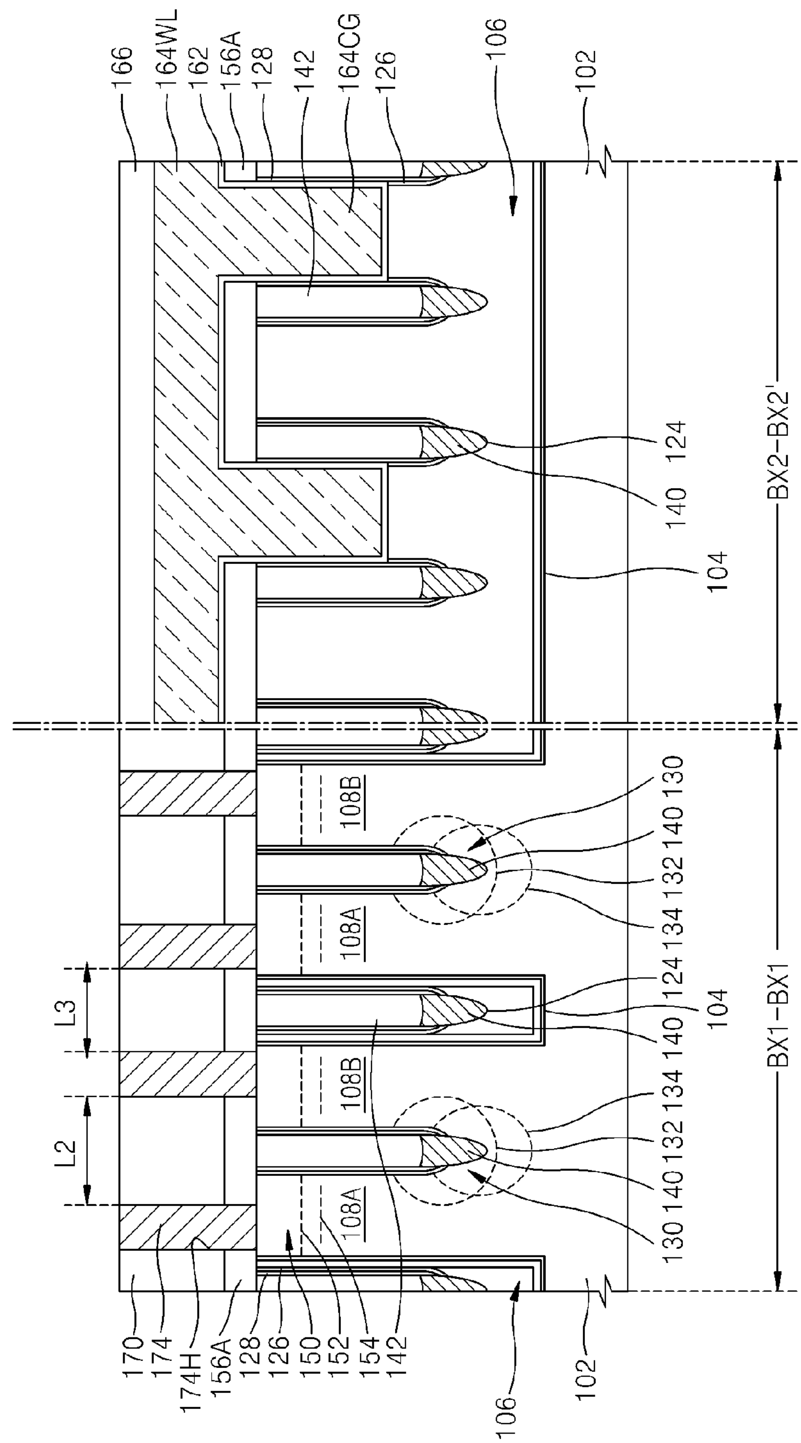
Figure 17C:
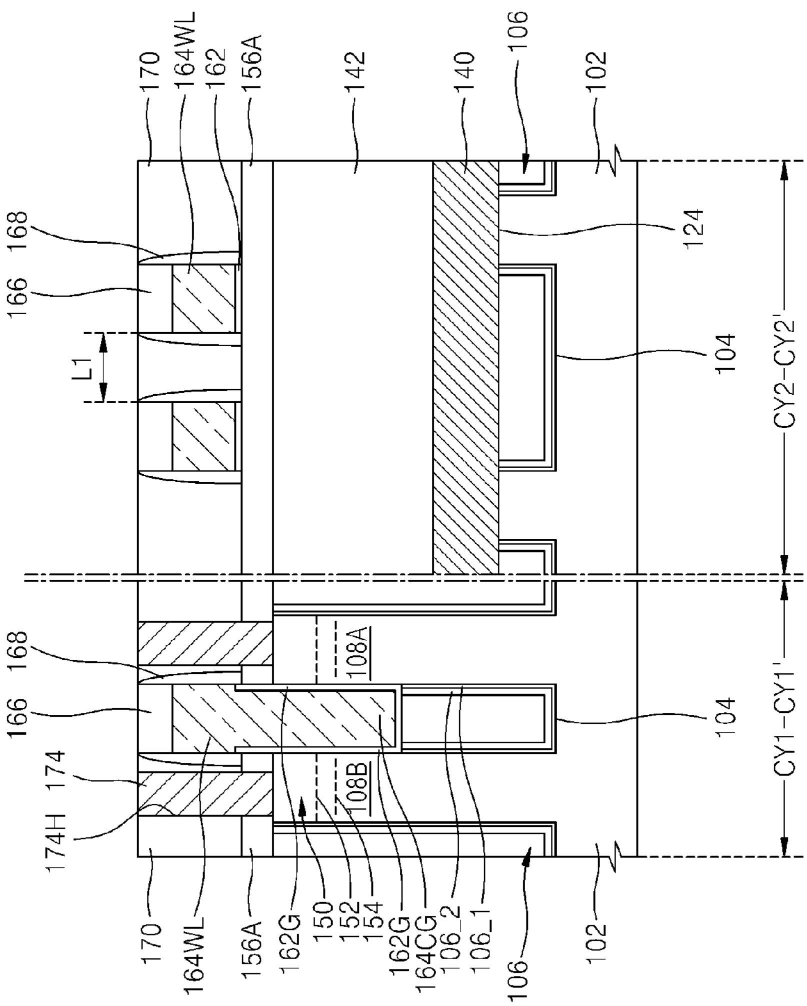

Referring to FIGS. 17A, 17B, and 17C, the planarized insulating layer 170 and the fourth mask pattern 166 which are exposed through the openings 172H of the fifth mask pattern 172 are etched by using the fifth mask pattern 172 as an etching mask. Then, the exposed oxide layer pattern 156A is etched to form a plurality of buried contact holes 174H that expose the second source/drain regions 150 of the active areas 108. In an exemplary embodiment, the plurality of buried contact holes 174H are formed as a plurality of islands. In an exemplary embodiment, the buried contact holes may be formed as a plurality of lines.

Then, the fifth mask pattern 172 remaining on the substrate 102 is removed, a conductive layer that completely fills the plurality of buried contact holes 174H is formed. Then, the conductive layer is planarized until the upper surface of the planarized insulating layer 170 is exposed to form a plurality of buried contact plugs 174 in the buried contact holes 174H.

The conductive layer for forming the plurality of buried contact plugs 174 may be doped polysilicon. In an exemplary embodiment, when the doped polysilicon is deposited in the plurality of buried contact holes 174H to form the plurality of buried contact plugs 174, the dopant included in the doped polysilicon is dispersed in the active areas 108 that are exposed through the buried contact holes 174H. Thus, ion implantation of a high concentration dopant 154 for forming the second source/drain regions 150 may be performed on the upper surfaces of the active areas 108.

In an exemplary embodiment, the conductive layer for forming the plurality of buried contact plugs 174 may comprise metal or metal nitride. In an exemplary embodiment, before forming the conductive layer in the plurality of buried contact holes 174H, a process for ion implantation of the high concentration dopant 154 may be performed on the portions, where the second source/drain regions 150 are formed, via the plurality of buried contact holes 174H. The high concentration dopant 154 may be the same conductive type as the dopants 132 and 134 that are ion-implanted into the first source/drain region 130. For example, the high concentration dopant 154 may be N-type impurity ions.

A semiconductor device according to an exemplary embodiment, when a memory cell array having a unit memory cell size of $4F^2$ is formed, the buried bit lines 140 are formed in the substrate 102. Therefore, as shown in the cross-section taken along line BX1-BX1' of FIG. 17B, insulating distances L2 and L3 may be ensured between the two neighboring buried contact plugs 174 in the extension direction of the word lines 164WL (x direction of FIG. 17A). In an exemplary embodiment, as shown in the cross-section taken along line CY2-CY2' of FIG. 17C, a space between the two neighboring word lines 164WL, which is located on the same vertical line as the buried bit line 140 in the extension direction of the buried bit line 140 (y direction of FIG. 17A), is filled with an insulating material, and thus, an insulating distance L1 may be ensured.

Figure 18A:
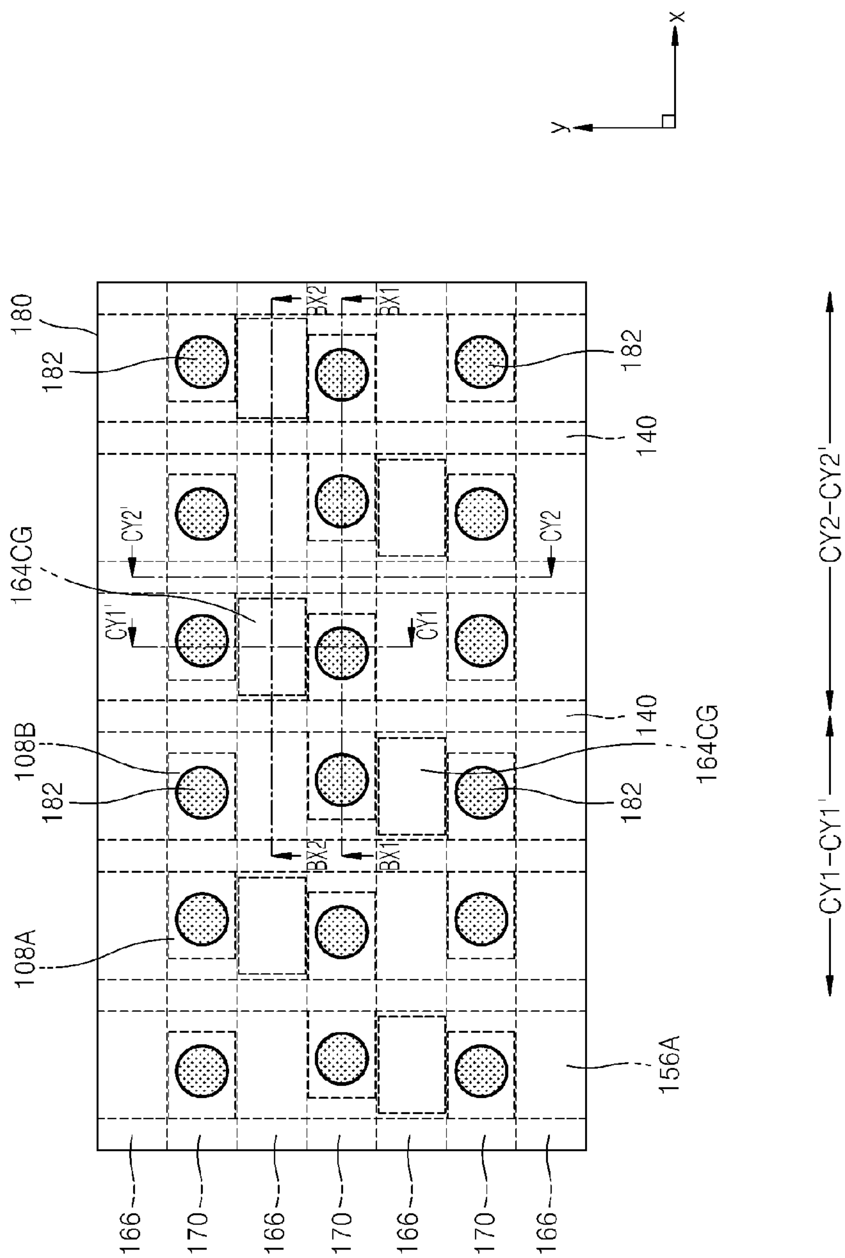
Figure 18B:
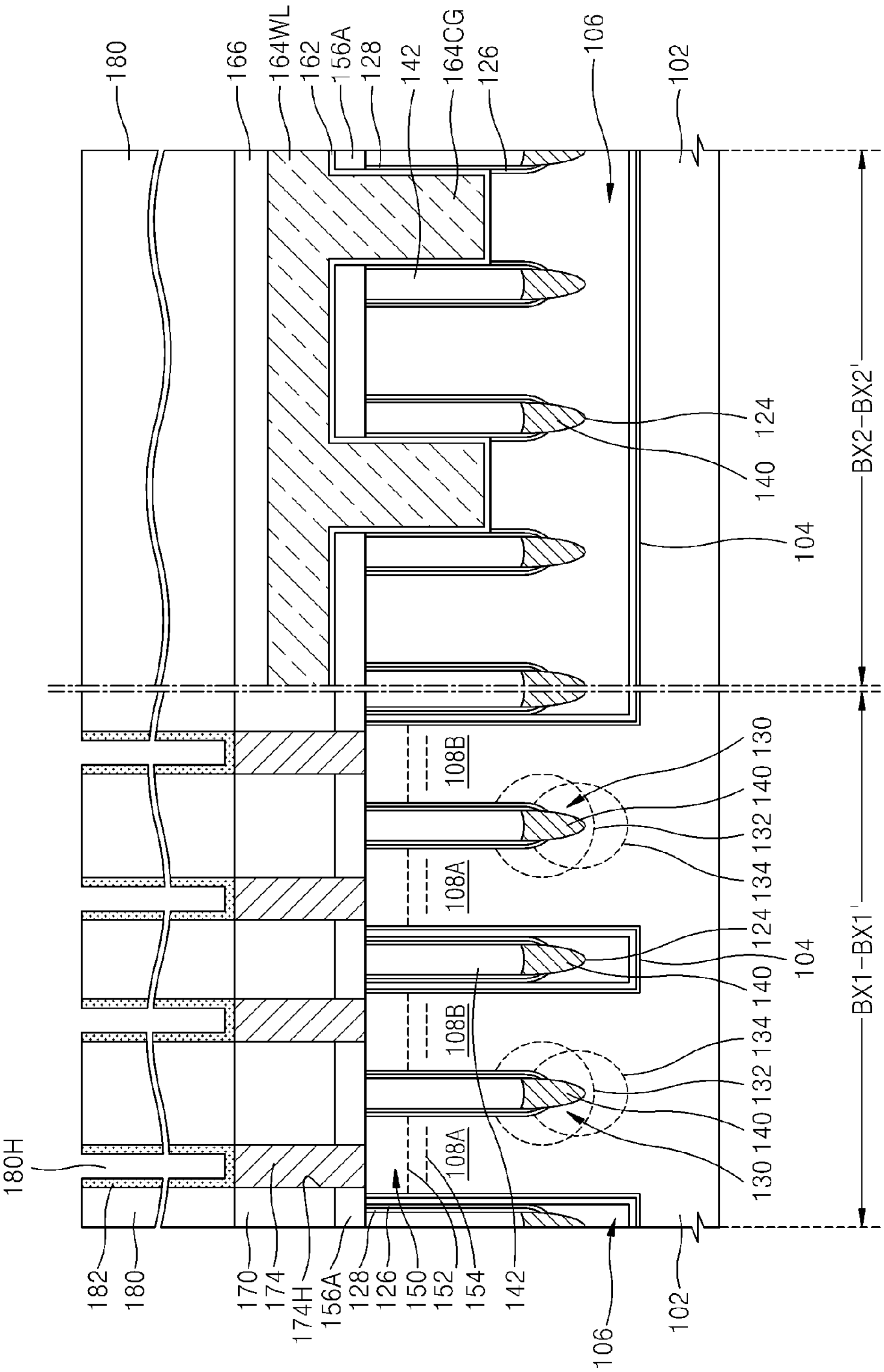
Figure 18C:
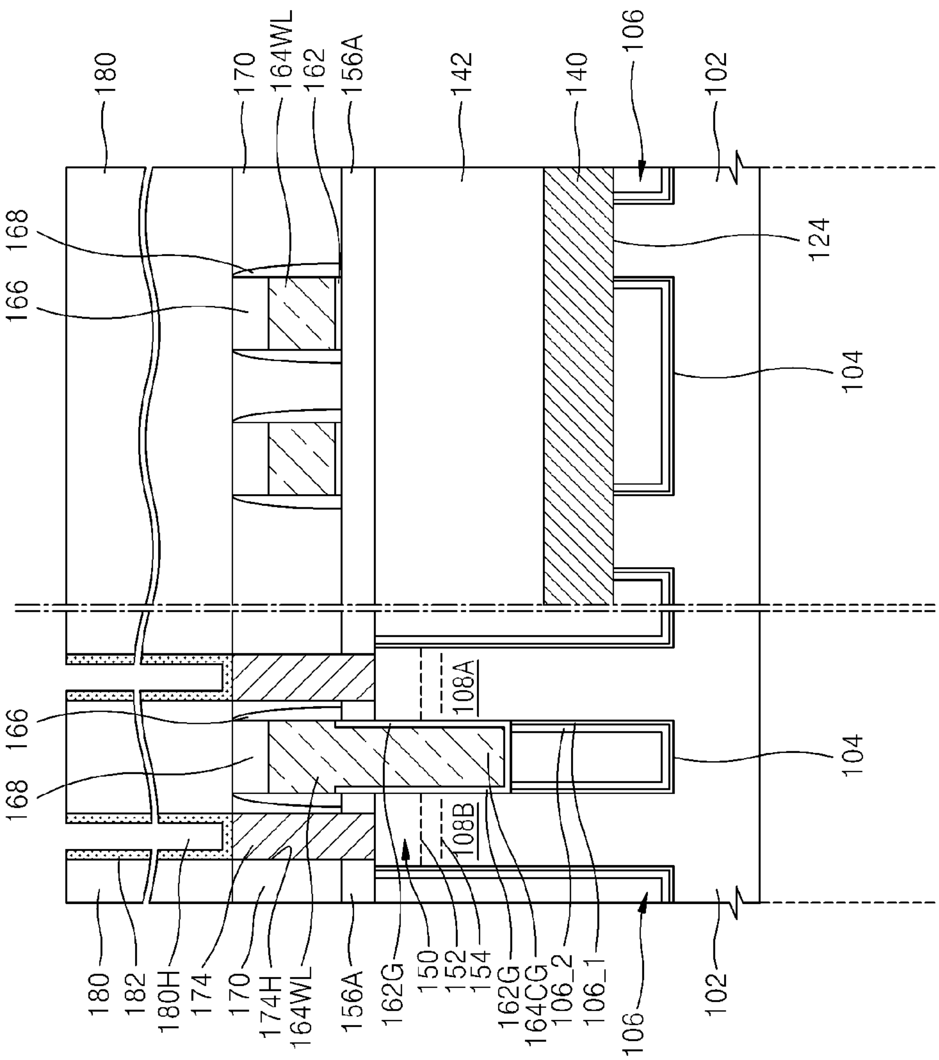

Referring to FIGS. 18A, 18B, and 18C, a plurality of lower electrodes 182 of capacitors, which are respectively electrically connected to the plurality of buried contact plugs 174, are formed on the buried contact plugs 174.

To form the plurality of lower electrodes 182 of capacitors, a sacrificial insulating layer pattern 180 having a plurality of storage node holes 180H that expose the buried contact plugs 174 is formed on the plurality of buried contact plugs 174, the planarized insulating layer 170, and the fourth mask pattern 166. The plurality of lower electrodes 182 which respectively contact the plurality of buried contact plugs 174 are formed in the plurality of storage node holes 180H.

Then, the sacrificial insulating layer pattern 180 is removed, and a dielectric layer and an upper electrode are formed on each of the lower electrodes 182 to form a plurality of capacitors.

In a semiconductor device described with reference to FIGS. 3A, 3B, and 3C through 18A, 18B, and 18C, the first trench 104 is formed on the substrate 102 and the isolation layer 106 is formed in the first trench 104 to define a plurality of active areas 108 formed as islands. The second trenches 124 having the width W2 that is less than the width of the isolation layer 106 are formed in the plurality of active areas 108 and the isolation layer 106. The width of the isolation layer 106 and the width of the second trench 124 for forming the buried bit lines may be variously selected according to embodiments of the present inventive concept.

According to an embodiment of the present invention, the plurality of buried bit lines 140 are formed in the substrate 102 to form the memory cell array having a unit memory cell size of $4F^2$. Thus, the vertical channel region is not adversely affected by a high bias voltage that is applied to the buried bit lines 140 in the semiconductor device having the vertical channel transistor. The insulating distances L2 and L3 can be ensured between the two neighboring buried contact plugs 174. The space between the two neighboring word lines 164WL, which is located on the same vertical line as the buried bit line 140, is filled with the insulating material., Thus, the insulating distance L1 can be ensured (refer to FIG. 17C). Therefore, a probability of generating a short-circuit and leakage current may be minimized even with a very fine unit memory cell size, and thus, reliability of the semiconductor device may be maintained.

FIGS. 19A and 19B through 25A and 25B show a process of fabricating a semiconductor device, according to an embodiment of the present inventive concept. FIGS. 19A, 20A, 21A, 22A, 23A, 24A and 25A are plan views of a region corresponding to a rectangular portion denoted by "P" in the layout of FIG. 1. FIGS. 19B, 20B, 21B, 22B, 23B, 24B and 25B are cross-sectional views taken along the line BX-BX' in FIG. 19A.

Referring to FIGS. 19A and 19B through 25A and 25B, a process of forming two-stage isolation layer is performed. That is, a process of forming the isolation layer is performed before and after forming first bit line trenches 212 (e.g., FIGS. 20A and 20B) for forming buried bit lines 250 (e.g., FIGS. 25A and 25B).

Figure 19A:
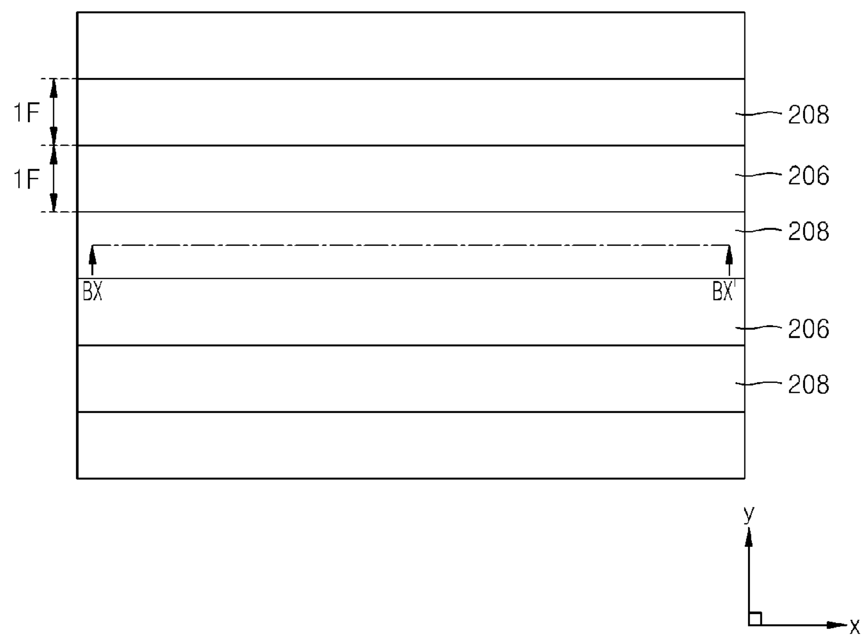
FIGS. 19A, 20A, 21A, 22A, 23A, 24A and 25A are plan views of a region corresponding to a rectangular portion denoted by "P" in the layout of FIG. 1 according to an embodiment of the inventive concept.
Figure 19B:
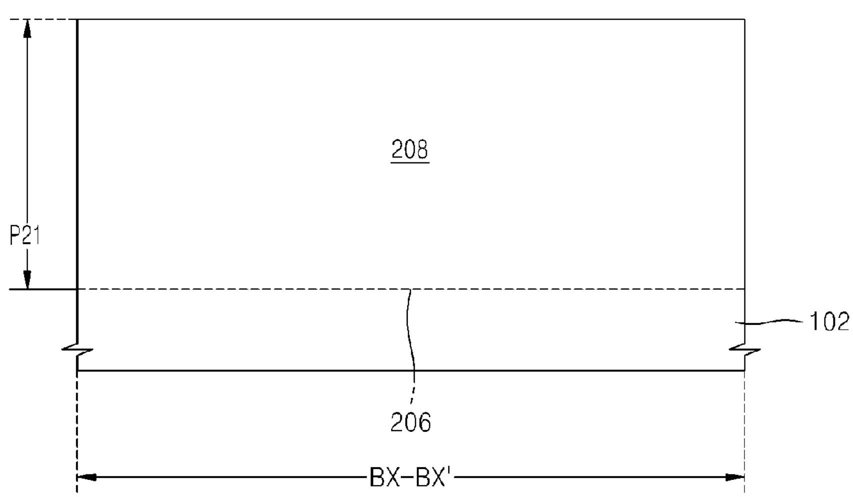
FIGS. 19B, 20B, 21B, 22B, 23B, 24B and 25B are cross-sectional views taken along the line BX-BX' according to an embodiment of the inventive concept.

Referring to FIGS. 19A and 19B, a first isolation layer 206 is formed as a plurality of lines that extend in parallel with each other in a first direction (i.e., x direction of FIG. 19A). The first isolation layer 206 is formed on the substrate 102 to form a plurality of first active areas 208. The first active areas 208 are formed as a plurality of lines extending in parallel with each other on the substrate 102.

Similar to the isolation layer 106, the first isolation layer 206 may comprise a side wall oxide layer 106_1, a nitride liner 106_2, and a gap fill oxide layer 106_3 which are stacked.

In FIG. 19B, a bottom surface of the first isolation layer 206, which is not shown in the cross-section taken along line BX-BX' of FIG. 19B, is denoted as a dotted line. The bottom surface of the first isolation layer 206 is located at a first depth P21 from the upper surface of the substrate 102.

Figure 20A:
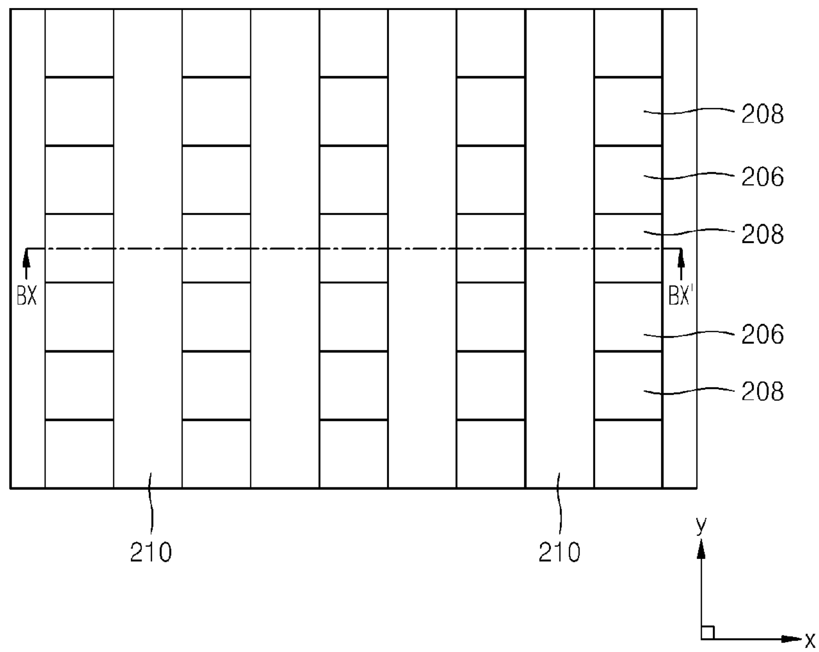
Figure 20B:
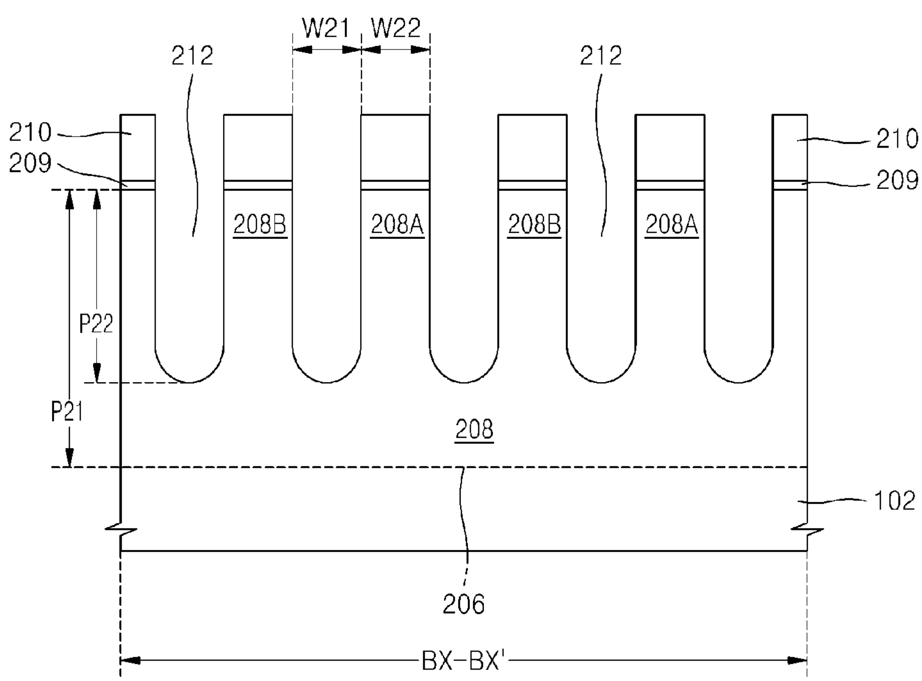

Referring to FIGS. 20A and 20B, a plurality of pad oxide layer patterns 209 and a plurality of first mask patterns 210 are formed as plurality of lines extending in a second direction that is perpendicular to the first direction (i.e., y direction in FIG. 19A). The exposed first isolation layer 206 and the first active areas 208 are etched to a predetermined depth by using the first mask patterns 210 as an etching mask. Thus, a plurality of first bit line trenches 212 that provide spaces for forming the buried bit lines 250 on the first isolation layer 206 and the first active areas 208 are formed. The first mask patterns 210 may comprise silicon nitride layers. When the plurality of first bit line trenches 212 are formed, each of the first active areas 208 is divided into a plurality of active pillars 208A and 208B.

The plurality of bit line trenches 212 can be formed on the substrate 102 at a substantially equal interval along the extension direction of the first active areas 208. A width W21 of each of the first bit line trenches 212 may be greater than a width W22 of each of the active pillars 208A and 208B in the extension direction of the first active areas 208. The first bit line trenches 212 may have a second depth P22 that is less than the first depth P21 from the upper surface of the substrate 102.

Figure 21A:
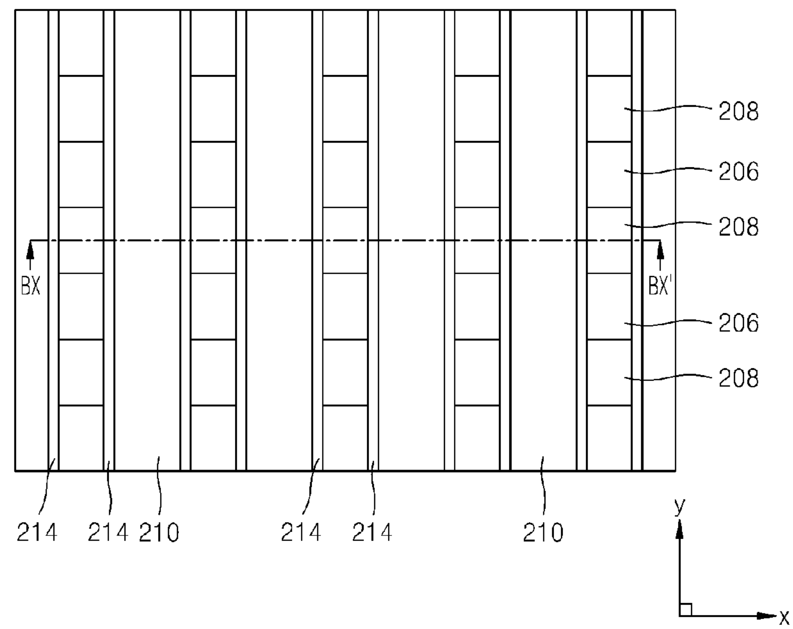
Figure 21B:
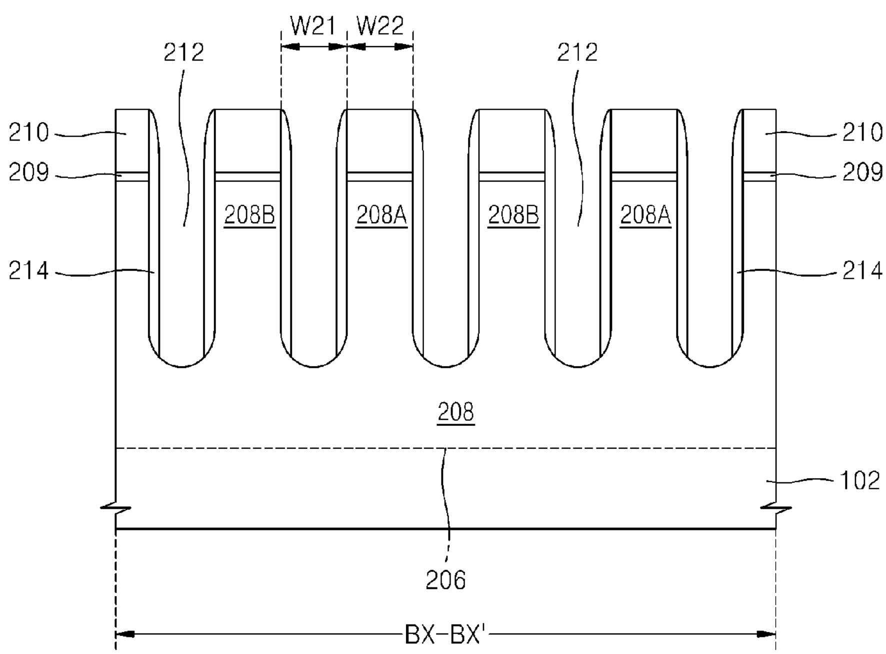

Referring to FIGS. 21A and 21B, insulating spacers 214 are formed on inner side walls of the plurality of first bit line trenches 212.

To form the insulating spacers 214, an insulating layer covers the upper surface of the substrate 102 on which the plurality of first bit line trenches 212 are formed. Then, the insulating layer is etched-back to leave the insulating spacers 214 only on the inner side walls of the first bit line trenches 212 and side walls of the first mask patterns 210. The insulating spacer 214 may comprise a same material as the first mask pattern 210. For example, the insulating spacers 214 may comprise a silicon nitride layer.

Figure 22A:
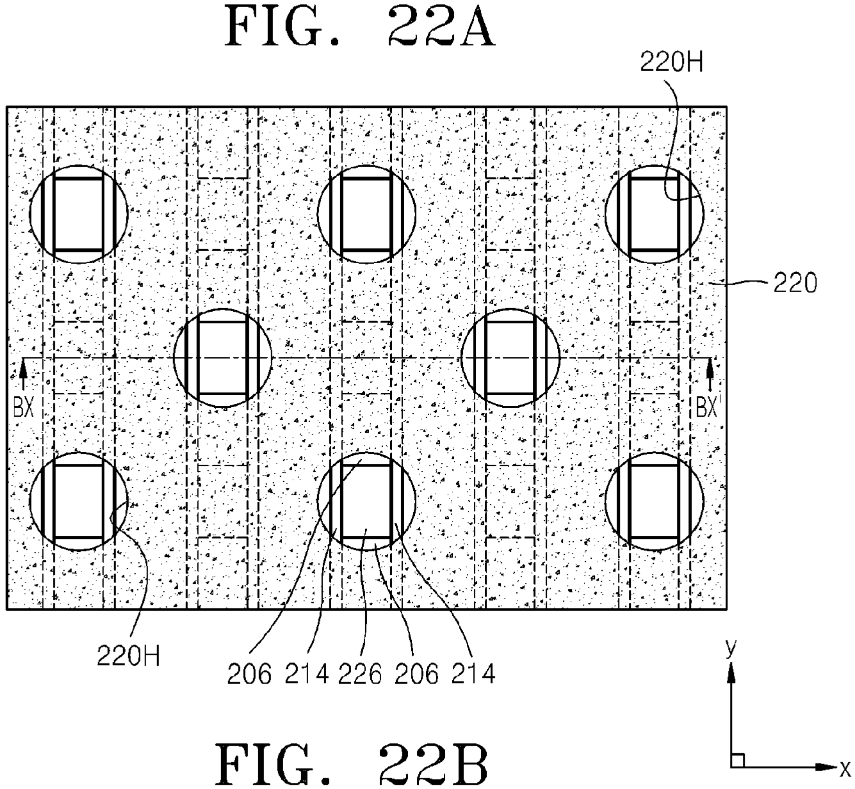
Figure 22B:
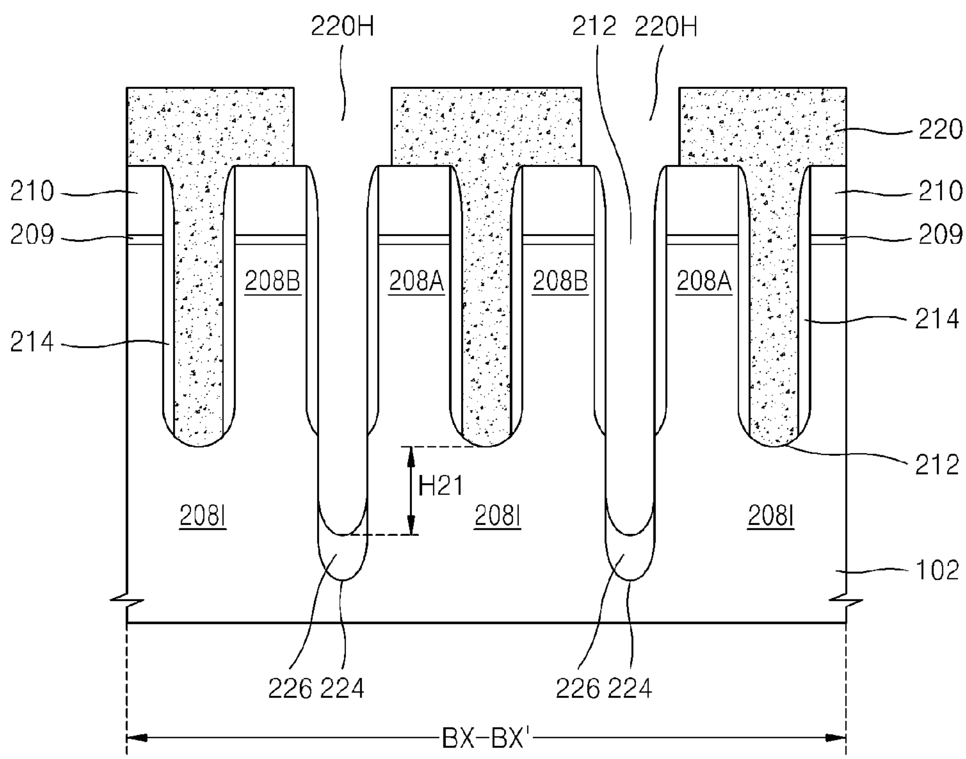

Referring to FIGS. 22A and 22B, a second mask layer fills the inside of the first bit line trenches 212 and covers the first mask patterns 210 and the insulating spacers 214. Then, the second mask layer is patterned to form a second mask pattern 220 having a plurality of openings 220H that expose the first active areas 208 on bottom surfaces of the first bit lines trenches 212 that are alternately selected from a series of first bit line trenches 212 arranged in the extension direction of the first active areas 208. The second mask pattern 220 may comprise a carbon based layer such as, for example, an SOH layer.

Then, the substrate 102 on the bottom surfaces of the first bit line trenches 212 exposed through the plurality of openings 220H is etched by using the second mask pattern 220, the insulating spacers 214, and the first isolation layer 206 as etching mask to form isolation trenches 224. A second isolation layer 226 is formed on bottom surfaces of the isolation trenches 224. The second isolation layer 226 may comprise a side wall oxide layer, a nitride liner, and a gap fill oxide layer stacked.

An upper surface of the second isolation layer 226 formed in the isolation trench 224 in the substrate 102 is located at a lower level than that of the bottom surface of the first bit line trench 212. Therefore, there is a level difference of a predetermined height H21 between the second isolation layer 226 and the bottom surface of the first bit line trench 212.

When the isolation trenches 224 are formed, the first active areas 208 are trimmed and divided into a plurality of second active areas 208I, each of which includes two active pillars 208A and 208B.

Figure 23A:
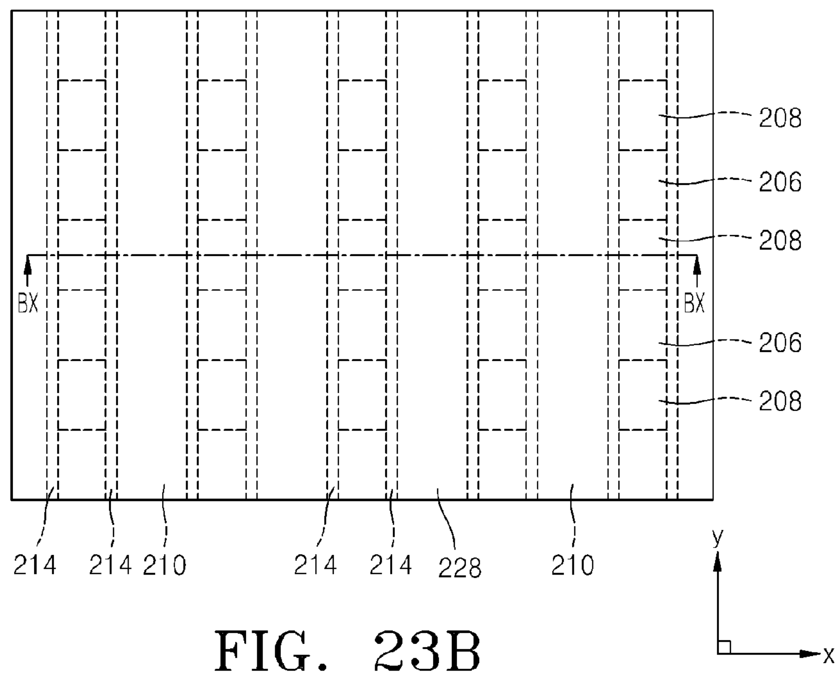
Figure 23B:
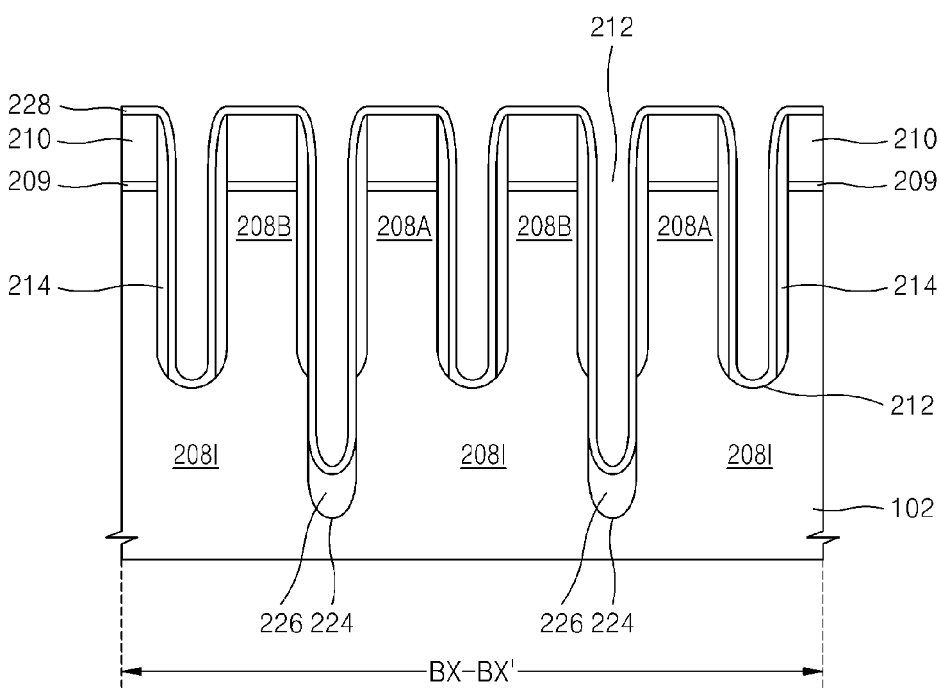

Referring to FIGS. 23A and 23B, the second mask pattern 220 is removed. Then, a nitride liner 228 is formed on the upper surfaces of the first mask patterns 210 and surfaces of the parts in the first bit line trenches 212 and the isolation trenches 224.

Figure 24A:
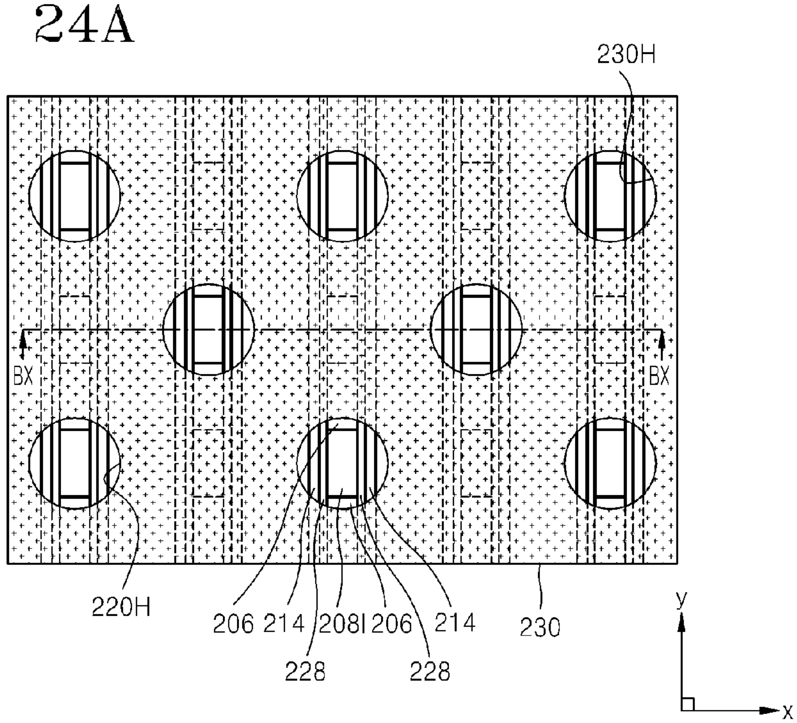
Figure 24B:
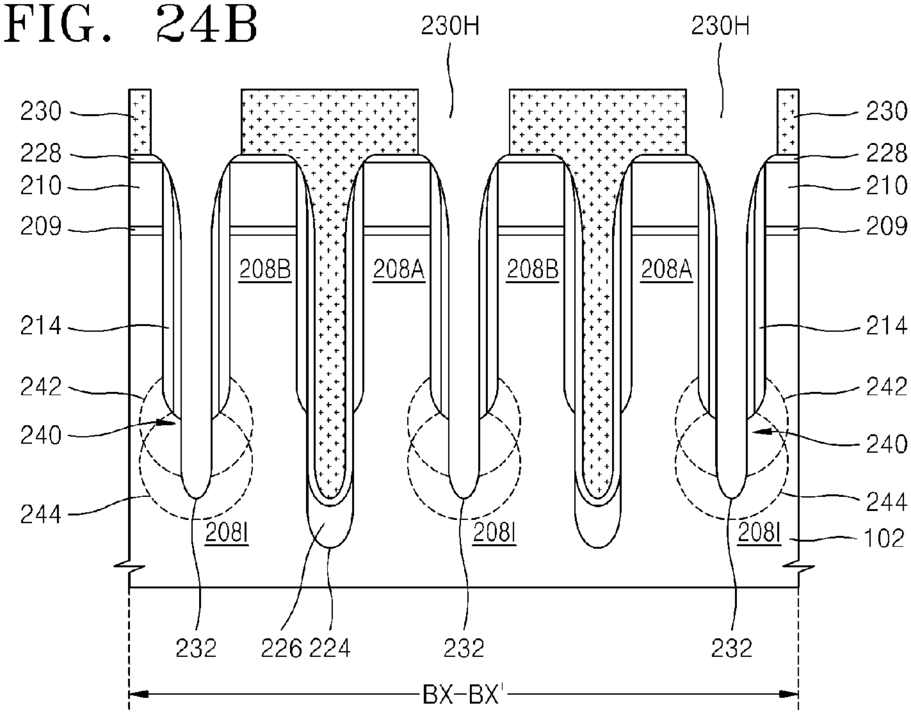

Referring to FIGS. 24A and 24B, a third mask layer fills the inside of the isolation trenches 224 and the first bit line trenches 212 connected to the isolation trenches 224 while covering the first mask patterns 210 and the insulating spacers 214. The third mask layer is patterned to form a third mask pattern 230 having a plurality of openings 230H that expose some portions of the first bit line trenches 212, which pass through the second active areas 208I.

The third mask pattern 230 may comprise a carbon base layer such as, for example, an SOH layer.

The nitride liner 228 that covers the bottom surfaces of the first bit line trenches 212, which are exposed through the plurality of openings 230H, is removed by using the third mask pattern 230 as an etching mask. The second active areas 208I of the substrate 102 are exposed on the bottom surfaces of the first bit line trenches 212. Here, some parts of the nitride liner 228, which is exposed on inlet portions of the first bit line trenches 212, may be partially consumed.

Ion implantation of a low concentration dopant 242 into the second active areas 208I around the bottom surfaces of the first bit line trenches 212 is performed through the plurality of openings 230H formed in the third mask pattern 230 to form first source/drain regions 240 around the bottom surfaces of the first bit line trenches 212. For example, the low concentration dopant 242 may be N-type impurity ions.

The substrate 102 exposed through the bottom surfaces of the first bit line trenches 212 is etched to form second bit line trenches 232 which are connected to the first bit line trenches 212.

In an embodiment, ion implantation of a high concentration dopant 244 into the second active areas 208I around bottom surfaces of the second bit line trenches 232 is performed through the plurality of openings 230H formed in the third mask pattern 230 to form the first source/drain regions 240 around the bottom surfaces of the second bit line trenches 232. The high concentration dopant 244 may include impurity ions of a same conductive type as that of the low concentration dopant 242 such as, for example, N-type impurity ions. Thus, the first source/drain regions 240 may be formed around the bottom surfaces of the second bit line trenches 232 that are connected to the first bit line trenches 212 in the second active areas 208I.

Figure 25A:
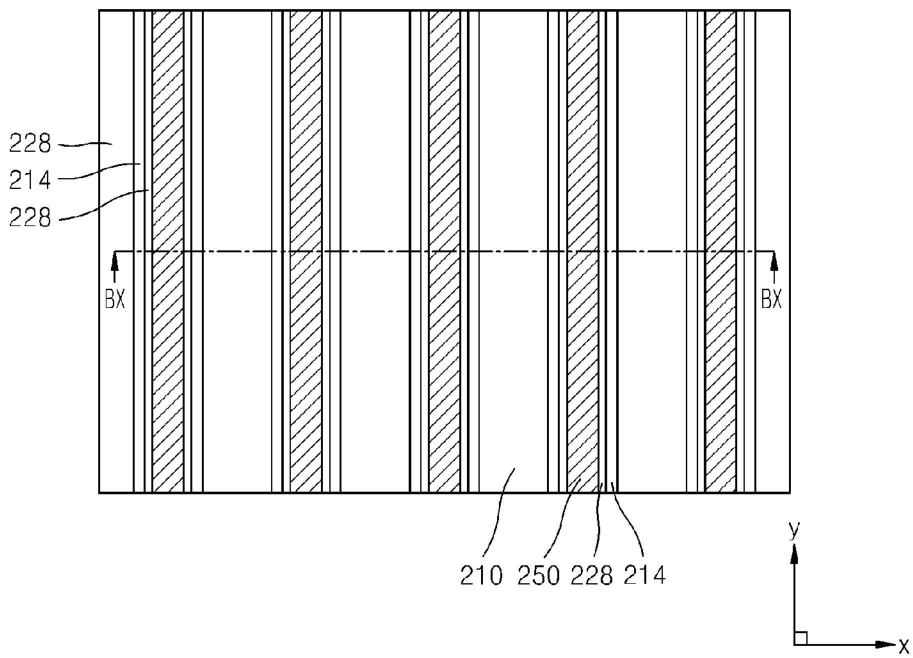
Figure 25B:
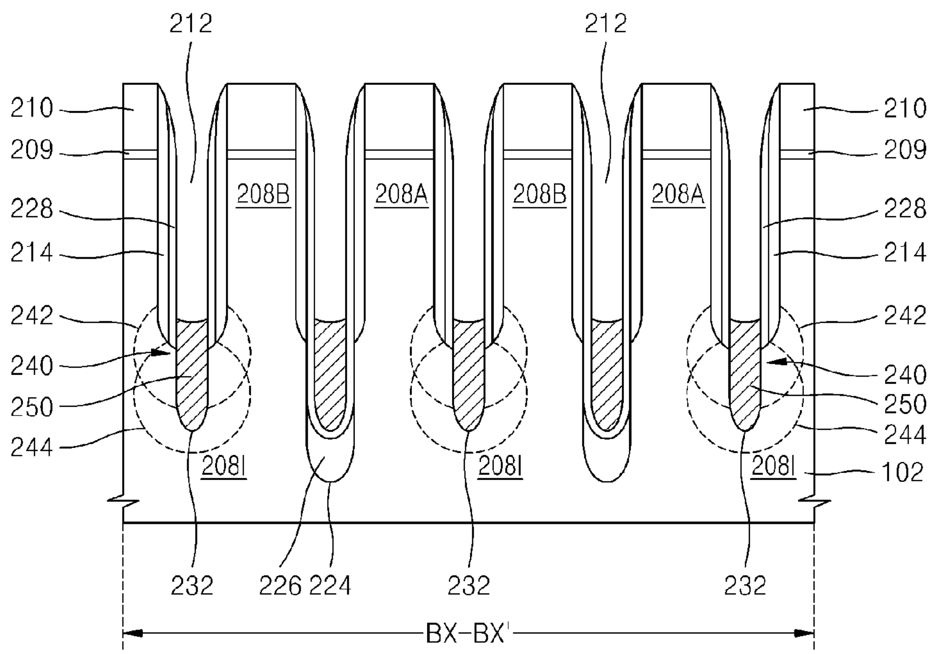

Referring to FIGS. 25A and 25B, the third mask pattern 230 is removed. A conductive material is deposited on the resultant in which the first source/drain regions 240 are formed in the substrate 102 to form a conductive layer. The conductive layer fills inner portions of the first bit line trenches 212, the second bit line trenches 232 that are connected to the first bit line trenches 212, and the isolation trenches 224 that are connected to the first bit line trenches 212. Then, upper portions of the conductive layer are removed by an etch-back process so that a plurality of buried bit lines 250 are formed by the remaining lower portions of the conductive layer.

During the etch-back process for the upper portions of the conductive layer, the nitride liner 228 covering the upper surfaces of the first mask patterns 210 may be etched, and the upper surfaces of the first mask patterns 210 may be exposed.

The plurality of buried bit lines 250 are formed to fill the second bit line trenches 232 that are connected to the first bit line trenches 212 from the bottom surfaces of the first bit line trenches 212 in the second active areas 208I. The buried bit lines 250 are formed to fill the isolation trenches 224 that are connected to the first bit line trenches 212 from the bottom surfaces of the first bit line trenches 212. The buried bit lines 250 can be formed on the second isolation layer 226.

Detailed structures of the buried bit lines 250 can be substantially same as those of the buried bit lines 140 that are described with reference to FIGS. 8A, 8B, and 8C.

A subsequent process can be substantially similar to the process shown in connection with FIGS. 9A, 9B, and C through 18A, 18B, and 18C.

In an embodiment, the bottom surfaces of the buried bit lines 250 located on the active areas 208 and located on the isolation layer 206 may be located at the same level or at different levels from each other according to the height of the second isolation layer 226 formed in the isolation trenches 224.

According an embodiment, even when a misalignment occurs during a process of forming the plurality of first bit line trenches 212, forming the plurality of isolation trenches 224, and forming the plurality of second bit line trenches 232, widths of the active pillars 208A and 208B in the plurality of second active areas 208I may be formed constantly. Therefore, variations in electric characteristics between the plurality of unit memory cells realized on the substrate 102 may be minimized.

Figure 26:
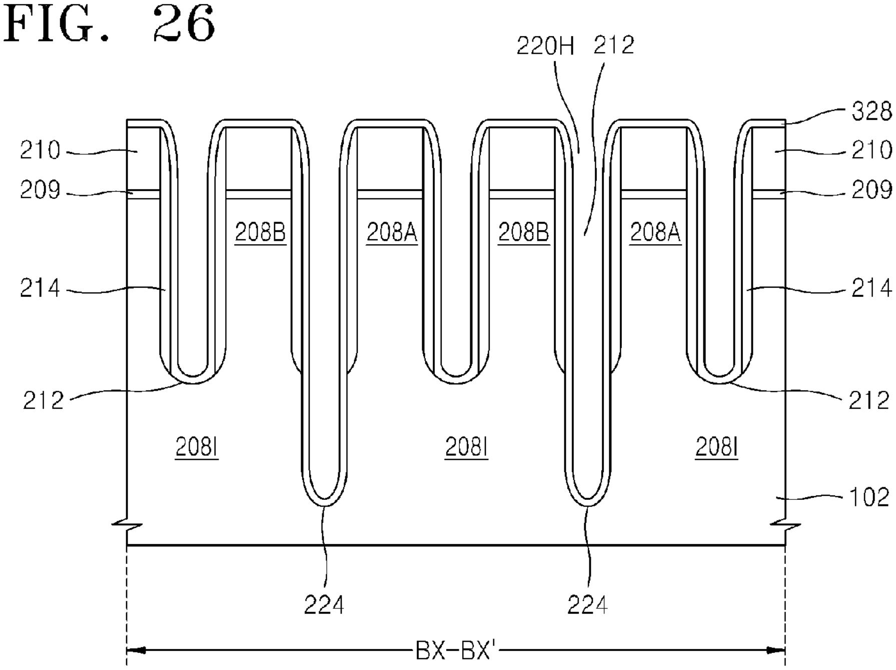
FIGS. 26 through 28 are cross-sectional views illustrating a method of fabricating a semiconductor device, according to an embodiment of the inventive concept.
Figure 27:
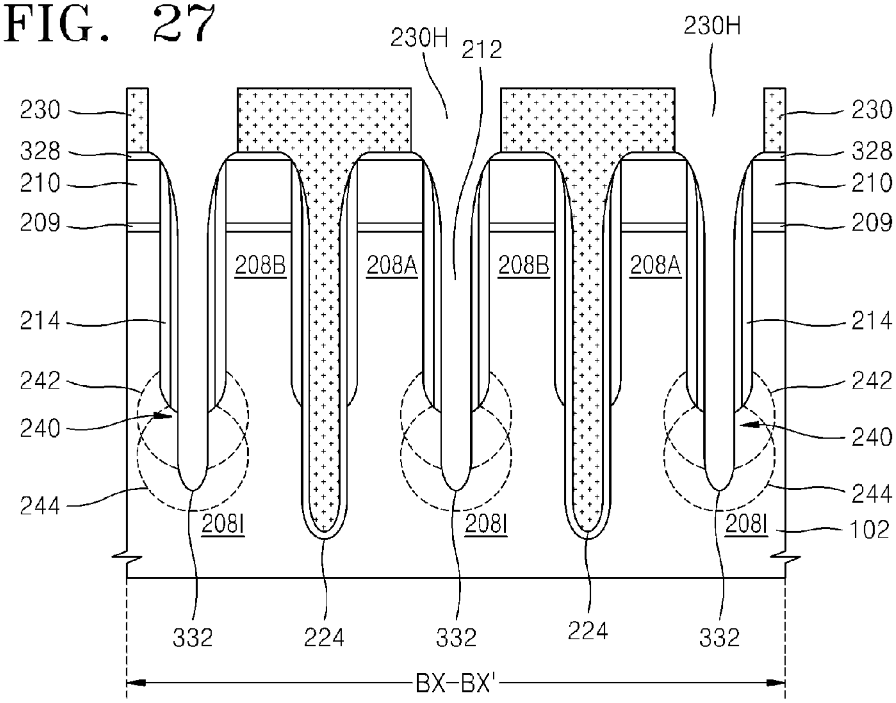
Figure 28:
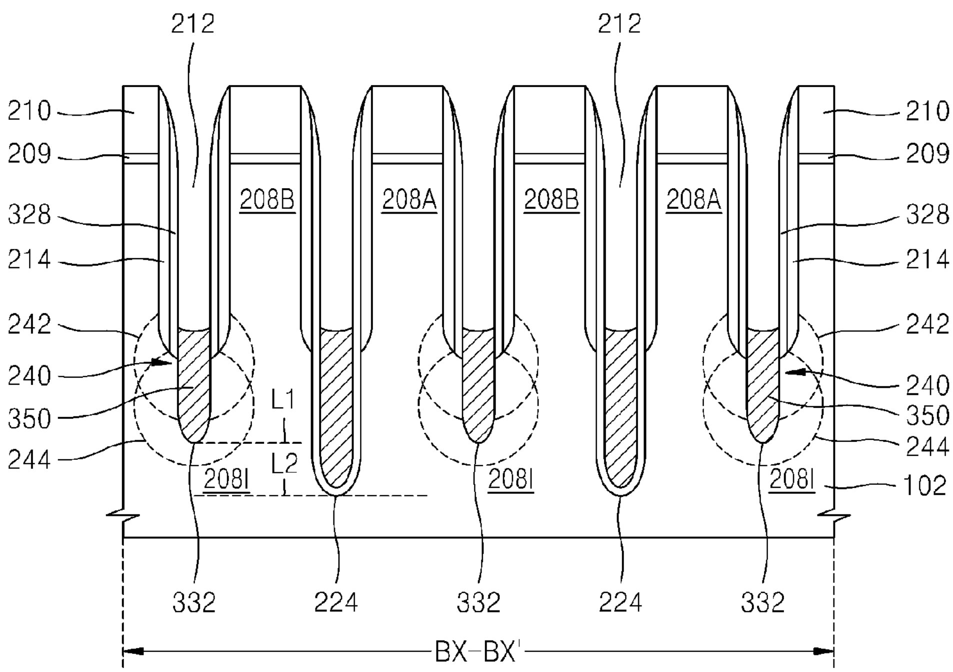

FIGS. 26 through 28 are cross-sectional views illustrating a method of fabricating a semiconductor device, according to an embodiment of the present inventive concept.

A method of fabricating a semiconductor device according to the embodiment described with reference to FIGS. 26 through 28 is similar to that of the previous embodiment, except that the process of forming the second isolation layers 226 shown in FIGS. 22A and 22B is omitted.

Referring to FIG. 26, by performing a substantially similar process described with reference to FIGS. 19A and 19B through 21A and 21B, the plurality of first bit line trenches 212 are formed on the substrate 102 and the insulating spacers 214 are formed on the inner side walls of the plurality of first bit line trenches 212. Then, by performing the same process described with reference to FIGS. 22A and 22B, the substrate 102 on the bottom surfaces of the first bit line trenches 212 that are exposed through the plurality of openings 220H of the second mask pattern 220 is etched to form the isolation trenches 224.

Then, the second mask pattern 220 is removed. A nitride liner 328 is formed on the upper surfaces of the first mask patterns 210, and on surfaces of the regions that are exposed through the first bit line trenches 212 and the isolation trenches 224.

Referring to FIG. 27, like the process described with reference to FIGS. 24A and 24B, the third mask layer that covers the first mask patterns 210 and the insulating spacers 214 is formed. The third mask layer fills the inside of the isolation trenches 224 and the first bit line trenches 212 that are connected to the isolation trenches 224. Then, the third mask layer is patterned to form the third mask pattern 230 having the plurality of openings 230H that expose some portions of the first bit line trenches 212, which pass through the second active areas 208I.

Then, the nitride liner 328 that covers the bottom surfaces of the first bit line trenches 212, which are exposed through the plurality of openings 230H, is removed by using the third mask pattern 230 as an etching mask. Then, the second active areas 208I of the substrate 102 are exposed on the bottom surfaces of the first bit line trenches 212. A portion of the nitride liner 328, which is exposed on inlet portions of the first bit line trenches 212, may be partially removed.

Then, ion implantation of the low concentration dopant 242 is performed using a process described with reference to FIGS. 24A and 24B. The substrate 102 that is exposed on the bottom surfaces of the first bit line trenches 212 is etched to form second bit line trenches 332 that are connected to the first bit line trenches 212. Ion implantation of the high concentration dopant 244 is performed through the plurality of openings 230H formed in the third mask pattern 230 to form the first source/drain regions 240 around the bottom surfaces of the second bit line trenches 332.

Referring to FIG. 28, like a process described with reference to FIGS. 25A and 25B, the third mask pattern 230 is removed. A conductive material is deposited where the first source/drain regions 240 are formed in the substrate 102, to form a conductive layer that fills the inner spaces of the first bit line trenches 212, the second bit line trenches 332 connected to the first bit line trenches 212, and the isolation trenches 224 connected to the first bit line trenches 212. Then, upper portions of the conductive layer are removed by the etch-back process to form a plurality of buried bit lines 350 formed.

During the etch-back process for the conductive layer, the nitride liner 328 covering the upper surfaces of the first mask patterns 210 may be removed so that the upper surfaces of the first mask patterns 210 may be exposed.

The plurality of buried bit lines 350 fill the second bit line trenches 332 from the bottom portions of the first bit line trenches 212 in the second active areas 208I. The plurality of buried bit lines 250 fill the isolation trenches 224 that are connected to the first bit line trenches 212 from the bottom portions of the first bit line trenches 212 in the isolation trenches 224 located on both sides of the second active areas 208I.

The bottom surfaces of the buried bit lines 350 located on the active areas 208 and the bottom surfaces of the buried bit lines 350 located on the isolation layer 206 are located at different levels from each other. Thus, distances from the upper surface of the substrate 102 are different from each other. That is, the distance from the upper surface of the substrate 102 to the bottom surfaces of the buried bit lines 350 located on the active areas 208 is less than the distance from the upper surface of the substrate 102 to the bottom surfaces of the buried bit lines 350 located on the isolation layer 206.

Then, a series of processes described with reference to FIGS. 9A, 9B, and 9C through FIGS. 18A, 18B, and 18C are performed with respect to the resultant of FIG. 28.

According to an embodiment, even when a misalignment occurs during the process of forming the plurality of first bit line trenches 212, the process of forming the plurality of isolation trenches 224, and the process of forming the plurality of second bit line trenches 332, widths of the active pillars 208A and 208B in the plurality of second active areas 208I may be formed constantly. Therefore, variations in electric characteristics between the plurality of unit memory cells on the substrate 102 may be minimized.

According to an embodiment, when depths from the upper surface of the substrate 102 to the upper surfaces and bottom surfaces of the buried bit lines 350 on the second active areas 208I and the isolation regions are compared to each other, the upper surfaces of the buried bit lines 350 passing through the second active areas 208I and the upper surfaces of the buried bit lines 350 passing through the isolation regions where the isolation trenches 224 are formed are located at the same level. In an embodiment, the level (L1) at which the bottom surfaces of the buried bit lines 350 passing through the second active areas 208I are located is higher than the level L2 at which the bottom surfaces of the buried bit lines 350 passing through the isolation region, in which the isolation trenches 224 are formed, are located. Therefore, the plurality of buried bit lines 350 on the second active areas 208I and the isolation region in the length direction thereof have different bottom levels from each other.

FIGS. 29A and 29B through 33A and 33B are diagrams illustrating a method of fabricating a semiconductor device according to an embodiment of the present inventive concept. FIGS. 29A, 30A, 31A, 32A and 33A are plan views of a region corresponding to a rectangular portion denoted by "P"

in the layout of FIG. 1. FIGS. 29B, 30B, 31B, 32B and 33B are cross-sectional views taken along the line BX-BX' of FIGS. 29A, 30A, 31A, 32A and 33A.

An embodiment described with reference to FIGS. 29A and 29B through 33A and 33B is substantially similar to the embodiment described with reference to FIGS. 19A and 19B through 25A and 25B. In an embodiment, the plurality of first bit line trenches 212 are formed, and then, the isolation trenches 224 connected to some of the bit line trenches 212 selected from the plurality of first bit line trenches 212 are formed to define the second active areas 208I. In an embodiment, isolation trenches 404 (refer to FIGS. 29A and 29B) are formed to define active areas 408, and then, a plurality of first bit line trenches 422 (refer to FIGS. 30A and 30B) overlapping the isolation trenches 404 are formed.

Figure 29A:
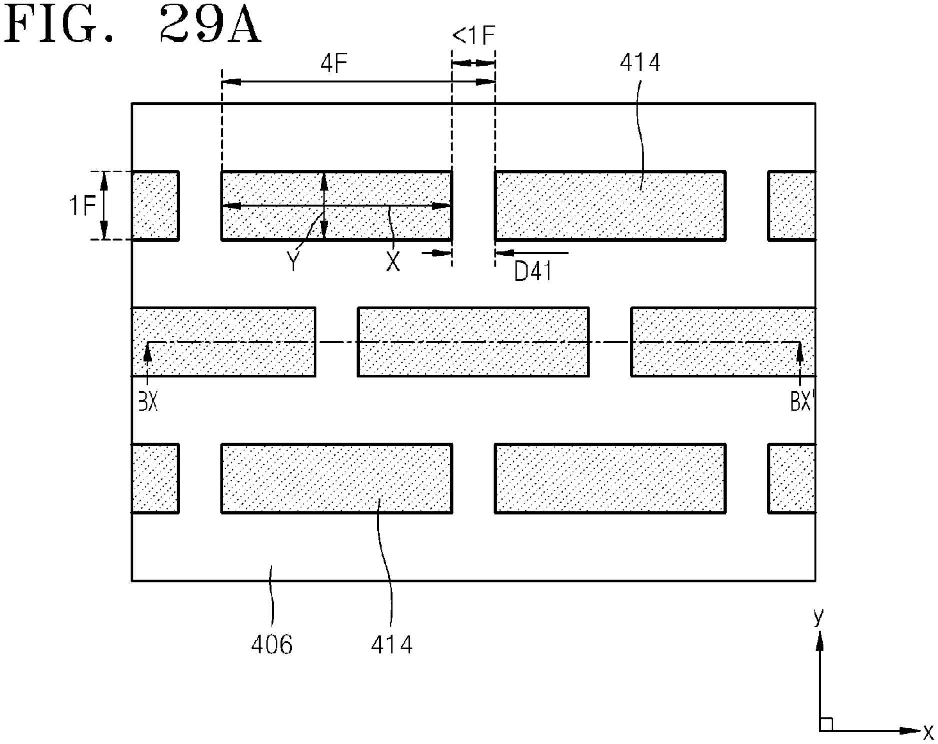
FIGS. 29A, 30A, 31A, 32A and 33A are plan views of a region corresponding to a rectangular portion denoted by "P" in the layout of FIG. 1 according to an embodiment of the inventive concept.
Figure 29B:
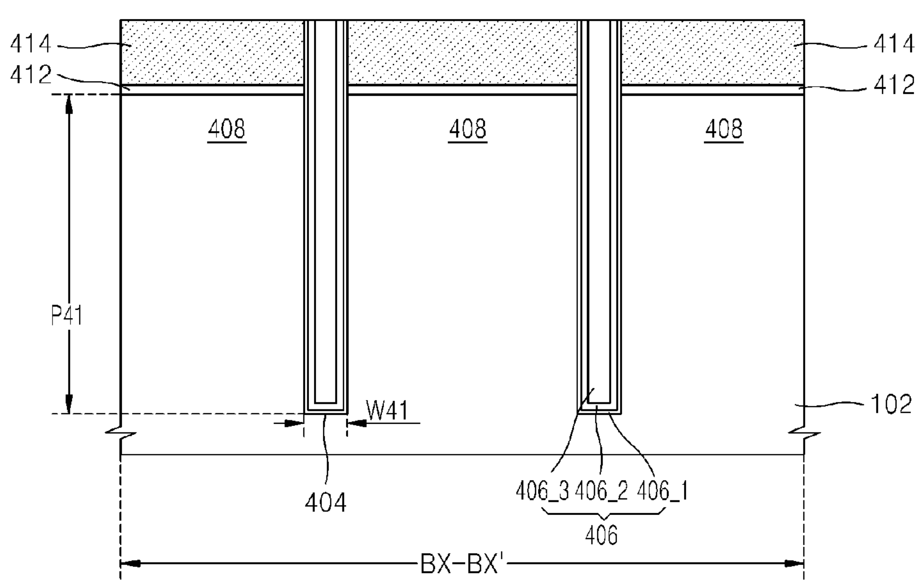
FIGS. 29B, 30B, 31B, 32B and 33B are cross-sectional views taken along the line BX-BX' of FIGS. 29A, 30A, 31A, 32A and 33A according to an embodiment of the inventive concept.

Referring to FIGS. 29A and 29B, a plurality of pad oxide patterns 412 and a plurality of first mask patterns 414 are stacked on the substrate 102.

The plurality of first mask patterns 414 may comprise silicon nitride layers, and may be formed as islands. Each of the plurality of first mask patterns 414 may have a pitch of 4F in a first direction, that is, the longer axis direction (i.e., the x direction of FIG. 29A). A width of the first mask pattern 414 in the longer axis direction (X) may be greater than 3F. A distance D41 between the two neighboring first mask patterns 414 in the first direction may be smaller than 1F. Each of the first mask patterns 414 may have a length of 1F in the shorter axis (Y), that is, a second direction (i.e., the y direction in FIG. 3A).

As described with reference to FIGS. 3A, 3B, and 3C, a pad oxide layer for forming pad oxide patterns 412 is formed on the substrate 102. Then, ion implantation for forming wells in the substrate 102 may be performed before forming the first mask layer for forming the first mask patterns 414. The substrate 102 is etched by using the above stacked structure as an etching mask to form isolation trenches 404 in the substrate 102. The isolation trenches 404 may have a first depth P41 from the upper surface of the substrate 102.

A side wall oxide layer 406_1 and a nitride liner 406_2 are sequentially formed on an inner wall of the isolation trench 404, and the remaining space of the isolation trench 404 is filled with a gap fill oxide layer 406_3. Then, the above structure is planarized by performing CMP until the upper surfaces of the first mask patterns 414 are exposed to form an isolation layer 406. The isolation layer 406 may have a width W41 that corresponds to the distance D41 between the two neighboring first mask patterns 414 in the first direction. A plurality of active areas 408 are defined on the substrate 102 by the isolation layer 406.

Figure 30A:
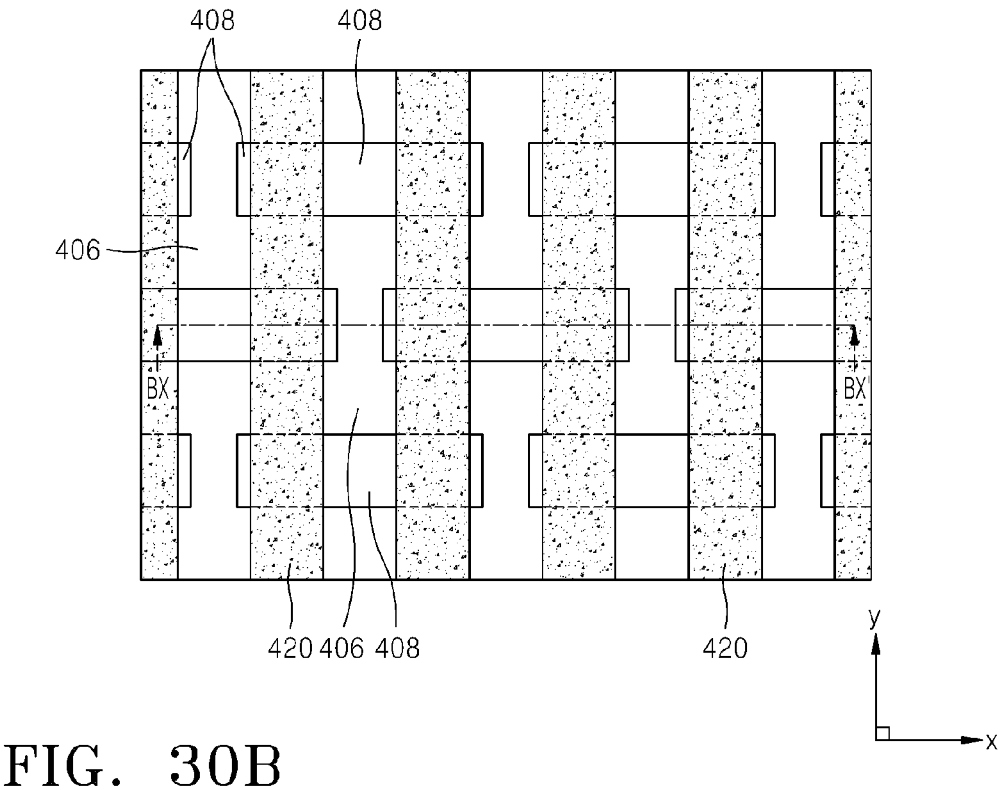
Figure 30B:
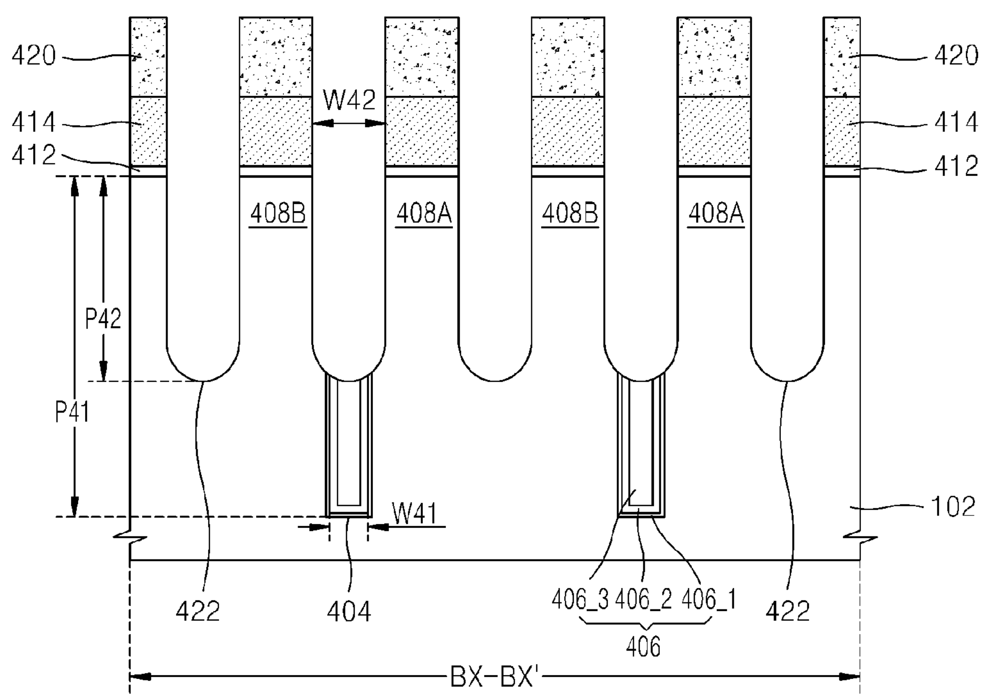

Referring to FIGS. 30A and 30B, a plurality of second mask patterns 420 that include a plurality of line patterns extending in the shorter axis (Y) direction of the first mask patterns 414 are formed on the upper surfaces of the first mask patterns 414 and upper surface of the isolation layer 406 exposed on the substrate 102. The active area 408 and the isolation layer 406 are exposed via a space formed as a line between two neighboring second mask patterns 420 among the plurality of second mask patterns 420.

The plurality of second mask patterns 420 may comprise a material that may have an etch selectivity with respect to the isolation layer 406 and the plurality of first mask patterns 424. For example, the second mask patterns 420 may comprise a carbon based layer such as, for example, an ACL or SOH layer. The second mask patterns 420 may be formed by a photolithography process.

The exposed first mask patterns 414 and the isolation layer 406, and the pad oxide patterns 412 and the substrate 102 that are exposed due to the etching of the first mask patterns 414 are etched to a predetermined depth by using the second mask patterns 420 as the etching mask to form a plurality of first bit line trenches 422 for forming buried bit lines. When the plurality of first bit line trenches 422 are formed, each of the active areas 408 is divided into two active pillars 408A and 408B.

The plurality of first bit line trenches 422 are formed at equal intervals along the longer axis (X) direction (x direction in FIG. 30A) on the substrate 102. A width W42 of the first bit line trench 422 in the longer axis (X) direction of the active areas 408 may be greater than the width W41 of the isolation trench 404. The plurality of first bit line trenches 422 may be formed to have a second depth P42 that is smaller than the first depth P41 from the upper surface of the substrate 102.

Figure 31A:
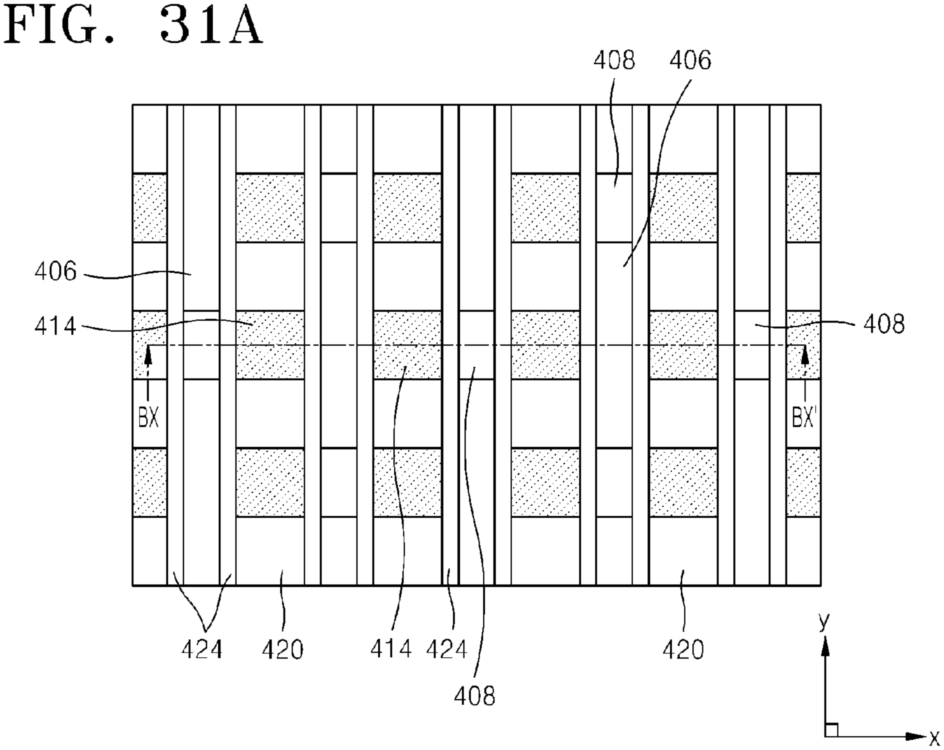
Figure 31B:
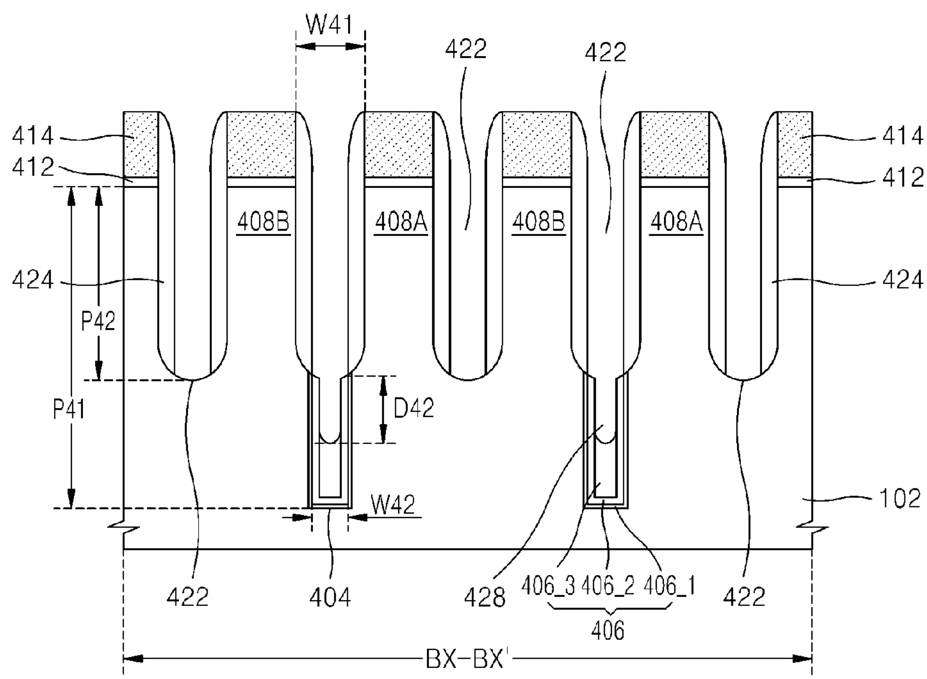

Referring to FIGS. 31A and 31B, the second mask patterns 420 are removed. Insulating spacers 424 are formed on side walls of the first mask patterns 414 and inner side walls of the first bit line trenches 422 in a similar way to that of forming the insulating spacers 214 illustrated in FIGS. 21A and 21B. The insulating spacers 424 may comprise the same material as that of the first mask patterns 424. For example, the insulating spacers 424 may comprise silicon nitride layers.

After forming the insulating spacers 424, the gap fill oxide layer 406_3 in the isolation layer 406 is removed to a predetermined depth D42 by using the first mask patterns 414, the insulating spacers 424, and the nitride liner 406_2 as the etching mask to form a plurality of second bit line trenches 428 that are connected to the first bit line trenches 422. The second bit line trenches 428 are formed only on the isolation region where the isolation layer 406 is formed. A cross-section of a bottom surface in each of the second bit line trenches 428 may be formed as a round curve having a predetermined curvature ratio when seen from the cross-section in the x direction of FIG. 31A, as shown in FIG. 31B.

Figure 32A:
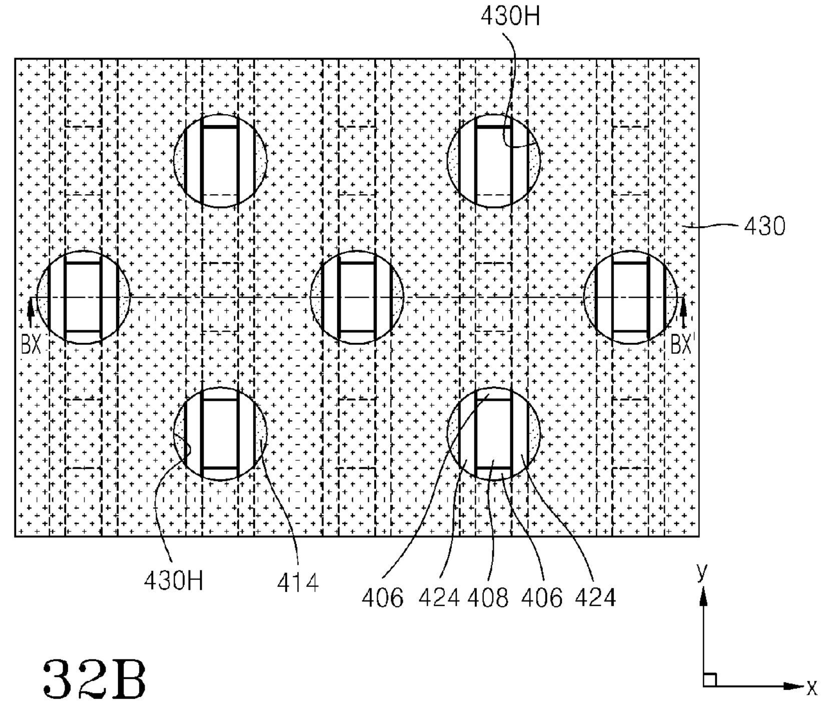
Figure 32B:
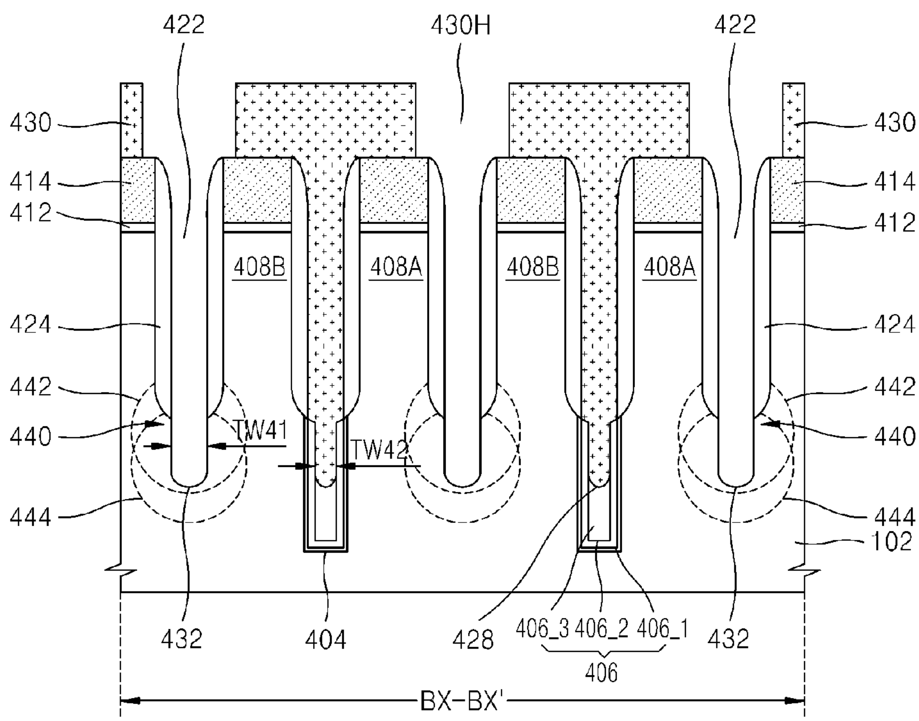

Referring to FIGS. 32A and 32B, like the process described with reference to FIGS. 24A and 24B, a third mask pattern 430 that covers the first mask patterns 414, the insulating spacers 424, and the nitride liner 406_2 while filling the inner portions of the second bit line trenches 428 and the inner portions of the second bit line trenches 422 connected to the second bit line trenches 428 is formed. The third mask pattern 430 includes a plurality of openings 430H that expose the active areas 408 of the substrate 102 that is exposed through bottom surfaces of the plurality of first bit line trenches 422. The third mask pattern 430 may be formed of a carbon based layer such as an SOH layer.

After that, ion implantation of a low concentration dopant 442 onto the active areas 408 around the bottom surfaces of the first bit line trenches 422 is performed through the plurality of openings 430H formed in the third mask pattern 430 to form first source/drain regions 440 around the first bit line trenches 422 by using the third mask pattern 430 and the nitride liners 424 that are exposed through the openings 430H as an ion implantation mask. For example, the low concentration dopant 442 may be N-type impurity ions.

After that, the substrate 102 that is exposed on the bottom surfaces of the first bit line trenches 422 is etched to form third bit line trenches 432 connected to the first bit line trenches 422.

To form the first source/drain regions 440 around the bottom portions of the third bit line trenches 432, ion implantation of a high concentration dopant 444 onto the active areas 408 around the bottom surfaces of the third bit line trenches 432 is performed through the openings 430H formed in the third mask pattern 430. The high concentration dopant 444 may be the same type of impurity ions, for example, N-type impurity ions. Thus, the first source/drain regions 440 may be formed around the lower portions of the third bit line trenches 432 that are connected to the first bit line trenches 422.

The bottom surface of each of the third bit line trenches 432 may have a cross-section that is formed as a round curve having a predetermined curvature ratio as shown in FIG. 32B, when seen from the x direction of FIG. 32A. Here, since a width TW41 of the third bit line trench 432 is greater than a width TW42 of the second bit line trench 428, the curvature ratio of the curve shown in the cross-section of the bottom surface of the third bit line trench 432 may be greater than that of the second bit line trench 428.

Figure 33A:
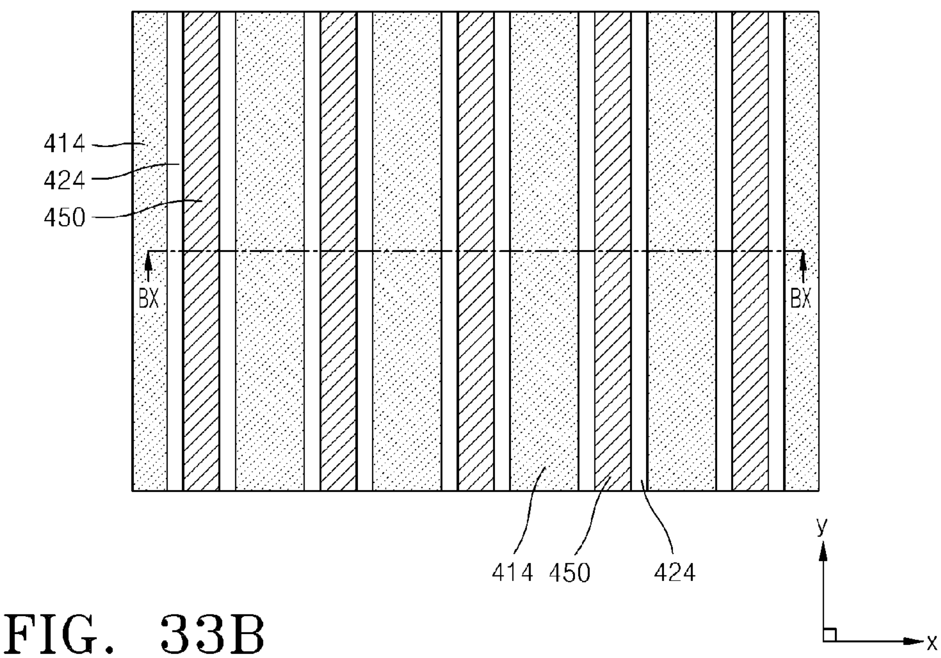
Figure 33B:
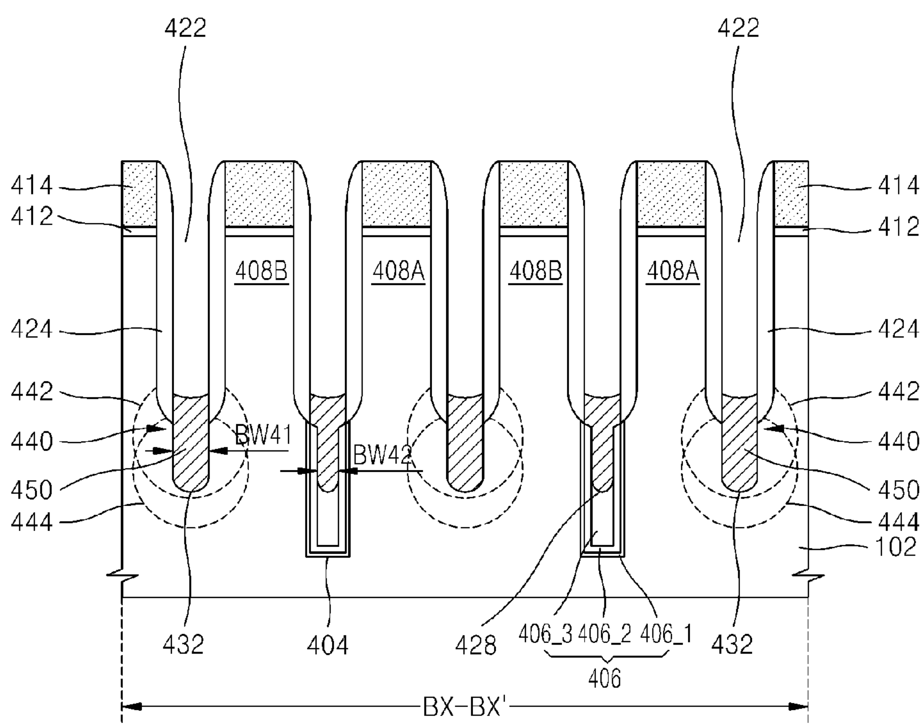

Referring to FIGS. 33A and 33B, the third mask pattern 430 is removed. Then, according to the process described with reference to FIGS. 25A and 25B, a conductive material is deposited on the entire surface of the substrate 102 to form a conductive layer that fills inner portions of the first bit line trenches 422, the second bit line trenches 428 that are connected to the first bit line trenches 422, and the third bit line trenches 432 that are connected to the first bit line trenches 422. After that, unnecessary portions of the conductive layer are removed by an etch-back process so that a plurality of buried bit lines 450 are formed by the remaining portions of the conductive layer.

In the active areas 408, the plurality of buried bit lines 450 are formed to fill the third bit line trenches 432 from the bottom portions of the first bit line trenches 422 that are connected to the third bit line trenches 432. In the isolation regions where the isolation layer 406 is formed, the plurality of buried bit lines 450 are formed to fill the second bit line trenches 428 from the bottom portions of the first bit line trenches 422 that are connected to the second bit line trenches 428.

The structures of the buried bit lines 450 are the same as those of the buried bit lines 140 described with reference to FIGS. 8A, 8B, and 8C.

According to the semiconductor device of the current embodiment, each of the buried bit lines 450 includes an upper portion having an upper surface of the buried bit line 450 and a lower portion having the bottom surface of the buried bit line 450. The buried bit line 450 may have a variable width on the lower portion thereof along the extension direction of the buried bit line 450 when seen from the longer axis (X) (i.e., the x direction of FIG. 33A) of the active areas 408. As shown in FIGS. 33A and 33B, a width BW42 of the lower portions of the buried bit lines 450 that pass above the isolation layer 406 may be smaller than a width BW41 of the lower portions of the buried bit lines 450 that pass above the active areas 408, in the cross-section of the longer axis (X) direction of the active areas 408. Therefore, the curvature ratio of the bottom surfaces of the buried bit lines 450 passing over the isolation layer 406 may be greater than the curvature ratio of the bottom surfaces of the buried bit lines 450 passing over the active areas 408.

A series of processes described with reference to FIGS. 9A, 9B, and 9C through 18A, 18B, and 18C may be performed with respect to the resultant shown in FIGS. 33A and 33B. Then, the semiconductor device according to the current embodiment may be fabricated.

According to the current embodiment described with reference to FIGS. 29A and 29B through 33A and 33B, the plurality of buried bit lines 450 are formed in the substrate 102. Therefore, when the memory cell array having a unit memory cell size of $4F^2$ is formed, insulating distances between the unit devices forming the unit memory cell on the substrate 102 may be ensured, and thus, probabilities of generating a short-circuit and leakage current can be minimized even with a substantially small unit memory cell area and reliability of the semiconductor device may be maintained.

FIGS. 34A, 34B, and 34C through 37A, 37B, and 37C are diagrams illustrating a method of fabricating a semiconductor device according to another embodiment of the present concept.

FIGS. 34A, 35A, 36A, and 37A are plan views of a region corresponding to a rectangular portion denoted by "P" in the layout of FIG. 1. FIGS. 34B, 35B, 36B, and 37B are cross-sectional views taken along the lines BX1-BX1' and BX2-BX2' shown in FIGS. 34A, 35A, 36A, and 37A. FIGS. 34C, 35C, 36C, and 37C are cross-sectional views taken along the lines CY1-CY1' and CY2-CY2' shown in FIGS. 34A, 35A, 36A, and 37A.

The current embodiment described with reference to FIGS. 34A, 34B, and 34C through 37A, 37B, and 37C is similar to the previous embodiment described with reference to FIGS. 3A, 3B, and 3C through 18A, 18B, and 18C. In the previous embodiment, the plurality of second mask patterns 120 are formed in processes shown in FIGS. 5A, 5B, and 5C, and the active areas 108 and the isolation layer 106 are etched simultaneously by using the plurality of second mask patterns 120 as the etching mask to form the plurality of second trenches 124 in the processes shown in FIGS. 6A, 6B, and 6C. In the current embodiment, when trenches for forming buried bit lines 550 (refer to FIGS. 37A and 37B) are formed, an etching process of the active areas 108 in the substrate and an etching process of the isolation layer 106 are separately performed by using a difference between an etch selectivity of the active areas 108 in the substrate 102 formed of silicon and etch selectivity of the gap fill oxide layer 106_3 forming the isolation layer 106.

Figure 34A:
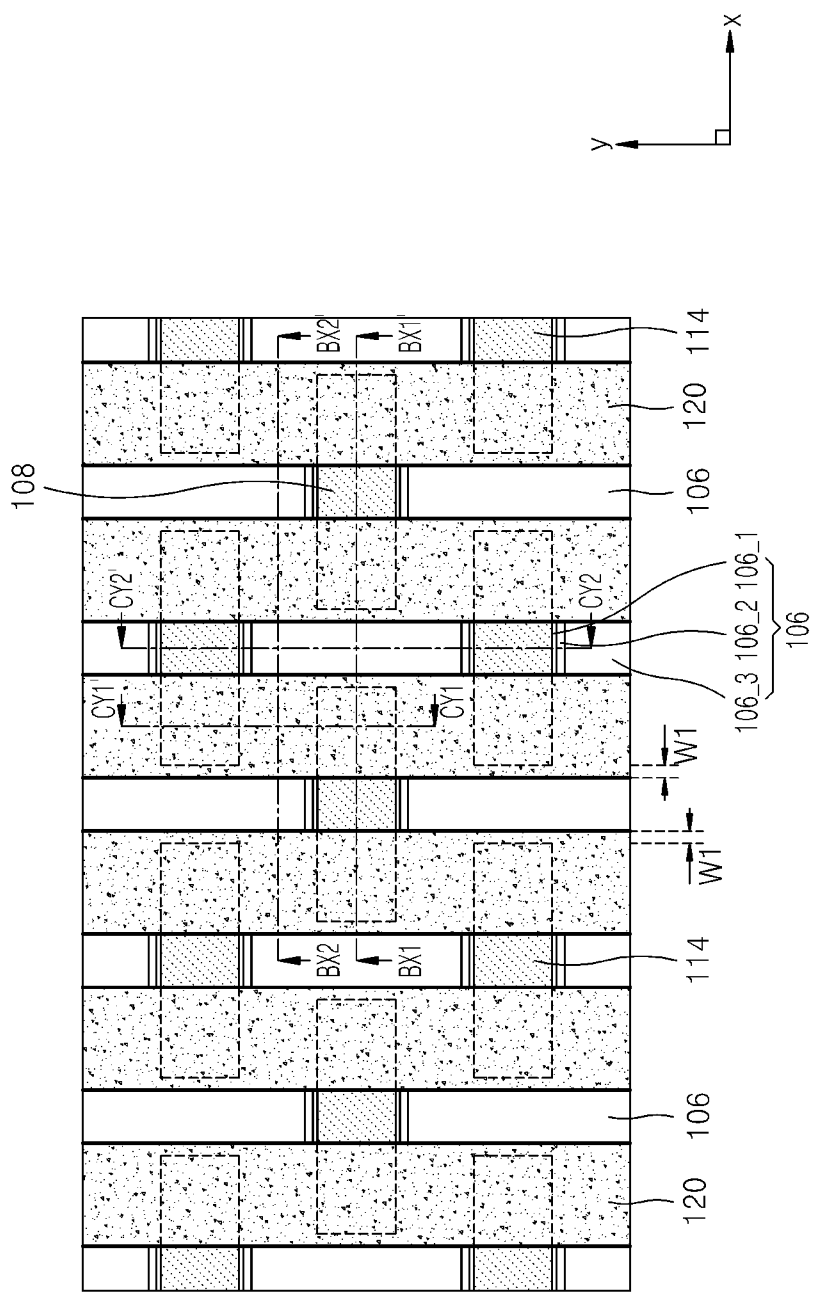
FIGS. 34A, 35A, 36A, and 37A are plan views of a region corresponding to a rectangular portion denoted by "P" in the layout of FIG. 1 according to an embodiment of the inventive concept.
Figure 34B:
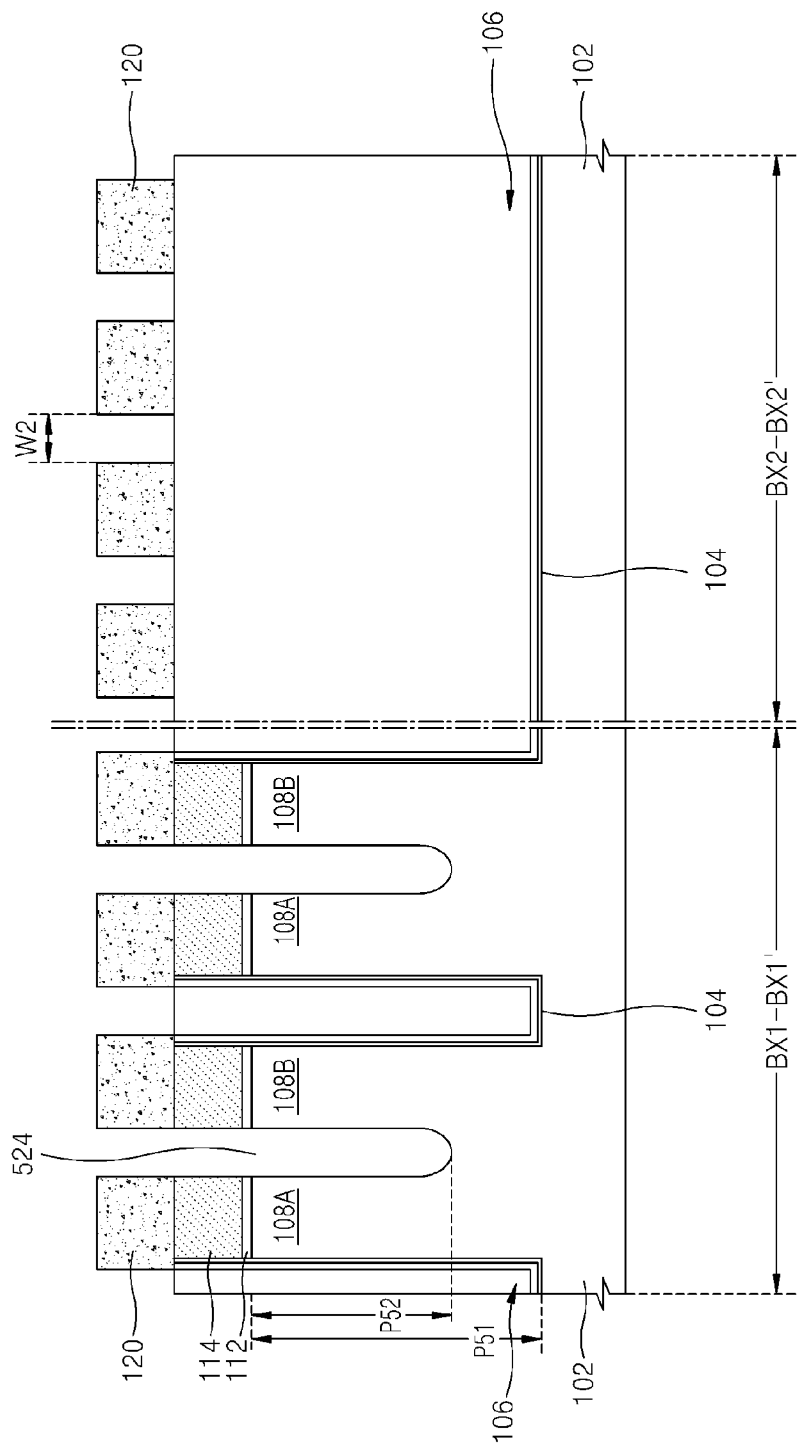
FIGS. 34B, 35B, 36B, and 37B are cross-sectional views taken along the lines BX1-BX1' and BX2-BX2' shown in FIGS. 34A, 35A, 36A, and 37A according to an embodiment of the inventive concept.
Figure 34C:
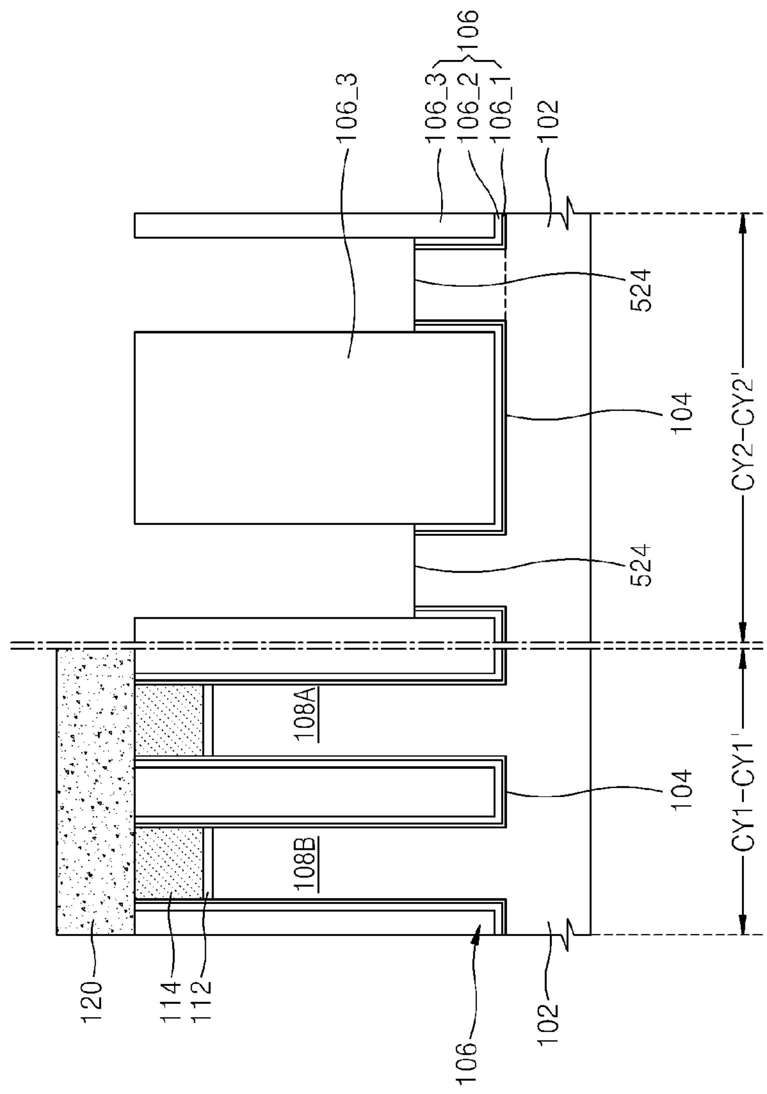
FIGS. 34C, 35C, 36C, and 37C are cross-sectional views taken along the lines CY1-CY1' and CY2-CY2' shown in FIGS. 34A, 35A, 36A, and 37A according to an embodiment of the inventive concept.

Referring to FIGS. 34A, 34B, and 34C, the plurality of second mask patterns 120 are formed on the substrate 102 according to the processes shown in FIGS. 3A, 3B, and 3C through 5A, 5B, and 5C.

The second mask patterns 120 may comprise a carbon based layer such as an ACL or SOH layer. The first mask patterns 114 and the isolation layer 106 are exposed through the plurality of second mask patterns 120.

After that, a plurality of second trenches 524 are formed only on the active areas 108 by using the difference between the etch selectivity of the materials forming the second mask patterns 120, the first mask patterns 114, and the gap fill oxide layer 106_3 of the isolation layer 106. The plurality of second trenches 524 provide spaces for forming the buried bit lines in post-processes.

For forming the plurality of second trenches 524, the first mask patterns 114 exposed through the plurality of second mask patterns 120 are etched, and then, the pad oxide patterns 112 and the substrate 102 that are sequentially exposed due to the etching process are etched. At this time, the etching process of the first mask patterns 114 and the substrate 102 is selectively performed under a condition where a high etch selectivity may be provided to the gap fill oxide layer 106_3 of the isolation layer 106.

During etching of the substrate 102, the side wall oxide layer 106_1 and the nitride liner 106_2 that are thin and exposed on side walls of the second trenches are etched simultaneously due to the etching of the substrate 102. The gap fill oxide layer 106_3 of the isolation layer 1060 may be exposed through the second trenches 524 formed in the active areas 108. According to an embodiment, the side wall oxide layer 106_1 and the nitride liner 106_2 may remain on the inner walls of the second trenches 524.

The first trench 104 may have a bottom surface at a first depth P51 from the upper surface of the substrate 102, and the plurality of second trenches 524 may have bottom surfaces at a second depth P52 that is smaller than the first depth P51 from the upper surface of the substrate 102.

When the second trenches 524 are formed, each active area 108 formed as an island is divided into two active pillars 108A and 108B that are located on both sides of the second trench 524. Each of the two active pillars 108A and 108B included in one active area 108 may respectively include a unit memory cell, and each of the active pillars 108A and 108B provides a vertical channel area for forming the unit memory cell.

Figure 35A:
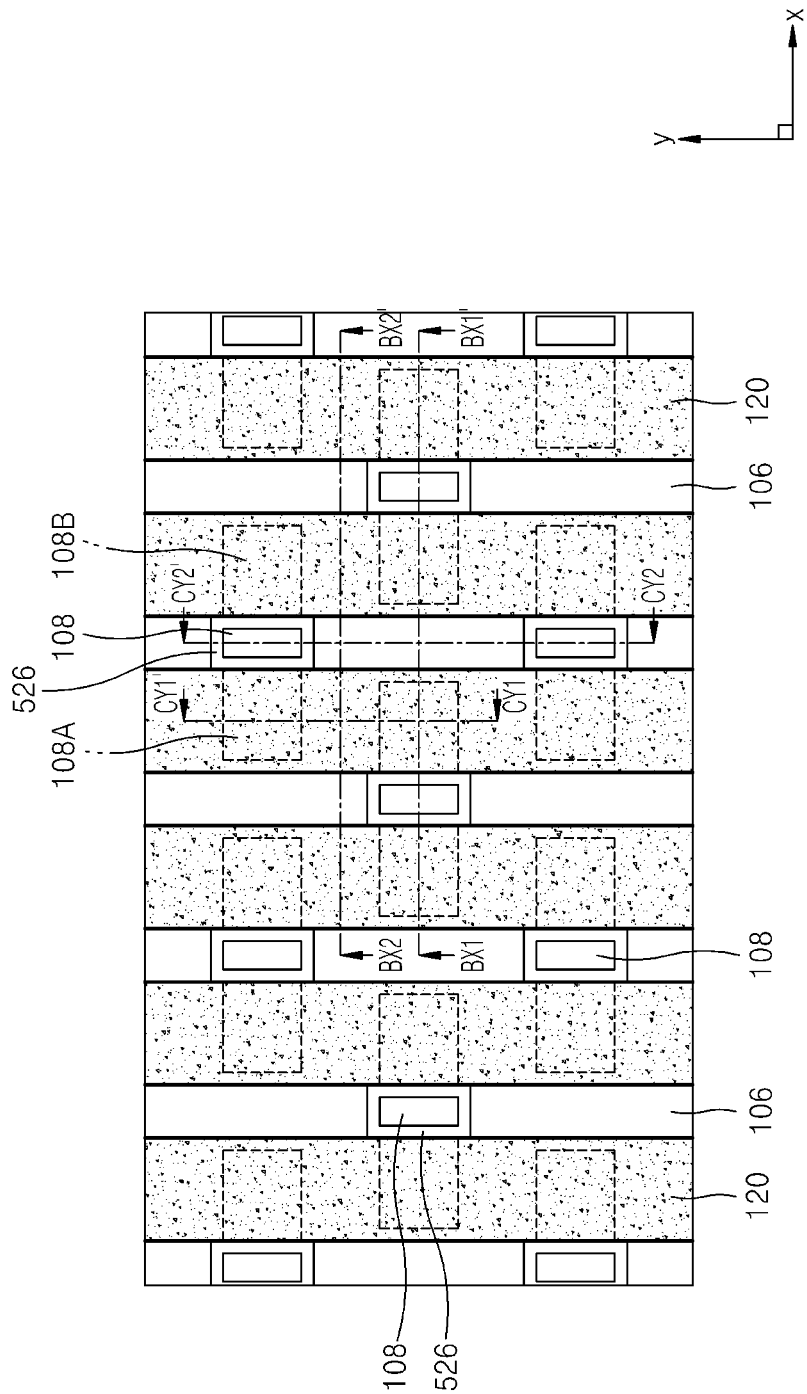
Figure 35B:
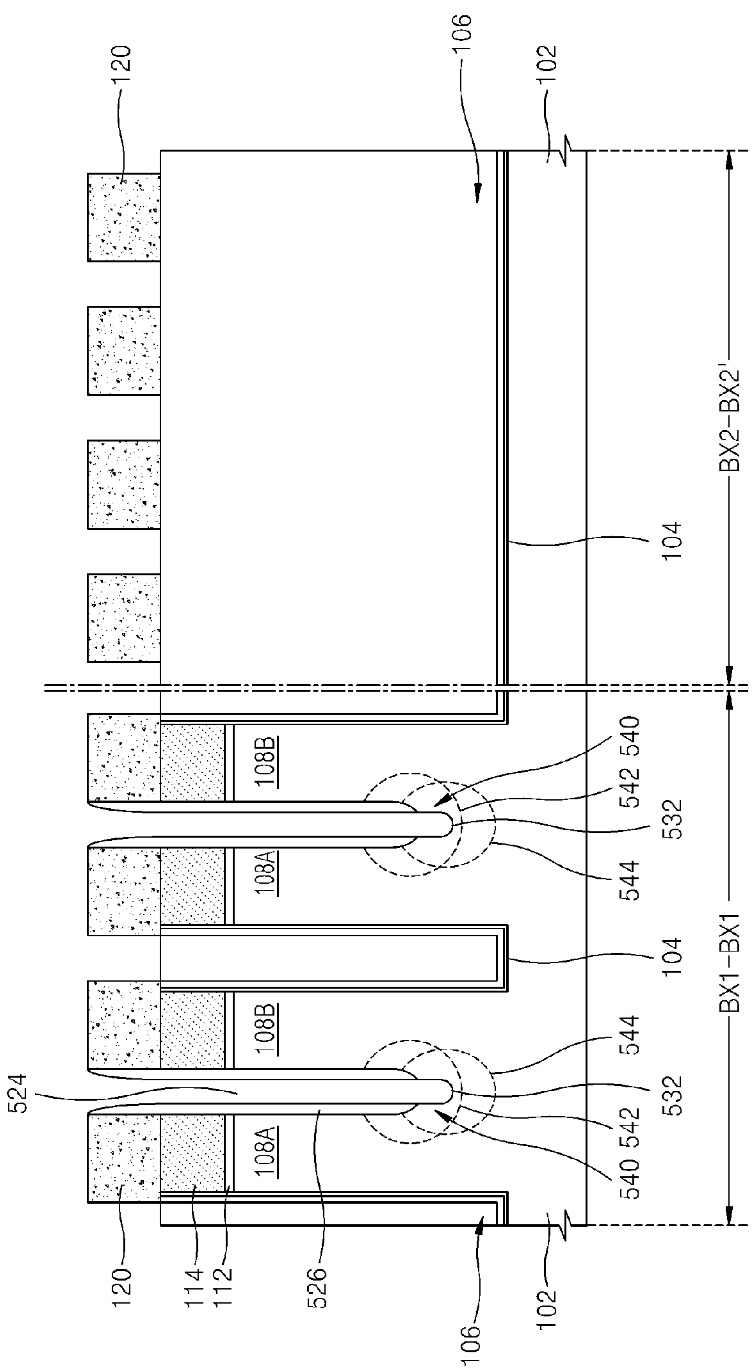
Figure 35C:
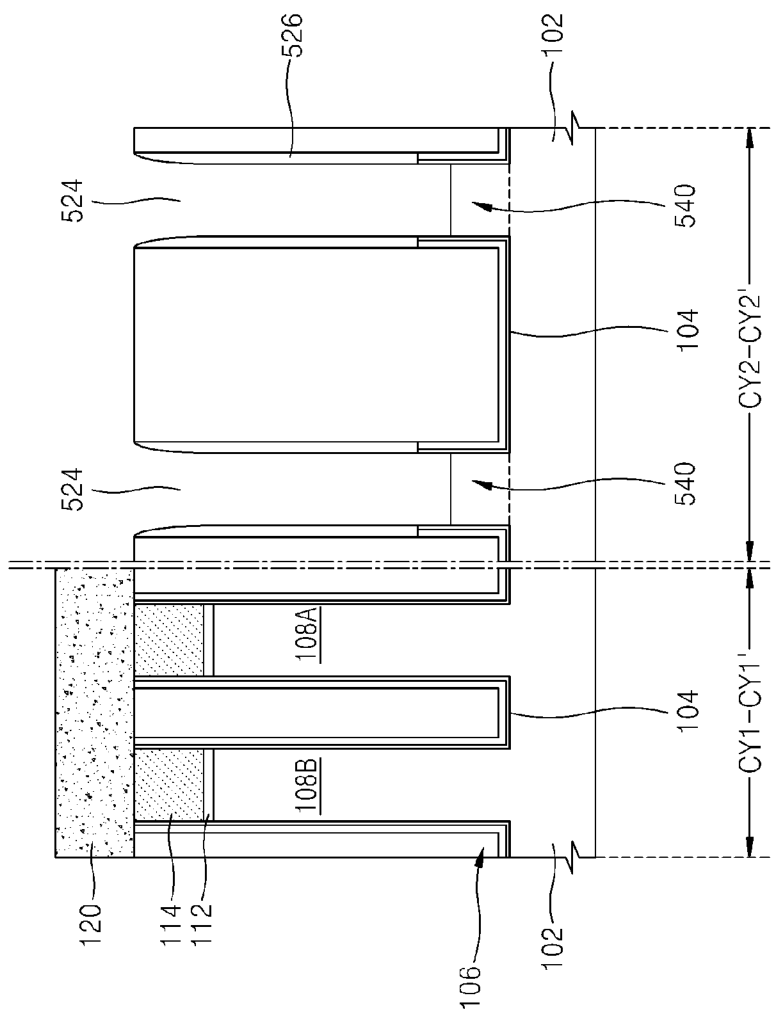

Referring to FIGS. 35A, 35B, and 35C, insulating spacers 526 are formed on inner walls of the plurality of second trenches 524.

To form the insulating spacers 526, an insulating layer that entirely covers the upper surface of the substrate 102, on which the plurality of second trenches 524 are formed. Then, the insulating layer is etched-back to leave the insulating spacers 526 on the inner side walls of the second trenches 524 and the side walls of the first mask patterns 114.

The insulating spacers 526 may comprise silicon nitride layers.

Then, to form first source/drain regions 540 around bottom surfaces of the second trenches 524, ion implantation of a low concentration dopant 542 onto the active areas 108 around the bottom surfaces of the second trenches 524 is performed by using the insulating spacers 526 as an ion implantation mask. For example, the low concentration dopant 542 may be N-type impurity ions.

After that, the substrate 102 exposed on the bottom surfaces of the second trenches 524 is etched to form third trenches 532 connected to the second trenches 524. The third trenches 532 provide spaces for forming the buried bit lines.

To form the first source/drain regions 540 around the bottom surfaces of the third trenches 532, ion implantation of a high concentration dopant 544 onto the active areas 108 around the bottom surfaces of the third trenches 532 is performed. The high concentration dopant 544 may be the same type of impurity ions as the low concentration dopant 544, for example, N-type impurity ions. Then, the first source/drain regions 540 may be formed around the lower portions of the third trenches 532 that are connected to the second trenches 524 in the active areas 108.

Figure 36A:
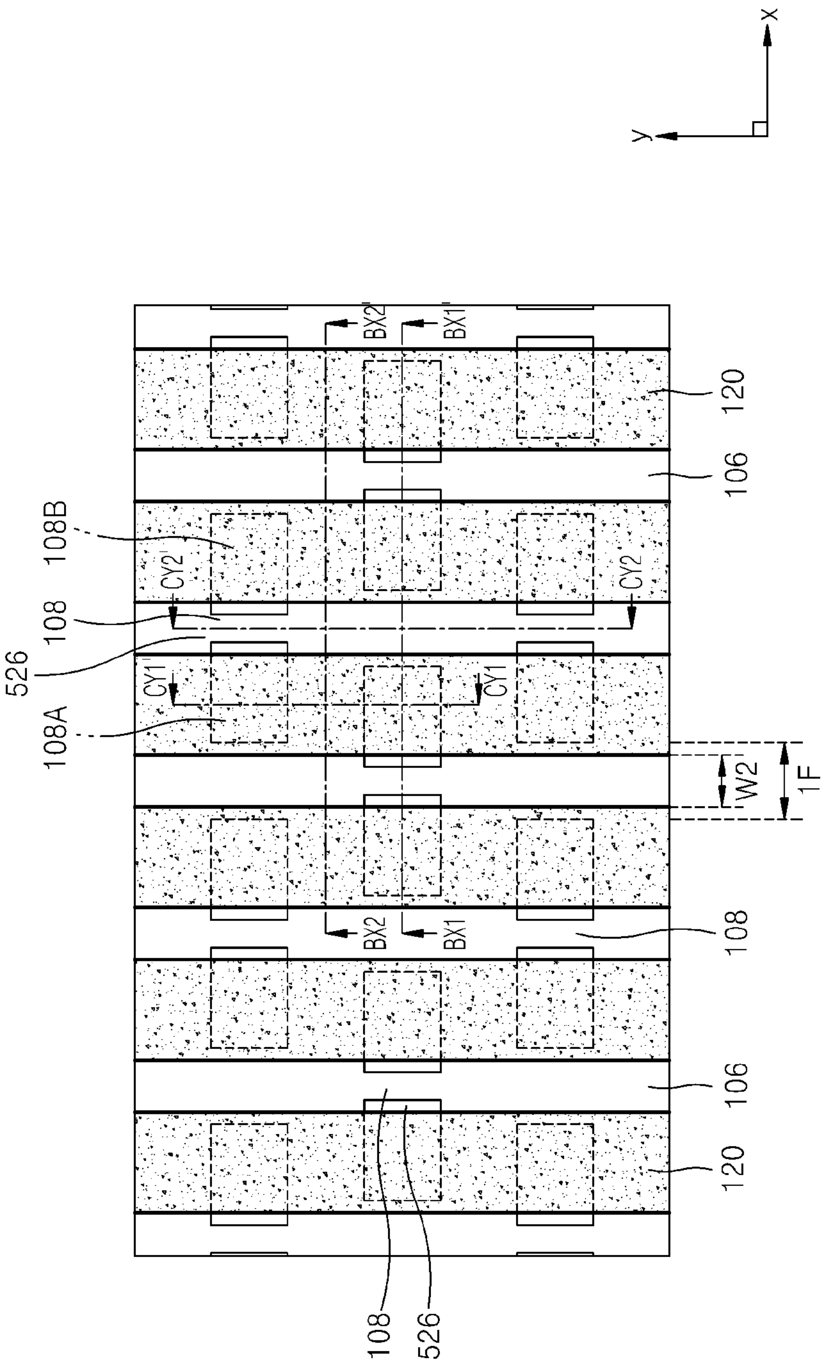
Figure 36B:
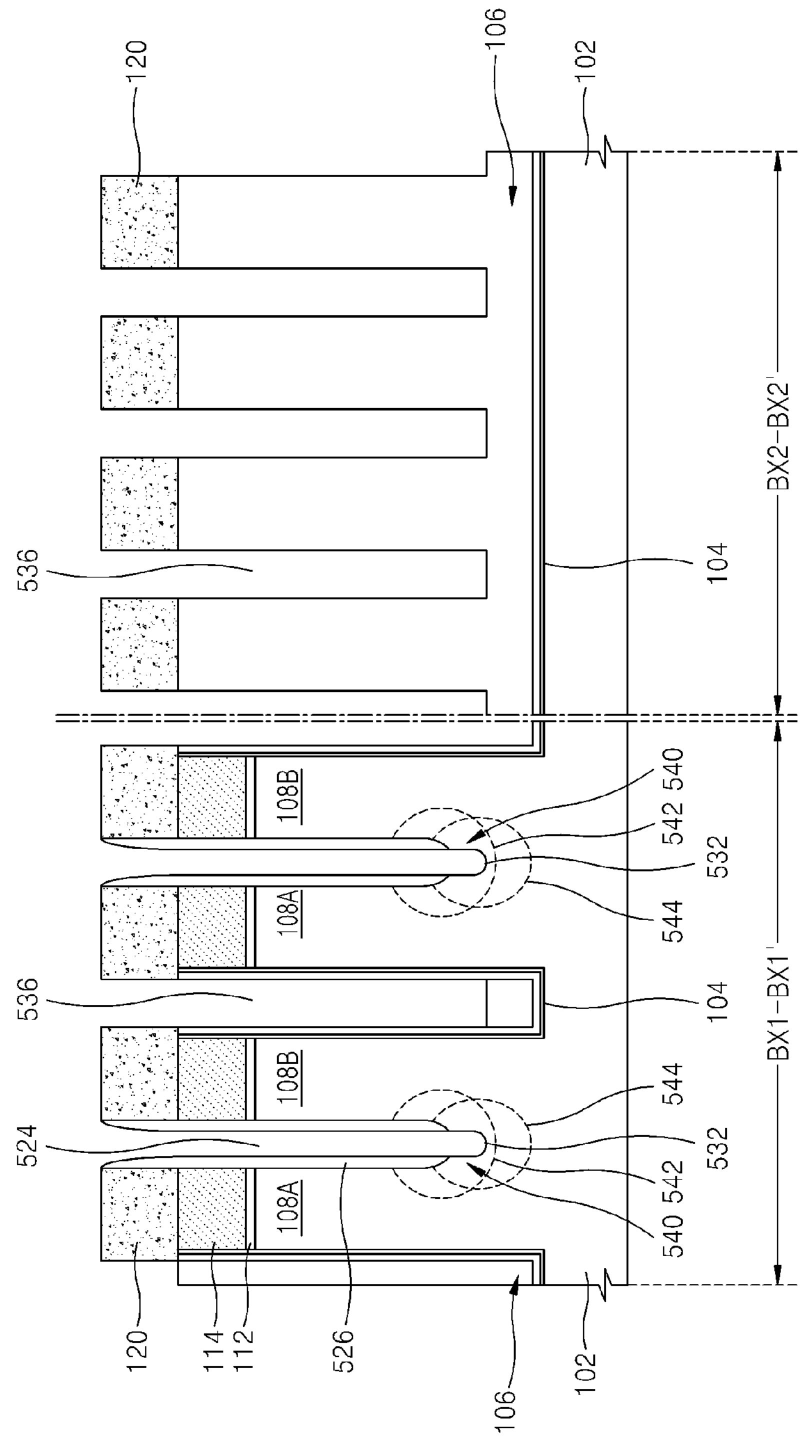
Figure 36C:
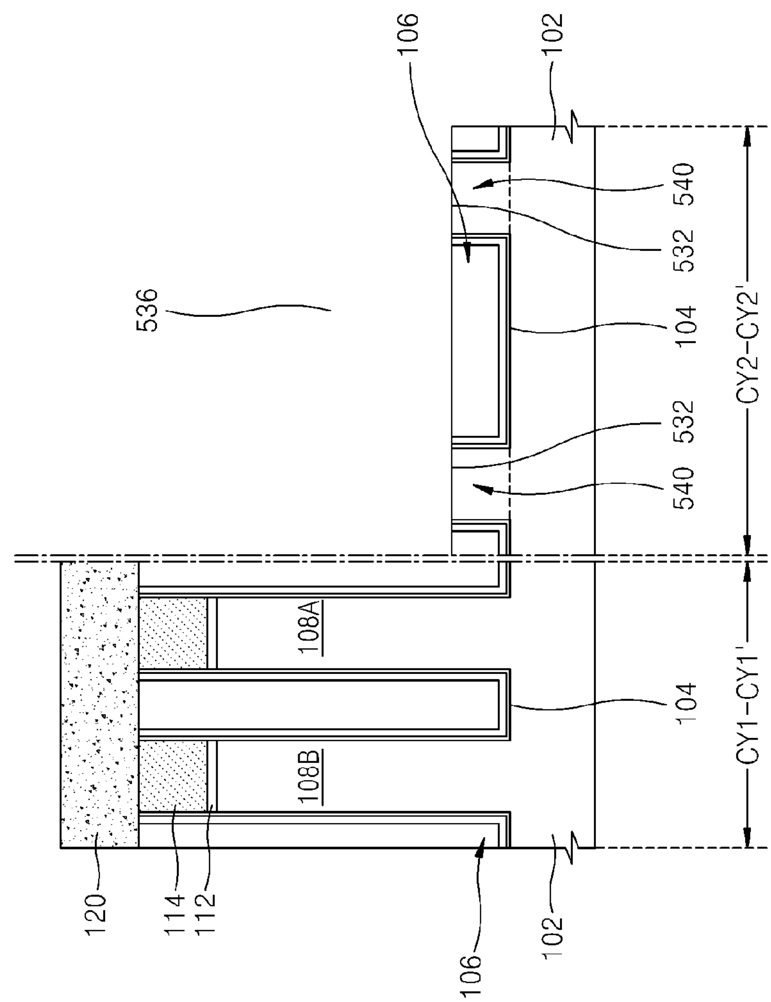

Referring to FIGS. 36A, 36B, and 36C, the gap fill oxide layer 106_3 of the isolation layer 106 is selectively etched by using the difference between the etch selectivity of the materials forming the second mask patterns 120, the insulating spacers 526, the active areas 108 of the substrate 102 formed of silicon, and the gap fill oxide layer 106_3 of the isolation layer 106, and thus, a plurality of fourth trenches 536 are formed on the isolation layer 106. The plurality of fourth trenches 536 provide spaces for forming buried bit lines 550 (refer to FIGS. 37A and 37B) in post-processes.

During etching of the gap fill oxide layer 106_3 for forming the fourth trenches 536, some portions of the insulating spacers 526, which are thin, covering the side walls of the gap fill oxide layer 106_3, may be etched.

In an embodiment, spaces formed as lines extending in the y direction of FIG. 36A are formed by the second trenches 524, the third trenches 532, and the fourth trenches 536.

Figure 37A:
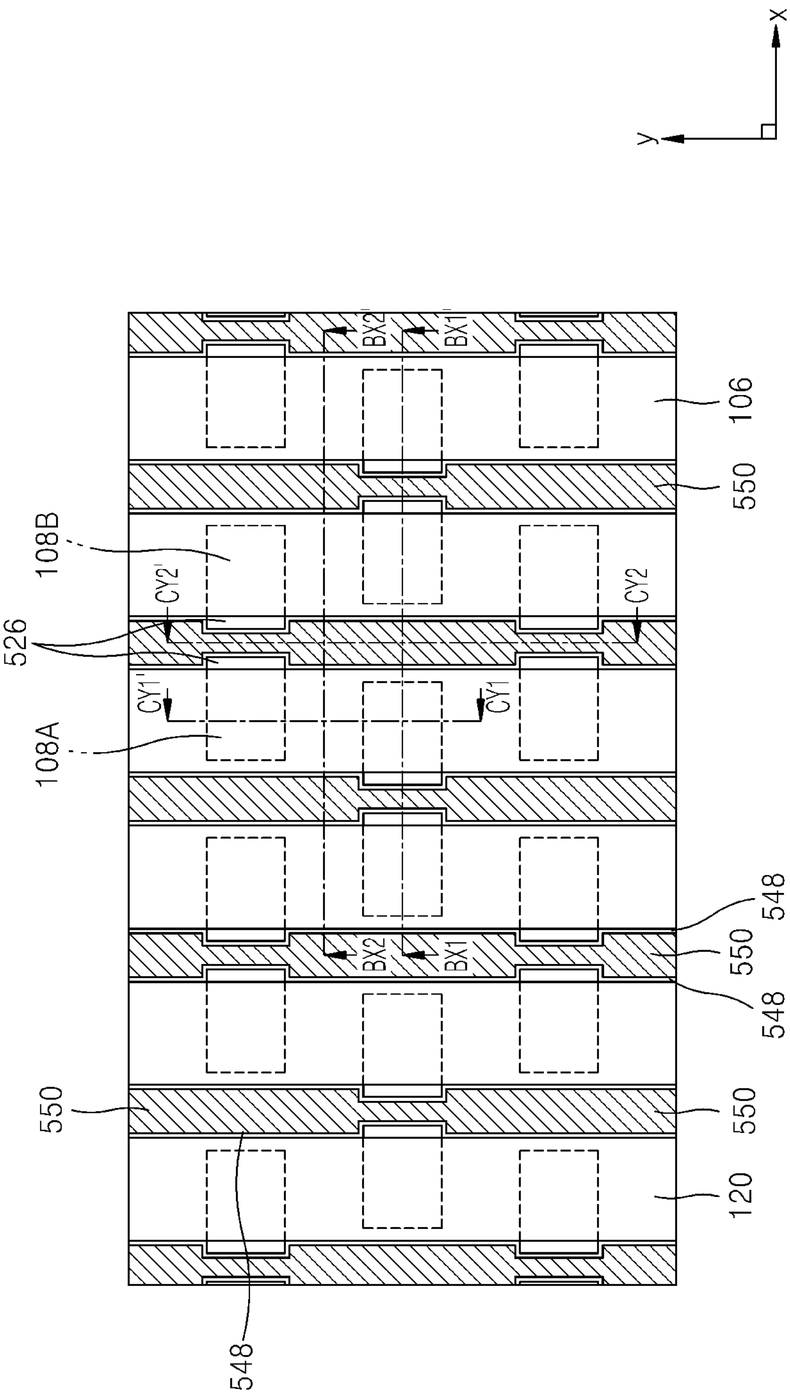
Figure 37B:
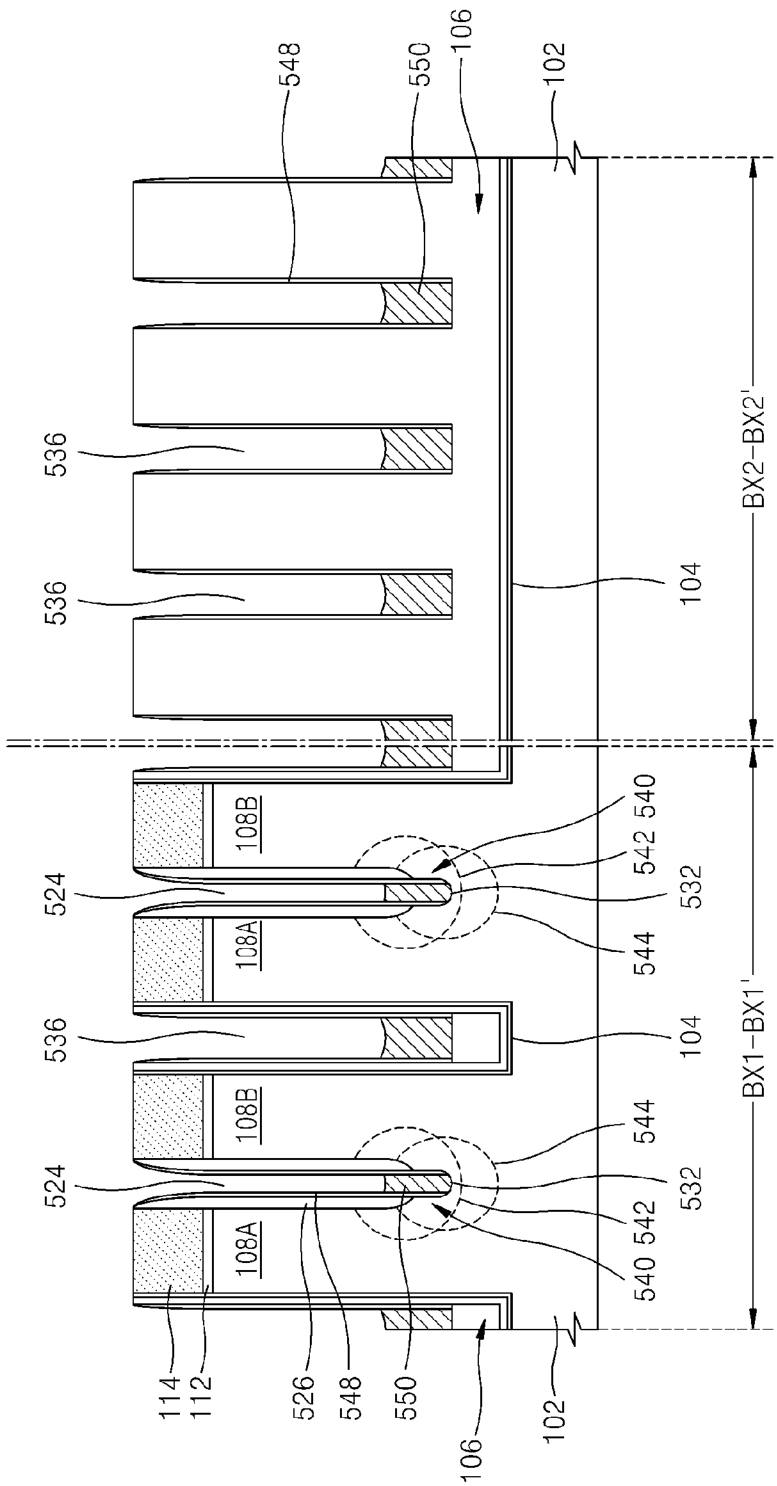
Figure 37C:
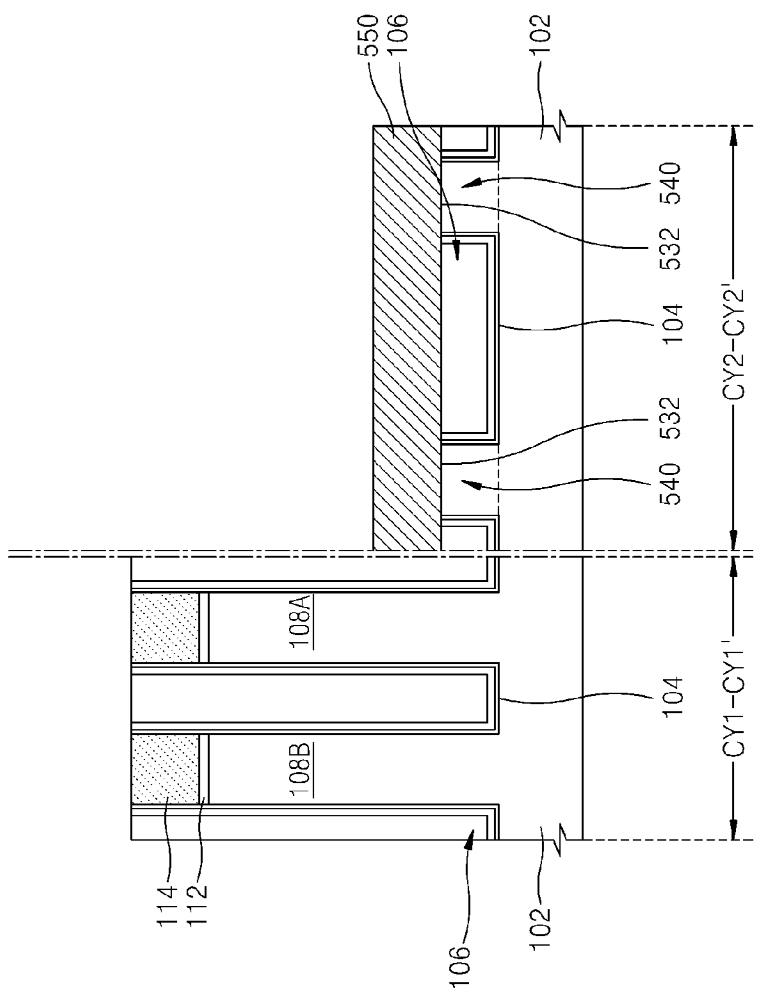

Referring to FIGS. 37A, 37B, and 37C, the second mask patterns 120 are removed. Then, nitride spacers 548 are formed on inner side walls of the second trenches 524, the third trenches 532, and the fourth trenches 536. In an embodiment, the process of the nitride spacers 548 may be omitted.

After that, the plurality of buried bit lines 550 are formed in the second, third, and fourth trenches 524, 532, and 536 according to the processes of forming the buried bit lines 140 illustrated, for example, in FIGS. 8A, 8B, and 8C.

In the active areas 108, the plurality of buried bit lines 550 are formed to fill the third trenches 532 from the lower portions of the second trenches 524 that are connected to the third trenches 532. In the isolation region where the isolation layer 106 is formed, the buried bit lines 550 are formed to fill the bottom portions of the fourth trenches 536.

Detailed structures of the buried bit lines 550 are substantially the same as the buried bit lines 140 described with reference to FIGS. 8A through 8C.

Each of the plurality of buried bit lines 550 may have a variable width along the extension direction thereof (, i.e., the y direction in FIG. 37A) when it is seen from the upper portion of the buried bit line 550. That is, the portion of the buried bit line 550, which is located on the isolation layer 106, may have a width greater than a width of the portion located on the active areas 108 due to the insulating spacers 526 remaining between the active pillars 108A and 108B.

A series of processes described with reference to FIGS. 9A, 9B, and 9C through 18A, 18B, and 18C are performed with respect to the resultant shown in FIGS. 37A, 37B, and 37C to fabricate the semiconductor device according to an embodiment of the present invention.

According to an embodiment described with reference to FIGS. 34A through 37C, when the second trenches 524, the third trenches 532, and the fourth trenches 536 that provide spaces for forming the buried bit lines 550 are formed, the second trenches 524 and the third trenches 532 are formed first, and then, the ion implantation process for forming the first source/drain regions 540 is performed before forming the fourth trenches 536. Therefore, impurity ions implanted onto the substrate 102 to form the first source/drain regions 540 in the active areas 108 are not injected into the isolation layer 106 that is exposed through the fourth trenches 536. Therefore, diffusion of impurities from the isolation layer 106 does not occur, and thus, degradation of the electric characteristics that may be caused by the impurity diffusion can be prevented.

The second mask patterns 120 perform as the etching mask during the etching operation of the active areas 108, as the ion implantation mask during the ion implantation process for forming the first source/drain regions 540, and as the etching mask during the etching operation of the isolation layer 106. Therefore, processes of forming the etching mask patterns required to form the second trenches 524, the third trenches 532, and the fourth trenches 536, and forming of the ion implantation mask patterns required in the ion implantation process for forming the first source/drain regions 540 are not necessary. Thus, one photolithography process may be omitted according to an embodiment.

FIGS. 38A, 38B, and 38C through 42A, 42B, and 42C are diagrams illustrating a method of fabricating a semiconductor device, according to another embodiment of the inventive concept.

Figure 38A:
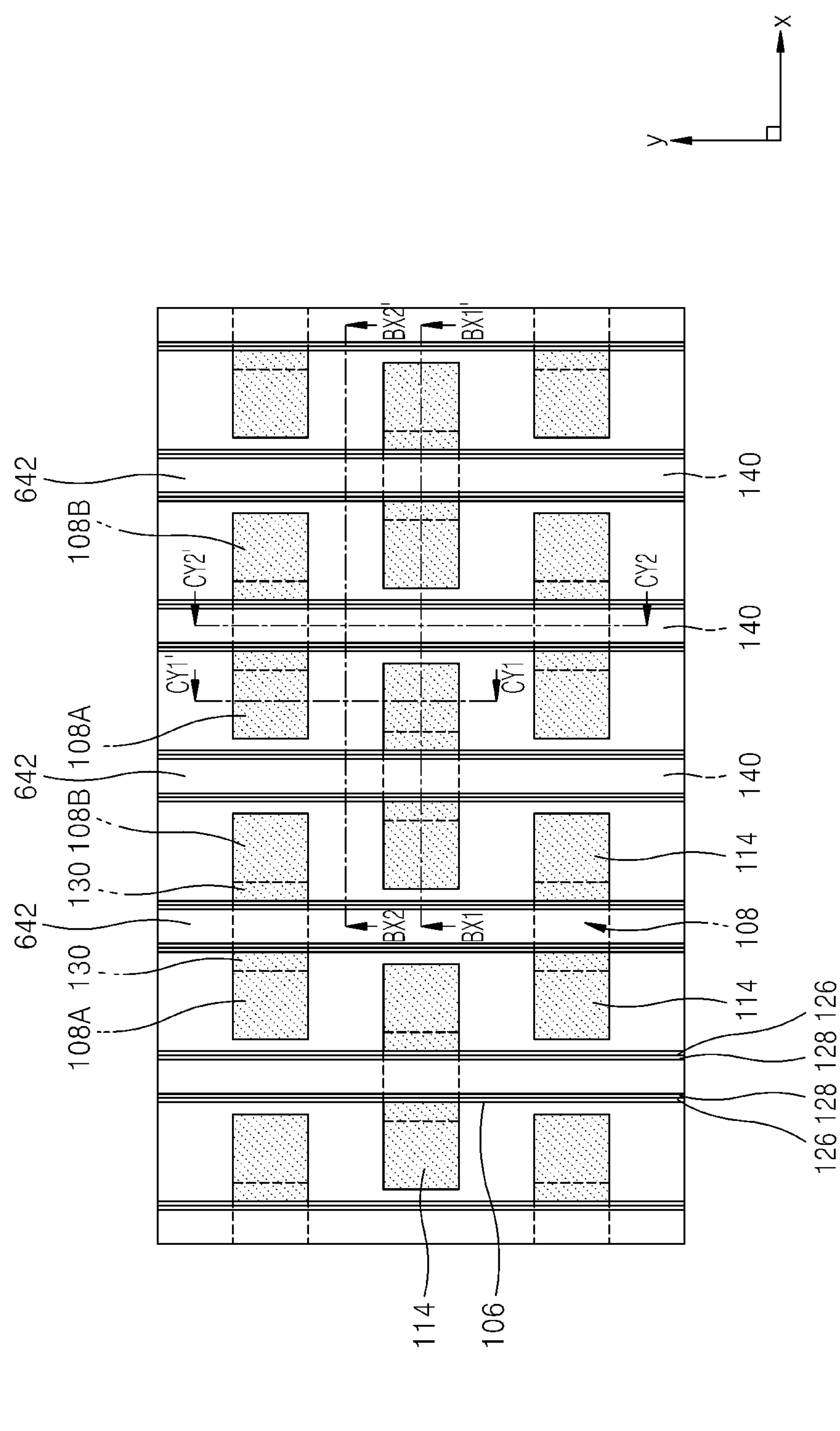
FIGS. 38A, 39A, 40A, 41A and 42A are plan views of a region corresponding to a rectangular portion denoted by "P" in the layout of FIG. 1 according to an embodiment of the inventive concept.
Figure 38B:
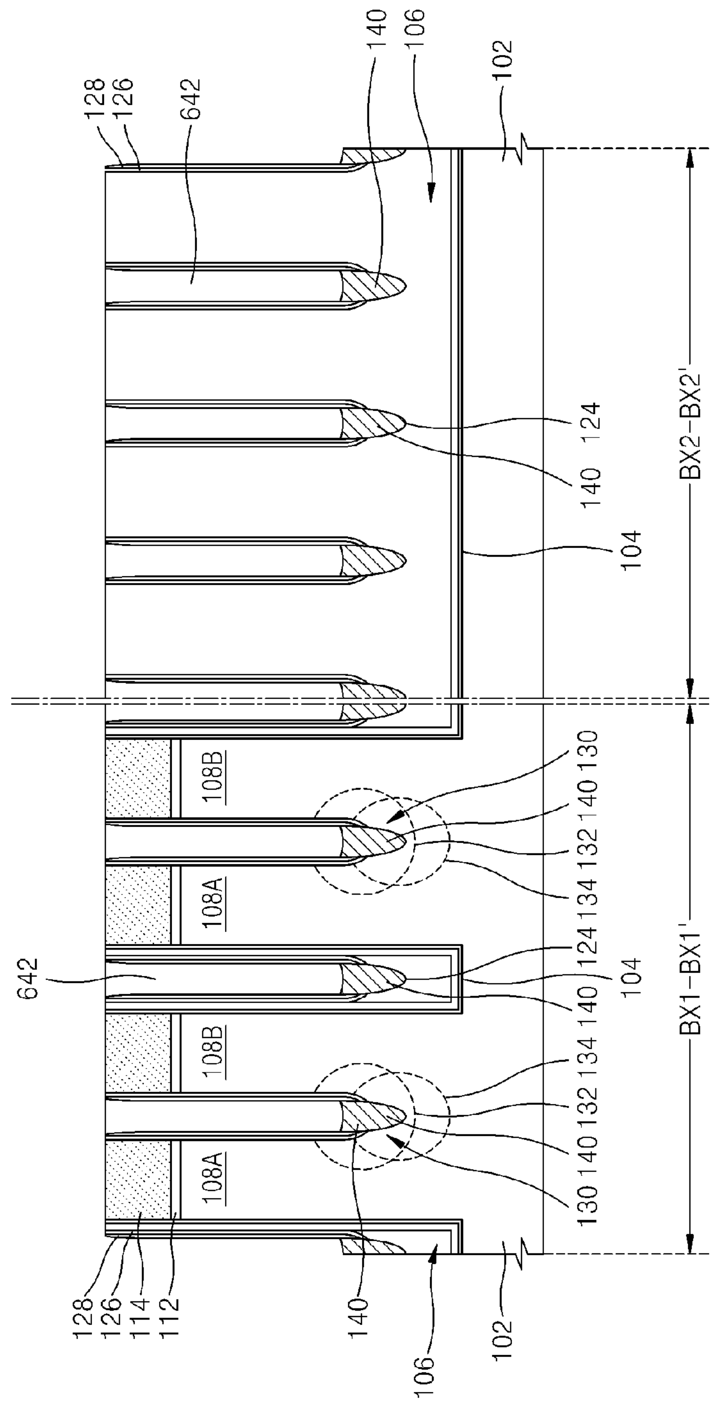
FIGS. 38B, 39B, 40B, 41B and 42B are cross-sectional views taken along the lines BX1-BX1' and BX2-BX2' shown in FIGS. 38A, 39A, 40A, 41A and 42A according to an embodiment of the inventive concept.
Figure 38C:
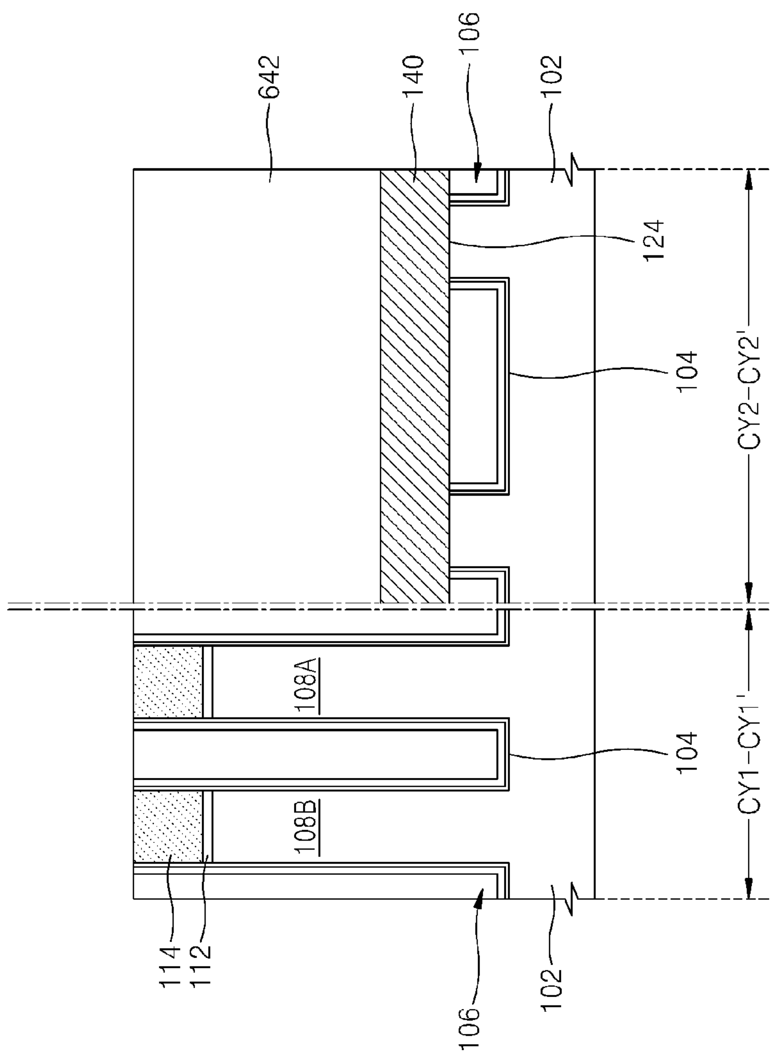
FIGS. 38C, 39C, 40C, 41C and 42C are cross-sectional views taken along the lines CY1-CY1' and CY2-CY2' shown in FIGS. 38A, 39A, 40A, 41A and 42A according to an embodiment of the inventive concept.
Figure 39A:
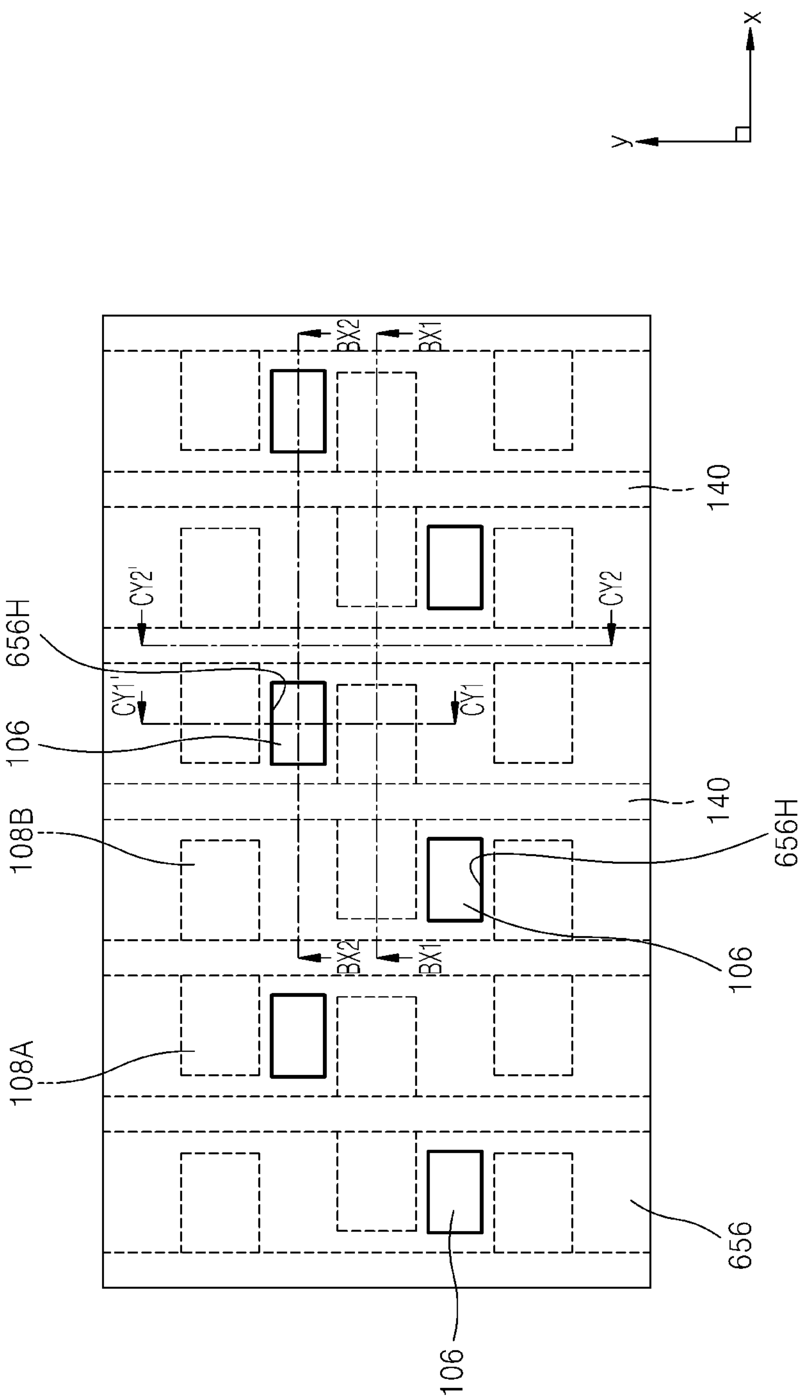

FIGS. 38A, 39A, . . . , and 42A are plan views of a region corresponding to a rectangular portion denoted by "P" in the layout of FIG. 1. FIGS. 38B, 39B, 40B, 41B and 42B are cross-sectional views taken along the lines BX1-BX1' and BX2-BX2' shown in FIGS. 38A, 39A, 40A, 41A and 42A. FIGS. 38C, 39C, 40C, 41C and 42C are cross-sectional views taken along the lines CY1-CY1' and CY2-CY2' shown in FIGS. 38A, 39A, 40A, 41A and 42A.

The embodiment described with reference to FIGS. 38A through 42C is similar to the previous embodiment described with reference to FIGS. 3A through 18C. In the previous embodiment shown in FIGS. 3A through 18C, the contact gates 164CG and the word lines 164WL are integrally formed (refer to FIGS. 14A, 14B, and 14C). In the current embodiment, a process of forming contact gates 664CG (refer to FIGS. 40A, 40B, 40C, 41A, 41B, and 41C) and a process of forming word lines 680WL connected to the contact gates 664CG are separately performed. After forming the contact gates 664CG and before forming the word lines 680WL, insulating spacers 670 are formed on side walls of active areas 108 exposed on the contact gates 664CG, and the word lines 680WL are formed on the contact gates 664CG and the insulating spacers 670.

Referring to FIGS. 38A, 38B, and 38C, the plurality of buried bit lines 140 are formed on the substrate 102 according to the processes described with reference to FIGS. 3A through 18C.

After that, an insulating material is deposited on the entire surface of the resultant in which the buried bit lines 140 are formed to completely fill the inner spaces in the second trenches 124. Then, a planarization process is performed until the upper surfaces of the plurality of first mask patterns 114 are exposed by the CMP method to form a buried insulating layer 642 filling the upper spaces of the buried bit lines 140 in the plurality of second trenches 124. Here, an upper surface of the buried insulating layer 642 may be located at the same level as the upper surfaces of the first mask patterns 114. The buried insulating layer 642 may comprise, for example, a silicon nitride layer.

Figure 39B:
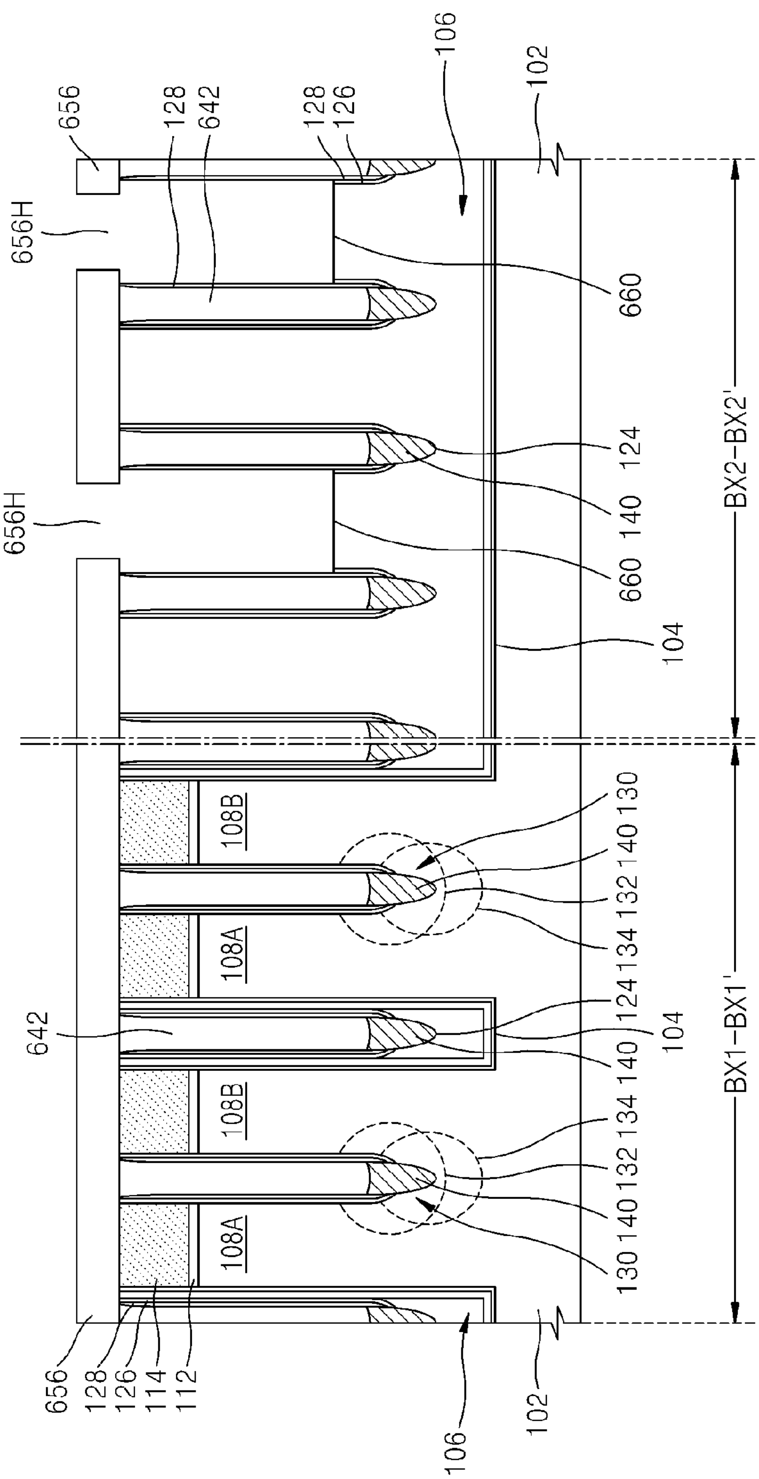
Figure 39C:
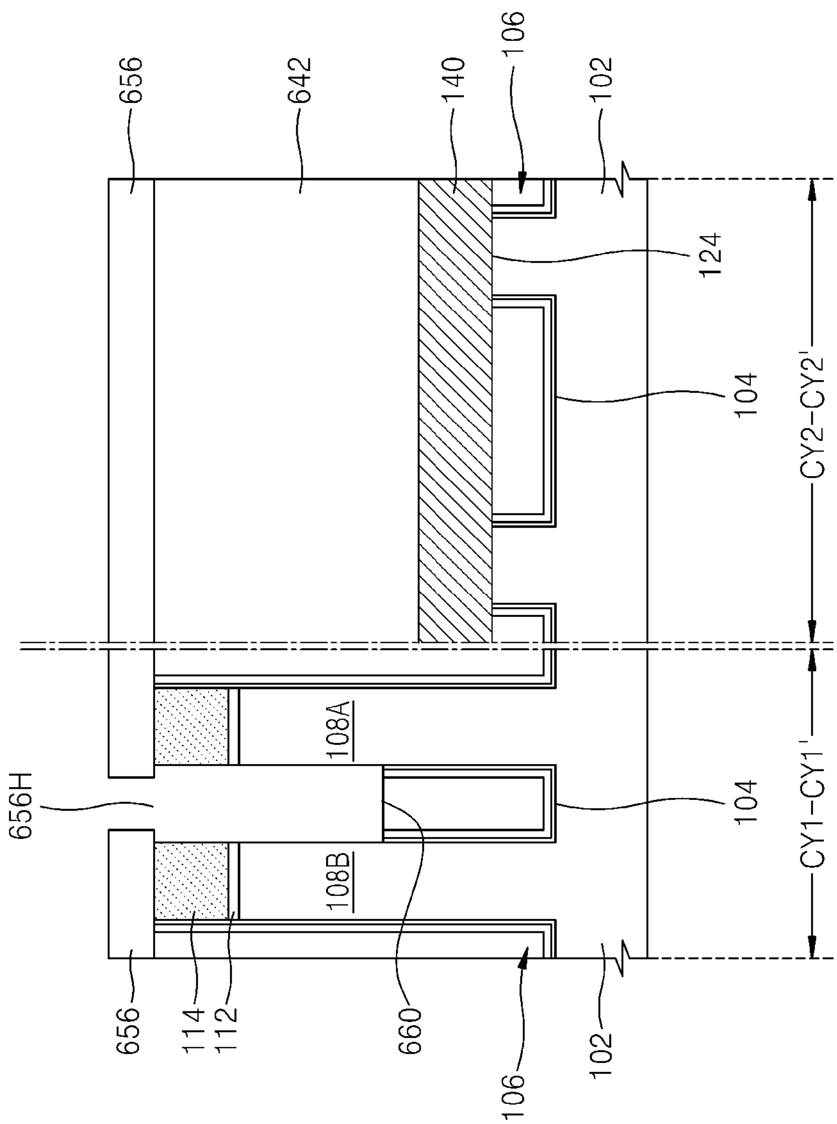

Referring to FIGS. 39A, 39B, and 39C, a third mask pattern 656 including a plurality of openings 656H that partially expose the isolation layer 106 is formed on the resultant in which the buried insulating layer 642 is formed. The third mask pattern 656 may comprise a carbon based layer, for example, an ACL or SOH layer. Portions of the isolation layer 106, on which the contact gates will be formed, are exposed through the plurality of openings 656H formed in the third mask pattern 656. In order not to expose the substrate 102 through the openings 656H, the third mask pattern 656 is formed to completely cover the upper surface of the substrate 102. The isolation layer 106 exposed through the openings 656H is etched to a predetermined depth by using the third mask pattern 656 as an etching mask to form contact gate recesses 660.

When the isolation layer 106 is etched, the gap fill oxide layer 106_3 forming the isolation layer 106 may be removed by etching. Thus, the nitride liner 106_2 may be exposed through the contact gate recesses 660.

After that, the nitride liner 106_2 and the side wall oxide layer 106_1 that are exposed through the contact gate recesses 660 are sequentially removed by a wet etching process so that the side walls of the active areas 108 are exposed in the contact gate recesses 660. Here, as shown in FIG. 39B, a part of the side wall oxide layer 106_1 formed around the side wall of the buried insulating layer 642 formed on the upper portions of the buried bit lines 140 is removed by a cleaning process. Thus, some parts of the nitride liner 128 formed around the side wall of the buried insulating layer 642 may be exposed through the contact gate recesses 660.

Figure 40A:
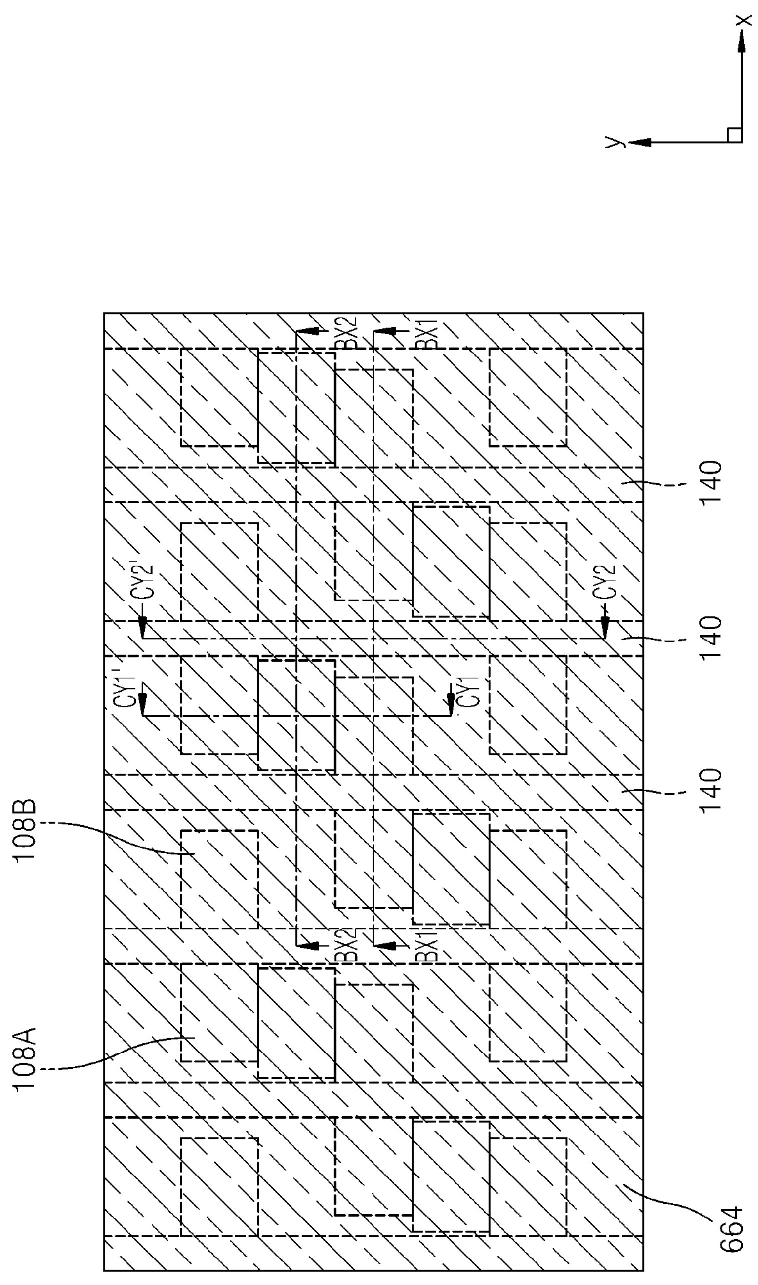
Figure 40B:
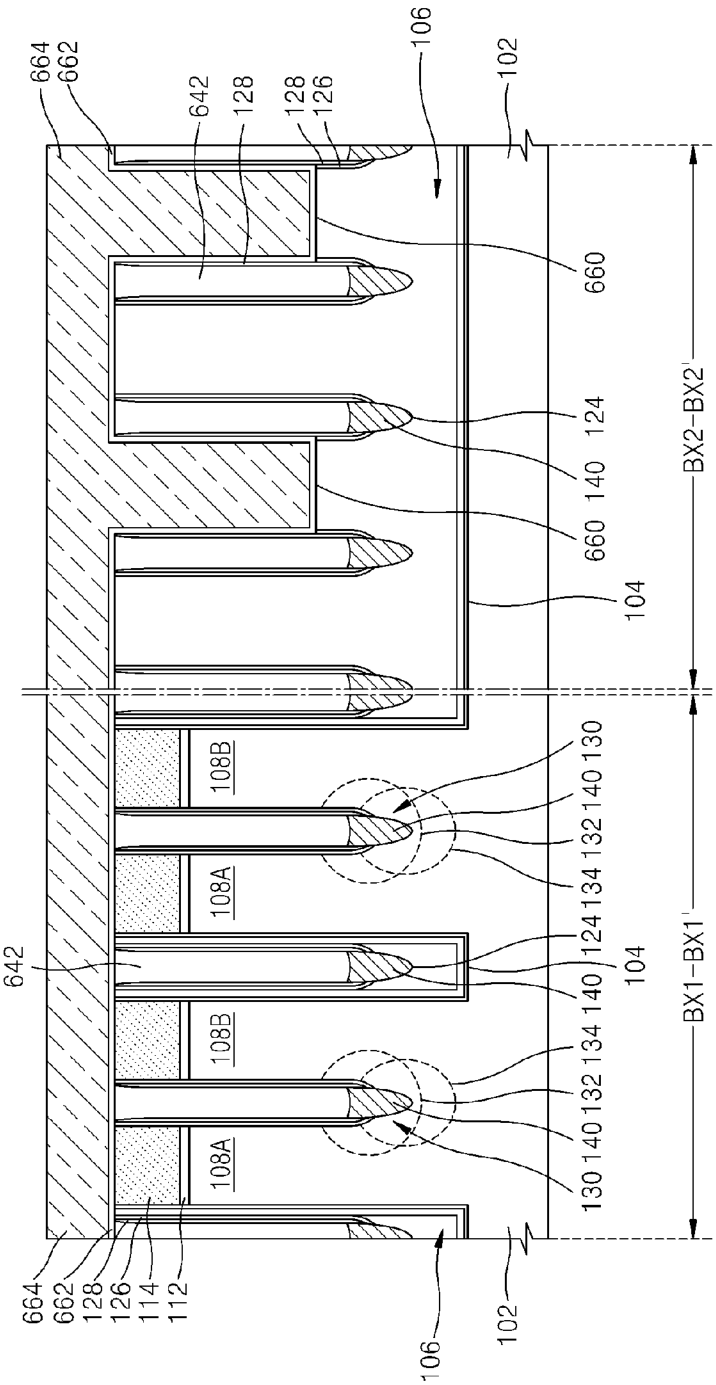
Figure 40C:
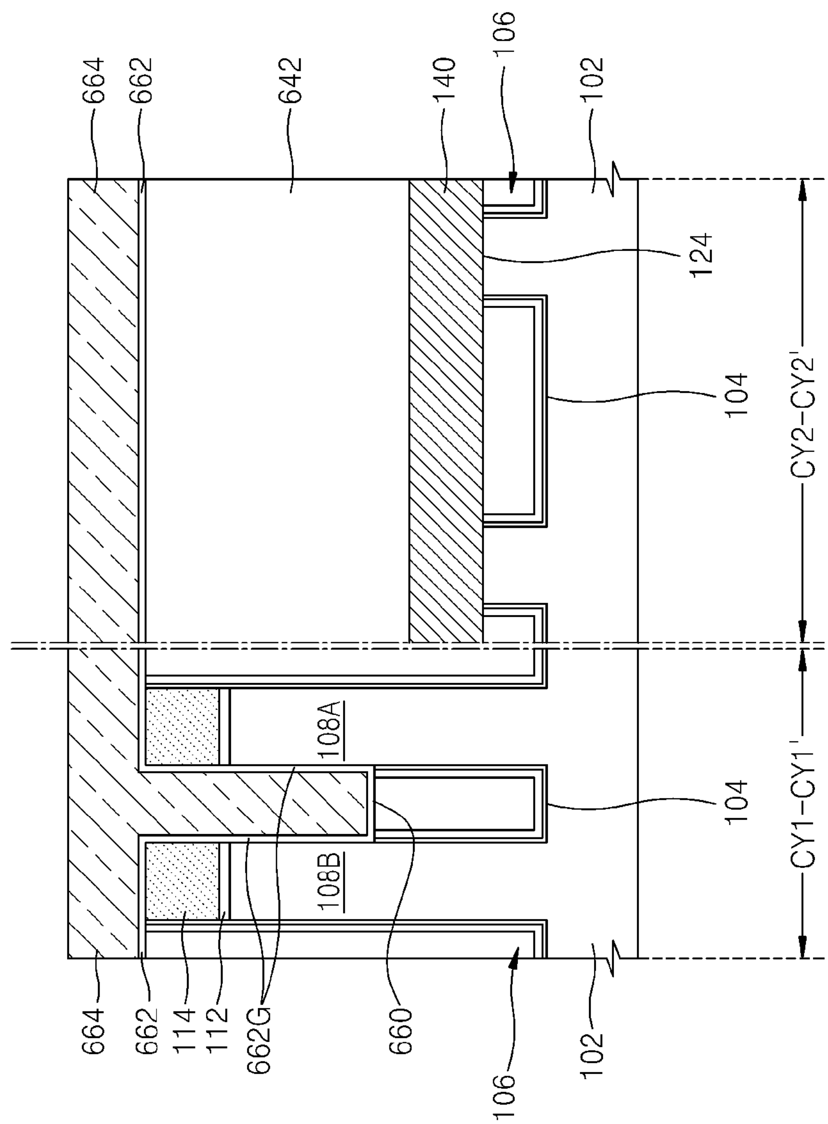

Referring to FIGS. 40A, 40B, and 40C, the third mask pattern 656 is removed. Then, the resultant in which the contact gate recesses 660 are formed is washed. An insulating layer 662 for forming gate insulating layer 662G is formed on inner walls of the contact gate recesses 660. A first conductive layer 664 that entirely covers the upper surface of the substrate 102 while filling the inner spaces of the contact gate recesses 660 is formed on the insulating layer 662.

Detailed structures of the insulating layer 662 and the first conductive layer 664 are substantially the same as those of the insulating layer 162 and the conductive layer 164 described with reference to FIGS. 13A, 13B, and 13C.

Figure 41A:
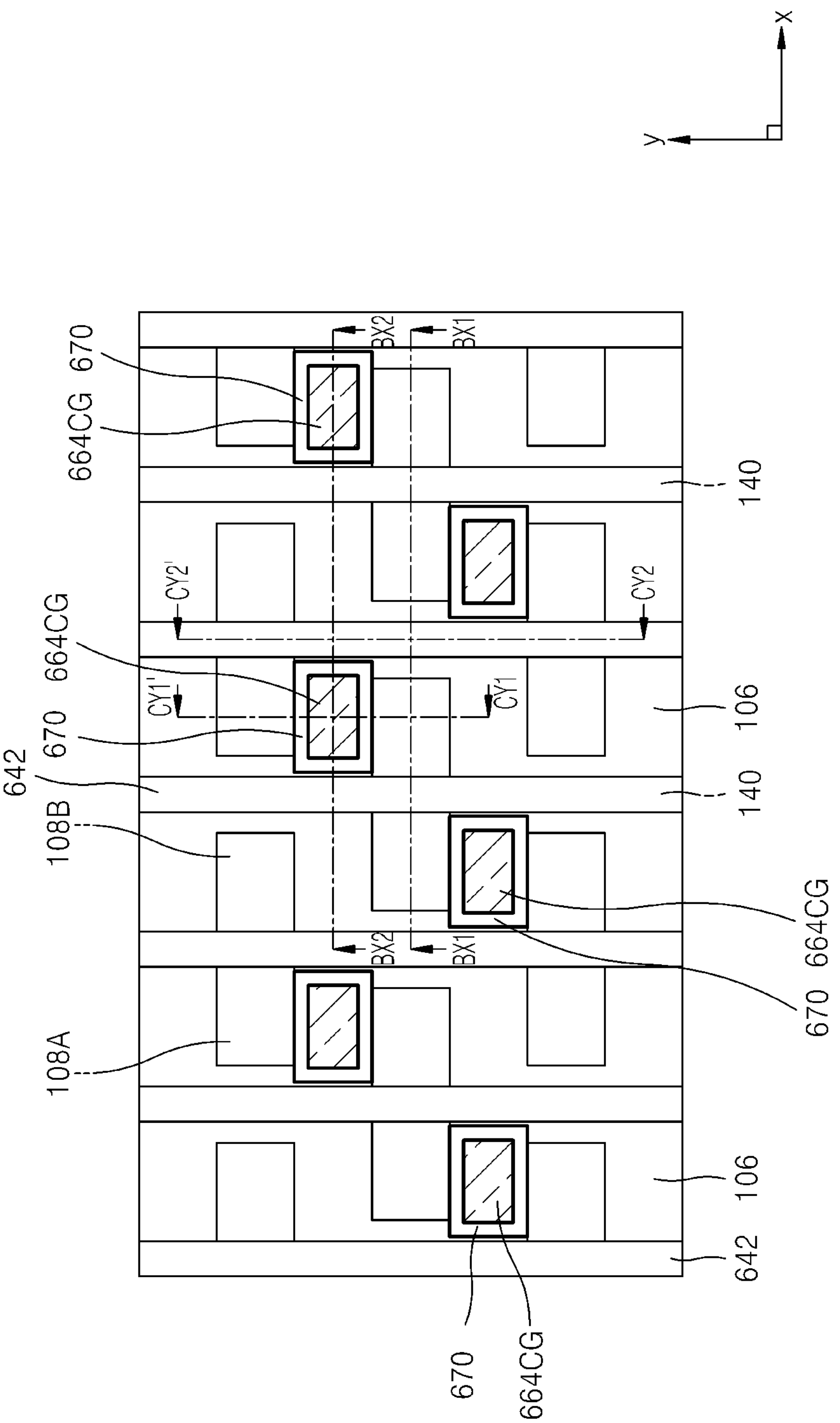
Figure 41B:
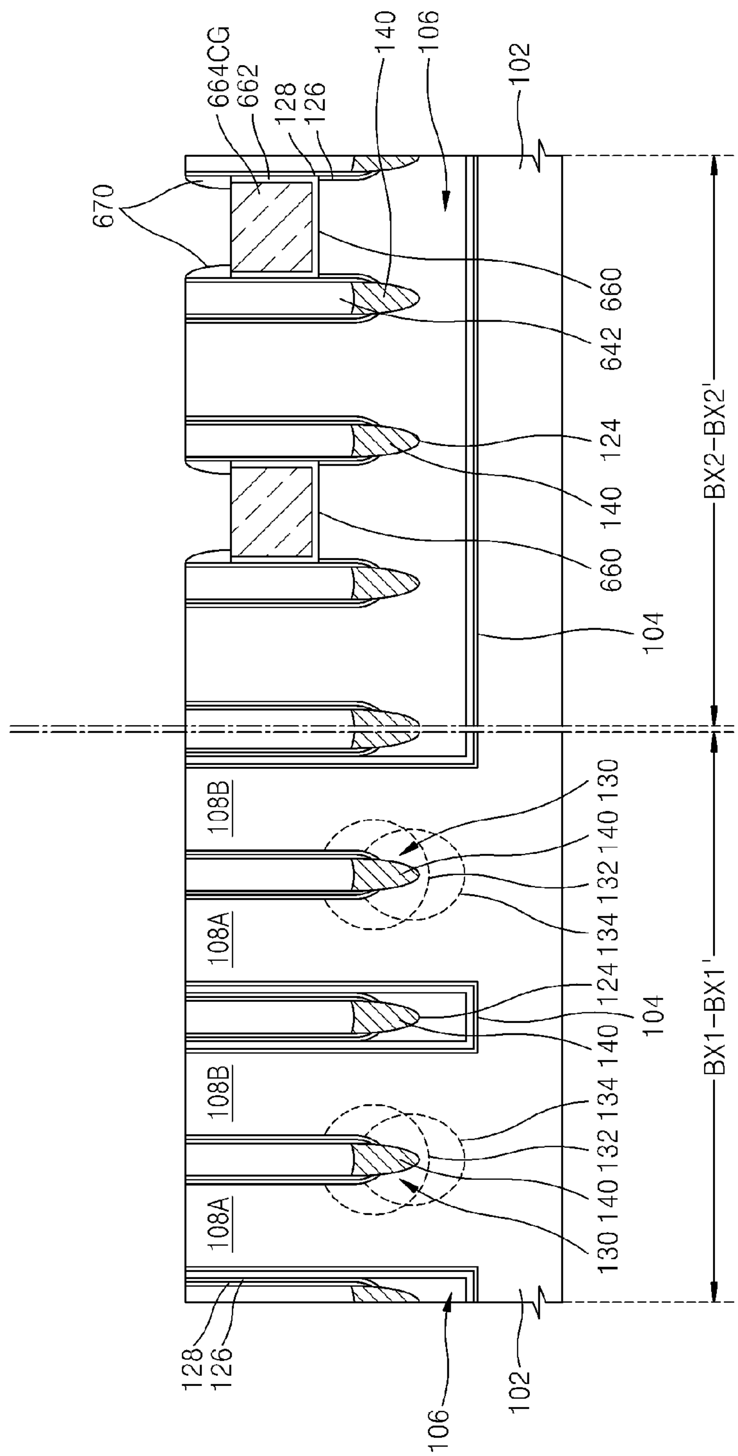
Figure 41C:
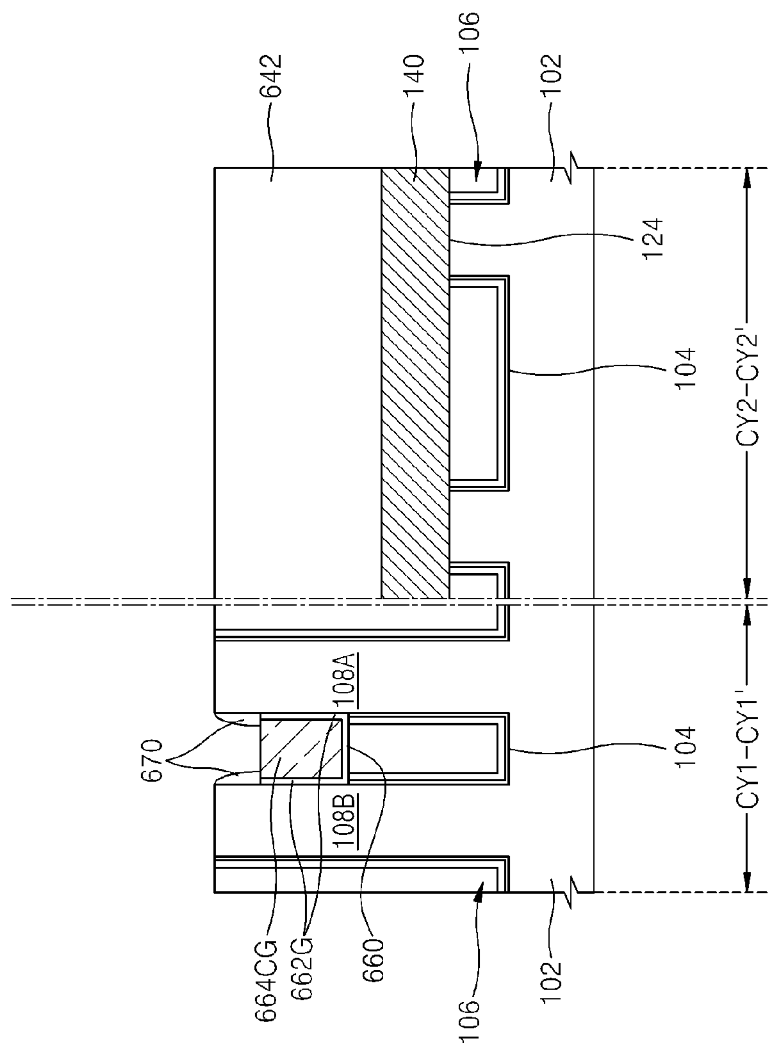

Referring to FIGS. 41A, 41B, and 41C, some parts of the first conductive layer 664 and the insulating layer 662 are etched-back until only contact gates 664CG that fill some parts of the contact gate recesses 660 from the bottom surfaces of the contact gate recesses 660 remain. Thus, inlet portions of the contact gate recesses 660 may remain on upper portions of the contact gates 664CG. The first mask patterns 114 and the pad oxide layer 112 are removed by performing CMP until the upper surface of the substrate 102 is exposed.

The contact gates 664CG extend to a level that is lower than the upper surface of the substrate 102 along the side surfaces of the active pillars 108A and 108B on the insulating layer 662 formed in the contact gate recesses 660.

After that, an oxide layer is entirely formed on inner walls of the inlet portions of the contact gate recesses 660 and the upper surface of the substrate 102, and an etch-back of the oxide layer is performed in order to form oxide spacers 670 on the inner walls of the inlet portions of the contact gate recesses 660. Thus, the side walls of the active pillars 108A and 108B that are exposed on the side walls of the contact gate recesses 660 are covered by the oxide spacers 670. In each of the contact gate recesses 660, the oxide spacer 670 is formed as a ring covering an upper edge portion of the contact gate 664CG. An upper center portion of the contact gate 664CG is exposed to outside due to the oxide spacer 670.

An insulating distance from the contact gates 664CG and the word lines 680WL formed to be connected to the contact gates 664CG (refer to FIGS. 42A, 42B, and 42C) to the buried contact plug 174 (refer to FIGS. 17A, 17B, and 17C) formed on the substrate 102 in post-processes may be ensured due to the oxide spacers 670. Therefore, generation of a gate leakage current may be prevented.

Figure 42A:
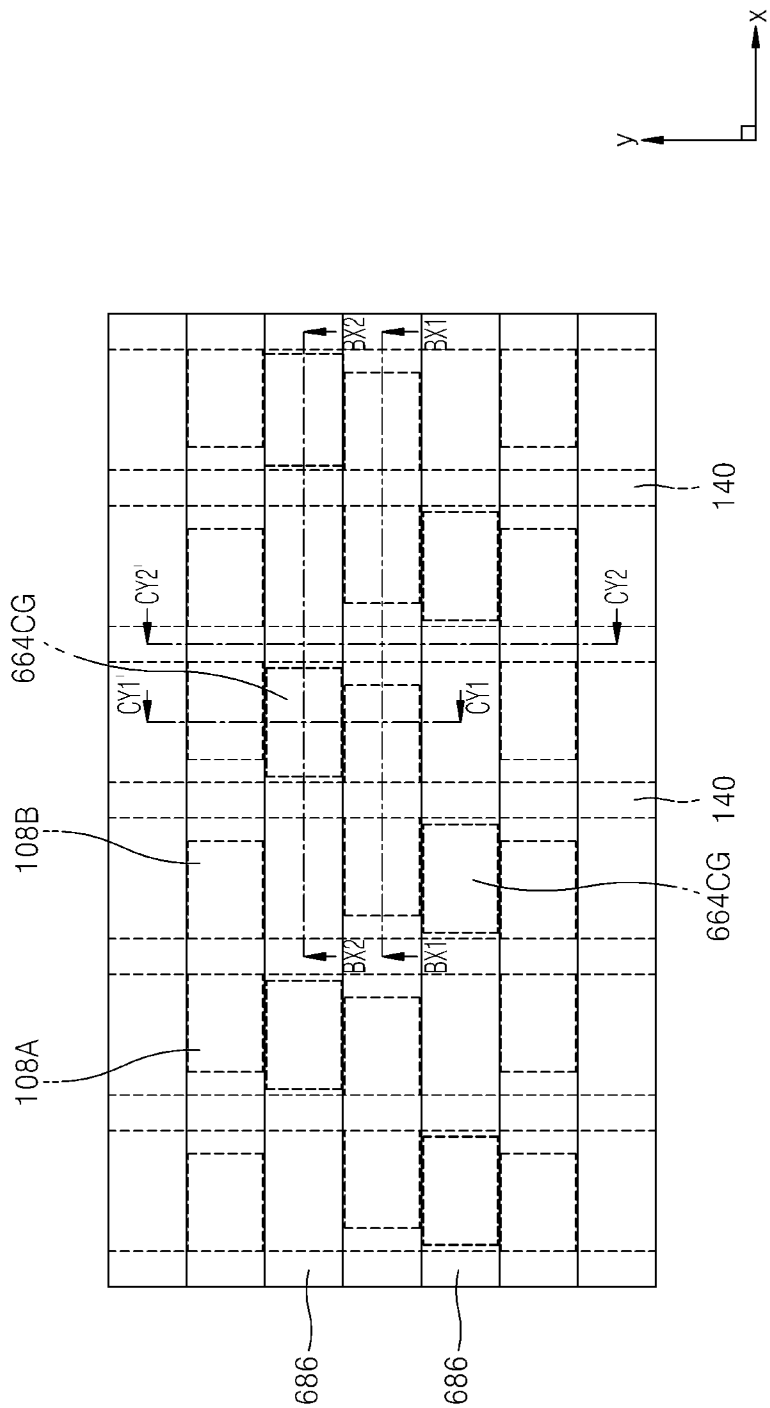
Figure 42B:
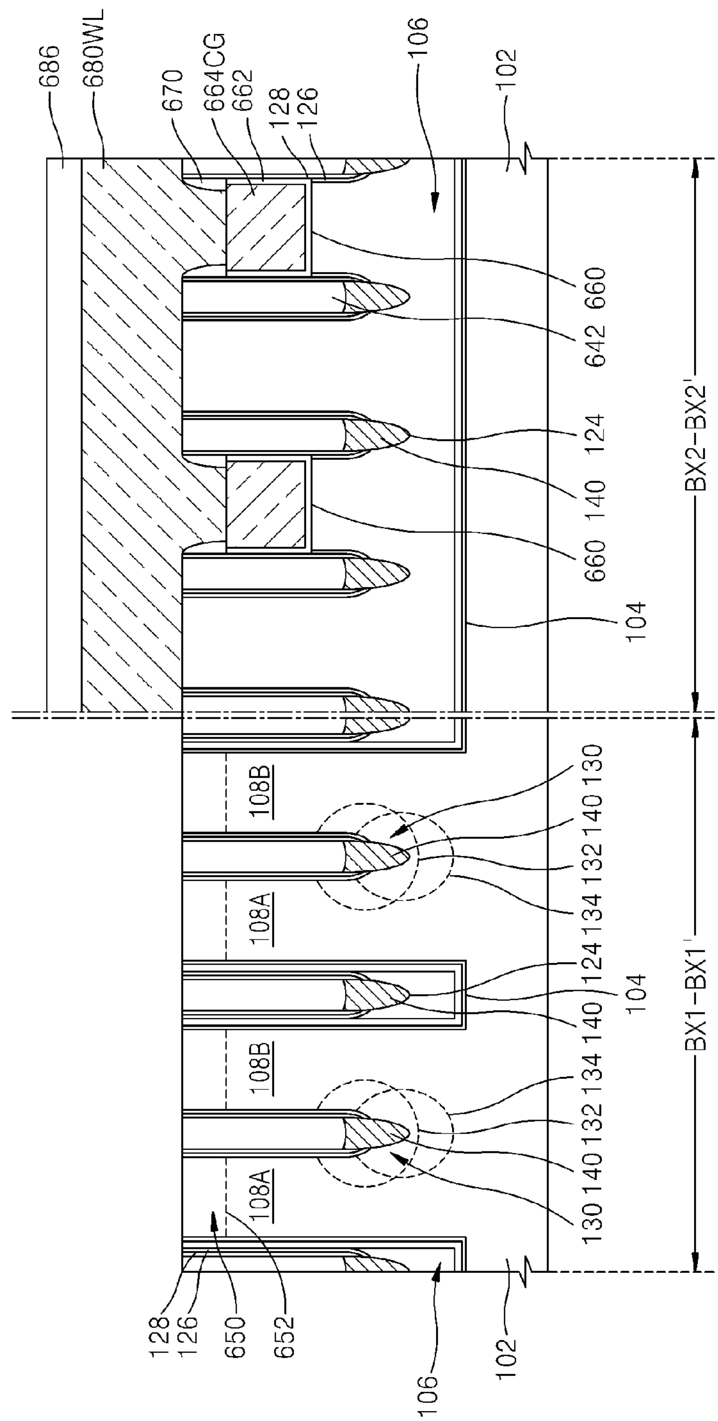
Figure 42C:
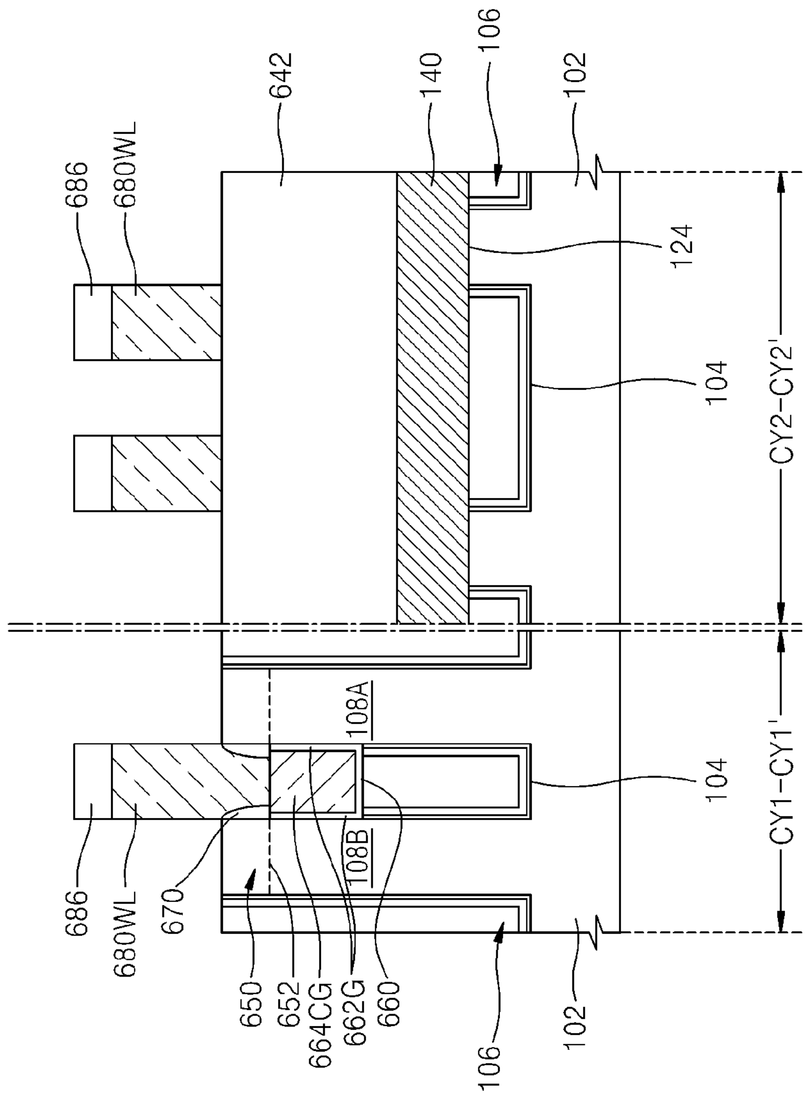

Referring to FIGS. 42A, 42B, and 42C, a second conductive layer is formed on an entire surface of the resultant in which the oxide spacers 670 are formed, and a fourth mask pattern 686 is formed on the second conductive layer. An anisotropic etching of the second conductive layer is performed by using the fourth mask pattern 686 as an etching mask to form a plurality of word lines 680WL that extend in parallel with each other.

The structures of the second conductive layer are substantially the same as the conductive layer 164 described with reference to FIGS. 13A, 13*b*, and 13C. The plurality of word lines 680WL extend in parallel with each other in a direction crossing the extension direction of the buried bit lines 140 (i.e., the x direction of FIG. 42A). The plurality of word lines 680WL respectively contact the exposed portions of the contact gates 664CG, which are exposed by the oxide spacers 670, arranged in a row along the extension direction (i.e., the x direction of FIG. 42A). After that, ion implantation of a low concentration dopant 652 for forming second source/drain regions 650 on the upper surfaces of the active areas 108 is performed.

The low concentration dopant 652 includes the same type of impurity ions as that of the first source/drain regions 130. For example, the low concentration dopant 652 may be N-type impurity ions. Ion implantation of a high concentration dopant of the second source/drain regions 650 may be performed after the ion implantation of the low concentration dopant 652 according to an embodiment. The ion implantation of the high concentration dopant may be performed simultaneously with the process of forming the buried contact plugs 174 as described with reference to FIGS. 17A, 17B, and 17C in the previous embodiment.

According to an embodiment described with reference to FIGS. 38A through 42C, after forming the contact gates 664CG and before forming the word lines 680WL, the insulating spacers 670 are formed on the side walls of the active areas 108, which are exposed on the contact gates 664CG, and the word lines 680WL are formed on the contact gates 664CG and the insulating spacers 670. Therefore, the insulating distance between the contact gates 664CG and the buried contact plugs 174 may be ensured by the oxide spacers 670, and the gate leakage current may be prevented.

Figure 43:
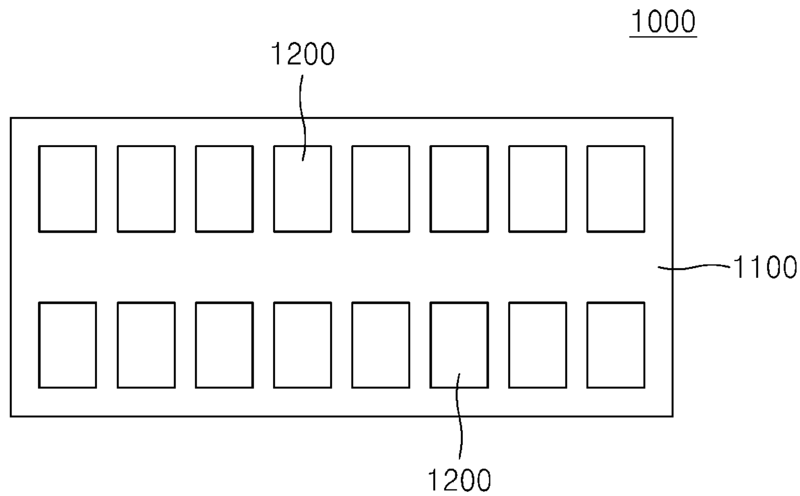
FIG. 43 is a plan view of a memory module including a semiconductor device, according to an embodiment of the inventive concept.

FIG. 43 is a plan view of a memory module 1000 including a semiconductor device, according to an embodiment of the present inventive concept.

The memory module 1000 may include a printed circuit board 1100 and a plurality of semiconductor packages 1200. The plurality of semiconductor packages 1200 may include the semiconductor device according to embodiments of the inventive concept. The plurality of semiconductor packages 1200 may include characteristics of at least one semiconductor device that is selected from the semiconductor devices according to the above embodiments of the present inventive concept.

The memory module 1000 according to an embodiment of the inventive concept may be a single in-line memory module (SIMM), in which a plurality of semiconductor packages 1200 are mounted on one side of the printed circuit board 1100, or a dual in-line memory module (DIMM), in which a plurality of semiconductor packages 1200 are arranged on both sides of the printed circuit board. The memory module 1000 may be a fully buffered DIMM (FBDIMM) having an advanced memory buffer (AMB) providing the plurality of semiconductor packages 1200 with external signals.

Figure 44:
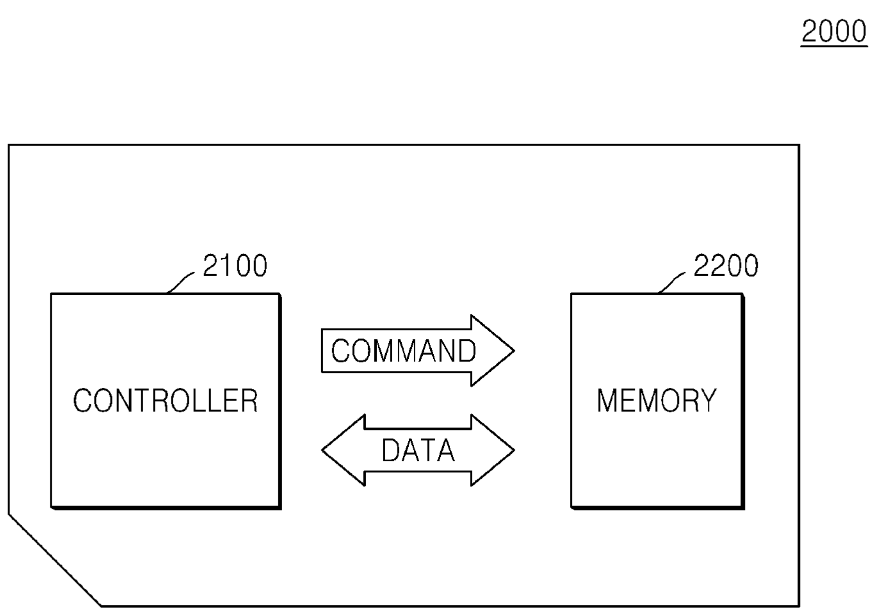
FIG. 44 is a schematic block diagram of a memory card including a semiconductor device, according to an embodiment of the inventive concept.

FIG. 44 is a schematic diagram of a memory card 2000 including a semiconductor device, according to an embodiment of the present inventive concept.

In the memory card 2000, a controller 2100 and a memory 2200 exchange electric signals with each other. For example, when the controller 2100 transmits a command, the memory 2200 may transmit data. The memory 2200 may include a semiconductor device according to exemplary embodiments of the present inventive concept. The memory card 2000 may include, for example, a memory stick card, a smart media (SM) card, a secure digital (SD) card, a mini SD card, and multimedia card (MMC).

Figure 45:
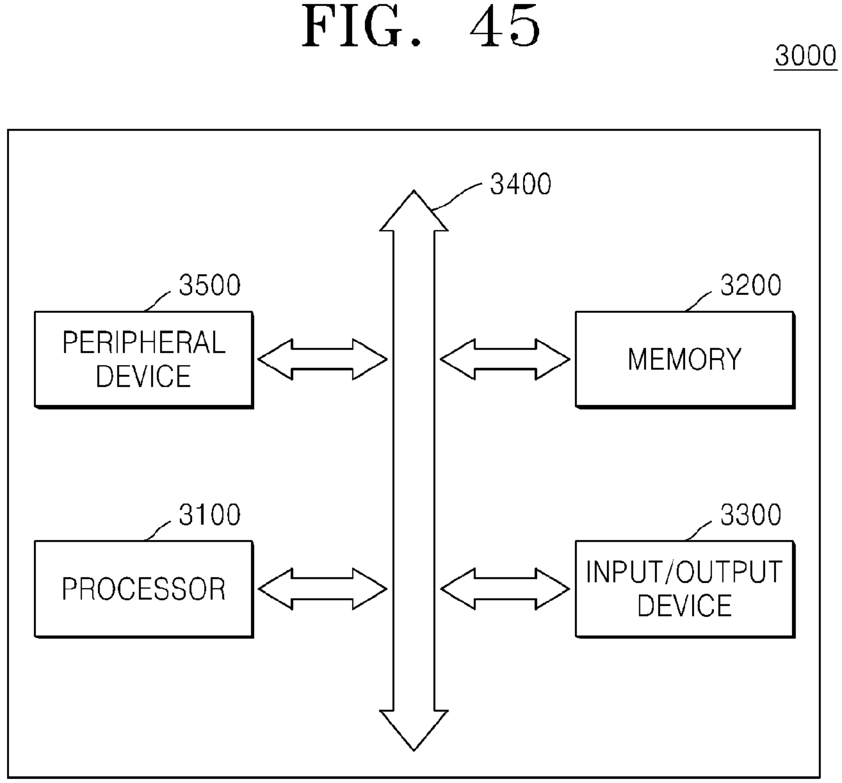
FIG. 45 is a schematic block diagram of a system including a semiconductor device, according to an embodiment of the inventive concept.

FIG. 45 is a schematic block diagram of a system 3000 including a semiconductor device according to an embodiment of the present inventive concept.

In the system 3000, a processor 3100, a memory 3200, and an input/output device 3300 may communicate data with each other by using a bus 3400. The memory 3200 of the system 3000 may include a random access memory (RAM) or a read only memory (ROM). The system 3000 may include peripheral devices 3500 such as a floppy disk drive and a compact disk (CD)-ROM drive. The memory 3200 may include a semiconductor device according to exemplary embodiments of the present inventive concept. The memory 3200 may store codes and data for operating the processor 3100. The system 3000 may be used in mobile phones, a Moving Picture Experts Group (MPEG) player 3 (MP3) players, navigation devices, portable multimedia players (PMPs), solid state disks (SSDs), or household appliances.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor memory device comprising:

a plurality of pillars extending from a substrate to form vertical channel regions;

a word line disposed between two adjacent rows of the pillars;

a bit line disposed between two adjacent columns of the pillars, the bit line in contact with a bottom surface of a first trench formed between a first pair of pillars positioned in a row direction, the first pair of pillars having a first pillar and a second pillar; and a contact gate disposed between a second pair of pillars positioned in a column direction, the second pair of pillars having the second pillar and a third pillar, the contact gate comprising a first surface and a second surface, the first surface in contact with the word line, the second surface in contact with a gate insulating layer disposed on the second pillar.

2. The device of claim 1, wherein a distance from an upper surface of the substrate to a bottom surface of the contact gate is less than a distance from the upper surface of the substrate to an upper surface of the bit line.

3. The device of claim 1, wherein the first pair of pillars and the substrate comprise a semiconductor material.

4. The device of claim 1, further comprising a nitride liner, a sidewall oxide layer, and a gap fill oxide layer respectively stacked on a sidewall of the first trench.

5. The device of claim 1, further comprising a first source/drain region formed around the bottom surface of the first trench.

6. The device of claim 5, wherein each end portion of the first pair of pillars comprises a second source/drain region.

7. The device of claim 1, further comprising a first contact plug and a second contact plug respectively disposed on each end portion of the first pillar and the second pillar.

8. The device of claim 7, wherein a lower electrode of a capacitor is disposed on the first contact plug.

9. The device of claim 7, further comprising a spacer disposed between the first contact plug and the first contact gate.

10. The device of claim 9, wherein the spacer has a ring shape.

11. The device of claim 6, wherein a channel region is formed between the first source/drain region and the second source/drain region.

12. The device of claim 1, wherein the bit line comprises a first portion disposed between the first pair of pillars and a second portion disposed between a third pair of pillars neighboring immediately next to the first pair of pillars in the column direction, the first portion in contact with the bottom surface of the first trench comprising a semiconductor material, the second portion in contact with the bottom surface of a second trench comprising an insulating material.

13. The device of claim 12, the first portion and the second portion has a same width.

14. The device of claim 12, wherein the first portion and the second portion has a same thickness.

15. The device of claim 12, wherein an upper surface of the first portion is coplanar with an upper surface of the second portion.

16. The device of claim 12, wherein the first portion has a smaller thickness than the second portion.

17. The device of claim 12, wherein a top width of the second portion is wider than a bottom width of the second portion.

18. The device of claim 12, wherein a lower portion of the second portion is narrower than a lower portion of the first portion.

19. The device of claim 12, wherein a curvature of a lower end of the second portion is greater than a curvature of a lower end of the first portion.

20. The device of claim 12, wherein a width of the first portion is smaller than a width of the second portion.

21. The device of claim 1, wherein each of the pillars has a same width.

22. The device of claim 1, wherein the bit line comprises at least one of W, Al, Cu, Mo, Ti, Ta, Ru, TiN, TiN/W, Ti/TiN, WN, W/WN, TaN, Ta/TaN, TiSiN, TaSiN, WSiN, $CoSi_2$, $TiSi_2$, or $WSi_2$.

* * * * *